(12) United States Patent
Wodrich et al.

(10) Patent No.: US 11,080,439 B2
(45) Date of Patent: *Aug. 3, 2021

(54) METHOD AND APPARATUS FOR INTERACTING WITH A TAG IN A COLD STORAGE AREA

(71) Applicant: Middle Chart, LLC, Jacksonville, FL (US)

(72) Inventors: Michael Wodrich, Jacksonville, FL (US); Michael S. Santarone, Jacksonville, FL (US); Randall Pugh, Jacksonville, FL (US); Jason E. Duff, Jacksonville, FL (US); Frederick Flitsch, New Windsor, NY (US)

(73) Assignee: Middle Chart, LLC, Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/134,824

(22) Filed: Dec. 28, 2020

(65) Prior Publication Data
US 2021/0117585 A1    Apr. 22, 2021

Related U.S. Application Data

(63) Continuation of application No. 16/943,750, filed on Jul. 30, 2020, now Pat. No. 10,902,160, which is a
(Continued)

(51) Int. Cl.
*G06F 30/13* (2020.01)
*G06T 19/00* (2011.01)
(Continued)

(52) U.S. Cl.
CPC .............. *G06F 30/13* (2020.01); *G01S 19/48* (2013.01); *G06Q 99/00* (2013.01); *G06T 17/05* (2013.01); *G06T 19/006* (2013.01); *G01S 19/01* (2013.01)

(58) Field of Classification Search
CPC ....... G06F 30/13; G06Q 99/00; G06T 19/006; G06T 17/05; G01S 19/48; G01S 19/01
See application file for complete search history.

(56) References Cited

U.S. PATENT DOCUMENTS

| 5,884,202 A | 3/1999 | Arjomand |
| 5,933,479 A | 8/1999 | Michael et al. |

(Continued)

FOREIGN PATENT DOCUMENTS

| CN | 102147597 A | 8/2011 |
| EP | 2726817 B1 | 9/2018 |

(Continued)

OTHER PUBLICATIONS

"Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).

(Continued)

*Primary Examiner* — Brandon J Miller
(74) *Attorney, Agent, or Firm* — Joseph P. Kincart; Rogers Towers. P.A.

(57) ABSTRACT

Methods and apparatus for interacting with a tag in a radio target area. More specifically, the present invention relates to methods and systems for monitoring temperature and other environmental conditions in a storage area and displaying environmental conditions as digital content in a user interactive interface based upon energy levels received from a radio target area and content from a sensor generating digital content.

20 Claims, 44 Drawing Sheets

Related U.S. Application Data continuation-in-part of application No. 16/900,753, filed on Jun. 12, 2020, now Pat. No. 10,872,179, which is a continuation-in-part of application No. 16/721,906, filed on Dec. 19, 2019, now Pat. No. 10,726,167, and a continuation-in-part of application No. 16/817,926, filed on Mar. 13, 2020, now Pat. No. 10,831,945, which is a continuation-in-part of application No. 16/688,775, filed on Nov. 19, 2019, now Pat. No. 10,628,617, which is a continuation-in-part of application No. 16/657,660, filed on Oct. 18, 2019, which is a continuation-in-part of application No. 16/597,271, filed on Oct. 9, 2019, which is a continuation of application No. 16/161,823, filed on Oct. 16, 2018, now Pat. No. 10,467,353, which is a continuation-in-part of application No. 15/716,133, filed on Sep. 26, 2017, now Pat. No. 10,025,887, and a continuation-in-part of application No. 15/703,310, filed on Sep. 13, 2017, said application No. 16/597,271 is a continuation of application No. 15/887,637, filed on Feb. 2, 2018, which is a continuation-in-part of application No. 15/716,133, filed on Sep. 26, 2017, now Pat. No. 10,025,887, and a continuation-in-part of application No. 15/703,310, filed on Sep. 13, 2017, said application No. 16/657,660 is a continuation-in-part of application No. 16/549,503, filed on Aug. 23, 2019, and a continuation-in-part of application No. 16/528,104, filed on Jul. 31, 2019, now Pat. No. 10,671,767, which is a continuation-in-part of application No. 16/504,919, filed on Jul. 8, 2019, now Pat. No. 10,740,502, which is a continuation-in-part of application No. 16/503,878, filed on Jul. 5, 2019, now Pat. No. 10,776,529, which is a continuation-in-part of application No. 16/297,383, filed on Mar. 8, 2019, now Pat. No. 10,762,251, which is a continuation-in-part of application No. 16/176,002, filed on Oct. 31, 2018, now Pat. No. 10,268,782, which is a continuation-in-part of application No. 16/171,593, filed on Oct. 26, 2018, now Pat. No. 10,620,084, which is a continuation-in-part of application No. 16/165,517, filed on Oct. 19, 2018, now Pat. No. 10,733,334, which is a continuation-in-part of application No. 16/161,823, filed on Oct. 16, 2018, now Pat. No. 10,467,353, and a continuation-in-part of application No. 16/142,275, filed on Sep. 26, 2018, now Pat. No. 10,433,112, which is a continuation-in-part of application No. 15/887,637, filed on Feb. 2, 2018, said application No. 16/503,878 is a continuation-in-part of application No. 16/249,574, filed on Jan. 16, 2019, now Pat. No. 10,831,943, which is a continuation-in-part of application No. 16/176,002, filed on Oct. 31, 2018, now Pat. No. 10,268,782, said application No. 16/688,775 is a continuation-in-part of application No. 16/503,878, filed on Jul. 5, 2019, now Pat. No. 10,776,529.

(60) Provisional application No. 62/769,133, filed on Nov. 19, 2018, provisional application No. 62/871,499, filed on Jul. 8, 2019, provisional application No. 62/793,714, filed on Jan. 17, 2019, provisional application No. 62/712,714, filed on Jul. 31, 2018, provisional application No. 62/909,061, filed on Oct. 1, 2019, provisional application No. 62/462,347, filed on Feb. 22, 2017, provisional application No. 62/531,975, filed on Jul. 13, 2017, provisional application No. 62/531,955, filed on Jul. 13, 2017.

(51) Int. Cl.
  *G01S 19/48* (2010.01)
  *G06T 17/05* (2011.01)
  *G06Q 99/00* (2006.01)
  *G01S 19/01* (2010.01)

(56) References Cited

U.S. PATENT DOCUMENTS

| | | |
|---|---|---|
| 6,006,021 A | 12/1999 | Tognazzini |
| 6,292,108 B1 | 9/2001 | Straser et al. |
| 6,321,158 B1 | 11/2001 | DeLorme et al. |
| 6,853,958 B1 | 2/2005 | Turin et al. |
| 7,057,557 B2 | 6/2006 | Lee |
| 7,994,981 B1 | 8/2011 | Farrokhi et al. |
| 8,843,350 B2 | 9/2014 | Jacobi et al. |
| 8,965,741 B2 | 2/2015 | McCulloch et al. |
| 8,996,156 B2 | 3/2015 | Melzer-Jokisch et al. |
| 9,008,979 B2 | 4/2015 | Miura |
| 9,064,219 B2 | 6/2015 | Hall et al. |
| 9,342,928 B2 | 5/2016 | Rasane et al. |
| 9,529,072 B2 | 12/2016 | Matzner |
| 9,668,106 B2 | 5/2017 | Lin et al. |
| 9,703,517 B2 | 7/2017 | Andolina |
| 9,772,396 B2 | 9/2017 | Liao et al. |
| 9,892,559 B2 | 2/2018 | Yoshida et al. |
| 9,934,335 B2 | 4/2018 | Pettersson |
| 10,025,887 B1 | 7/2018 | Santarone et al. |
| 10,042,341 B1 | 8/2018 | Jacob |
| 10,054,914 B2 | 8/2018 | Vartiainen et al. |
| 10,130,285 B1 | 11/2018 | Singamsetty et al. |
| 10,149,141 B1 | 12/2018 | Stamatakis et al. |
| 10,222,301 B2 | 3/2019 | Silva et al. |
| 10,278,016 B2 * | 4/2019 | Bitra ............... H04W 4/023 |
| 10,355,351 B2 | 7/2019 | Cummings et al. |
| 10,444,324 B2 | 10/2019 | Dackefjord et al. |
| 10,824,774 B2 | 11/2020 | Santarone et al. |
| 10,872,179 B2 * | 12/2020 | Wodrich ............ G01S 19/48 |
| 2002/0095269 A1 | 7/2002 | Natalini et al. |
| 2002/0181405 A1 | 12/2002 | Ying |
| 2003/0110001 A1 | 6/2003 | Chassin et al. |
| 2003/0163440 A1 | 8/2003 | Tonack |
| 2003/0195008 A1 | 10/2003 | Mohi et al. |
| 2004/0002786 A1 | 1/2004 | Sasaki |
| 2004/0119662 A1 | 6/2004 | Dempski |
| 2004/0122628 A1 | 6/2004 | Laurie |
| 2005/0165576 A1 | 7/2005 | Jesmonth |
| 2005/0208951 A1 | 9/2005 | Annunziato et al. |
| 2005/0275525 A1 | 12/2005 | Ahmed |
| 2006/0028345 A1 | 2/2006 | Lee |
| 2006/0084436 A1 | 4/2006 | Green et al. |
| 2006/0084463 A1 | 4/2006 | Yoo et al. |
| 2007/0004449 A1 * | 1/2007 | Sham ............... H04M 1/21 455/556.1 |
| 2007/0266395 A1 | 11/2007 | Lee et al. |
| 2007/0296571 A1 | 12/2007 | Kolen |
| 2008/0103835 A1 | 5/2008 | Corcoran et al. |
| 2008/0180246 A1 * | 7/2008 | Malik ............ G06K 7/10356 340/572.1 |
| 2008/0319654 A1 | 12/2008 | Shintani et al. |
| 2009/0097710 A1 | 4/2009 | Sroka et al. |
| 2009/0189810 A1 | 7/2009 | Murray |
| 2010/0103036 A1 | 4/2010 | Malone et al. |
| 2010/0107635 A1 | 5/2010 | Tsubone |
| 2010/0271263 A1 | 10/2010 | Moshfeghi |
| 2010/0296075 A1 | 11/2010 | Hinderling et al. |
| 2010/0309044 A1 | 12/2010 | Ische et al. |
| 2011/0047516 A1 | 2/2011 | Pavan et al. |
| 2011/0068906 A1 | 3/2011 | Shafer et al. |
| 2011/0153101 A1 | 6/2011 | Thomas et al. |
| 2011/0182202 A1 | 7/2011 | Olofsson et al. |
| 2011/0251787 A1 | 10/2011 | Gupta et al. |
| 2012/0087212 A1 | 4/2012 | Vartanian et al. |
| 2012/0188847 A1 | 7/2012 | Miyamoto et al. |
| 2012/0204646 A1 | 8/2012 | Lee et al. |
| 2012/0214507 A1 | 8/2012 | Vartanian et al. |
| 2012/0259594 A1 | 10/2012 | Khan et al. |

(56) References Cited

U.S. PATENT DOCUMENTS

| | | |
|---|---|---|
| 2012/0296610 A1 | 11/2012 | Hailemariam et al. |
| 2013/0010103 A1 | 1/2013 | Ihara et al. |
| 2013/0073059 A1 | 3/2013 | Brian et al. |
| 2013/0084886 A1 | 4/2013 | Crilly, Jr. et al. |
| 2013/0120630 A1* | 5/2013 | Kim .................. H04M 1/72454 348/333.01 |
| 2013/0169681 A1 | 7/2013 | Rasane et al. |
| 2013/0197685 A1 | 8/2013 | Matsunaga et al. |
| 2013/0201311 A1 | 8/2013 | Hirakawa |
| 2013/0223261 A1 | 8/2013 | Aggarwal et al. |
| 2013/0283529 A1 | 10/2013 | Hayes et al. |
| 2013/0288719 A1 | 10/2013 | Alonzo |
| 2013/0297555 A1 | 11/2013 | Fadell et al. |
| 2013/0345975 A1 | 12/2013 | Vulcano et al. |
| 2014/0084909 A1 | 3/2014 | Pagani |
| 2014/0107828 A1 | 4/2014 | Zhu et al. |
| 2014/0146038 A1 | 5/2014 | Kangas et al. |
| 2014/0156455 A1 | 6/2014 | Atwood et al. |
| 2014/0188394 A1 | 7/2014 | Febonio et al. |
| 2014/0210856 A1 | 7/2014 | Finn et al. |
| 2014/0244160 A1 | 8/2014 | Cragun et al. |
| 2014/0266755 A1 | 9/2014 | Arensmeier et al. |
| 2014/0274151 A1 | 9/2014 | Pattabiraman et al. |
| 2014/0277594 A1 | 9/2014 | Nixon et al. |
| 2014/0278065 A1* | 9/2014 | Ren .................. G06T 17/00 701/454 |
| 2014/0368373 A1 | 12/2014 | Crain et al. |
| 2015/0005903 A1 | 1/2015 | Worek et al. |
| 2015/0094081 A1* | 4/2015 | Gupta ................. H04W 64/003 455/456.1 |
| 2015/0094865 A1 | 4/2015 | Choi et al. |
| 2015/0116132 A1 | 4/2015 | Nohra et al. |
| 2015/0121222 A1 | 4/2015 | Lacaze et al. |
| 2015/0137967 A1 | 5/2015 | Wedig et al. |
| 2015/0142179 A1 | 5/2015 | Ito et al. |
| 2015/0154803 A1 | 6/2015 | Meier et al. |
| 2015/0156423 A1* | 6/2015 | Lundberg ............ H04N 5/23203 348/169 |
| 2015/0177718 A1 | 6/2015 | Vartiainen et al. |
| 2015/0206348 A1* | 7/2015 | Koreeda ............ H04N 21/4725 345/633 |
| 2015/0207316 A1 | 7/2015 | Saussele et al. |
| 2015/0227123 A1 | 8/2015 | Laycock et al. |
| 2015/0294506 A1 | 10/2015 | Bare et al. |
| 2015/0327010 A1 | 11/2015 | Gottschalk et al. |
| 2015/0347854 A1 | 12/2015 | Bare et al. |
| 2015/0356786 A1 | 12/2015 | Bare et al. |
| 2015/0356789 A1 | 12/2015 | Komatsu et al. |
| 2016/0019721 A1 | 1/2016 | Bare et al. |
| 2016/0026253 A1 | 1/2016 | Bradski et al. |
| 2016/0026729 A1 | 1/2016 | Gil et al. |
| 2016/0063671 A1 | 3/2016 | Piippo et al. |
| 2016/0066068 A1 | 3/2016 | Schultz et al. |
| 2016/0069675 A1 | 3/2016 | Bando et al. |
| 2016/0091217 A1 | 3/2016 | Verberkt et al. |
| 2016/0095188 A1 | 3/2016 | Verberkt et al. |
| 2016/0135006 A1 | 5/2016 | Fjeldsoe-Nielsen |
| 2016/0178383 A1 | 6/2016 | Mays et al. |
| 2016/0183057 A1 | 6/2016 | Steiner |
| 2016/0216879 A1 | 7/2016 | Park et al. |
| 2016/0238692 A1 | 8/2016 | Hill et al. |
| 2016/0258760 A1 | 9/2016 | Beaumont et al. |
| 2016/0284075 A1 | 9/2016 | Phan et al. |
| 2016/0284128 A1 | 9/2016 | Michalscheck et al. |
| 2016/0285416 A1 | 9/2016 | Tiwari et al. |
| 2016/0323149 A1 | 11/2016 | Hu et al. |
| 2016/0335731 A1 | 11/2016 | Hall |
| 2016/0343093 A1 | 11/2016 | Riland et al. |
| 2016/0343243 A1 | 11/2016 | Rabb et al. |
| 2016/0360429 A1 | 12/2016 | Li et al. |
| 2017/0023659 A1 | 1/2017 | Bruemmer et al. |
| 2017/0055126 A1 | 2/2017 | O'Keeffe |
| 2017/0079001 A1 | 3/2017 | Lewis |
| 2017/0115022 A1 | 4/2017 | Grosshart et al. |
| 2017/0131426 A1 | 5/2017 | Sgarz et al. |
| 2017/0169683 A1 | 6/2017 | Ryder |
| 2017/0200312 A1 | 7/2017 | Smith et al. |
| 2017/0234962 A1 | 8/2017 | Yang et al. |
| 2017/0237892 A1 | 8/2017 | Sakai |
| 2017/0286568 A1 | 10/2017 | Dean et al. |
| 2017/0289344 A1 | 10/2017 | Greenberger et al. |
| 2017/0363504 A1 | 12/2017 | Winant et al. |
| 2018/0018826 A1 | 1/2018 | Maier et al. |
| 2018/0035263 A1 | 2/2018 | Titus et al. |
| 2018/0048693 A1 | 2/2018 | Gulbinas et al. |
| 2018/0075168 A1 | 3/2018 | Tiwari et al. |
| 2018/0084623 A1 | 3/2018 | Joppi et al. |
| 2018/0101803 A1 | 4/2018 | Tiwari et al. |
| 2018/0102858 A1 | 4/2018 | Tiwari et al. |
| 2018/0108079 A1 | 4/2018 | Traub |
| 2018/0130260 A1 | 5/2018 | Schmirler et al. |
| 2018/0131907 A1 | 5/2018 | Schmirler et al. |
| 2018/0159904 A1 | 6/2018 | Hu et al. |
| 2018/0239313 A1 | 8/2018 | Santarone et al. |
| 2018/0239840 A1 | 8/2018 | Santarone et al. |
| 2018/0242907 A1 | 8/2018 | Bonomi |
| 2018/0285482 A1 | 10/2018 | Santos et al. |
| 2018/0295526 A1 | 10/2018 | Wills et al. |
| 2018/0328753 A1 | 11/2018 | Stenning et al. |
| 2018/0357823 A1 | 12/2018 | Koniki et al. |
| 2018/0374269 A1 | 12/2018 | Smith |
| 2019/0025905 A1 | 1/2019 | Godina et al. |
| 2019/0057169 A1 | 2/2019 | Santarone et al. |
| 2019/0096232 A1 | 3/2019 | Wedig et al. |
| 2019/0156576 A1 | 5/2019 | Ndolo |
| 2019/0216333 A1* | 7/2019 | Lai .................. G06F 16/55 |
| 2019/0228370 A1 | 7/2019 | Lien |
| 2019/0268062 A1 | 8/2019 | Josefiak |
| 2019/0281573 A1* | 9/2019 | Tyagi .................. G01S 5/021 |
| 2019/0294834 A1 | 9/2019 | Mountz |
| 2019/0355177 A1 | 11/2019 | Manickam et al. |
| 2019/0392088 A1 | 12/2019 | Duff et al. |
| 2020/0072538 A1 | 3/2020 | Woolf et al. |
| 2020/0108926 A1 | 4/2020 | Smith et al. |
| 2020/0286300 A1* | 9/2020 | Shih .................. G06T 7/70 |

FOREIGN PATENT DOCUMENTS

| | | |
|---|---|---|
| GB | 2498177 A | 7/2013 |
| KR | 101354688 B1 | 1/2014 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

Amekudzi, Adjo A., Rebecca Shelton, and Tim R. Bricker. "Infrastructure Rating Tool: Using Decision Support Tools to EnhanceASCE Infrastructure Report Card Process." Leadership and Management in Engineering 13.2 (2013): 76-82. (Year: 2013).

ASCE 2014 Report Card of Montana's Infrastructure, accessed at https://www.infrastructurereportcard.org/wp-contentluploads/2014/11/2014-Report-Card-for-Montanas-Infrastructure.pdf (Year: 2014).

Aukstakalnis, Steve. Practical augmented reality: A guide to the technologies, applications, and human factors for AR and VR.Addison-Wesley Professional, 2016. (Year: 2016).

Azeez et al., "Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).

Brainergiser, "Large holographic projector—a real use case". Sep. 19, 2015, https://www.youtube.com/watch?v=JwnS-EKTW2A &feature=youtu.be.

Carmelo Scuro et al., IoT for Structural Health Monitoring, Dec. 2018, IEEE Instrumentation & Measurement Magazine, pp. 4-14.

(56) References Cited

OTHER PUBLICATIONS

Jong et ai, "Evaluation of the Reliability of RSSI for Indoor localization", 2012, pp. 6. downloaded from the internet https://ieeexplore.ieee.org/documentl6402492 (Year 2012).

Edwards, Luke, "Holograms are finally here: Plasma lasers used to create images in mid-air." Pocket-Lint.com, Nov. 5, 2014, https://www.pocket-lint.com/gadgets/news/131622-holograms-are-finally-here-plasma-lasers-used-to-create-images-in-mid-air.

Gifford, Matthew, "Indoor Positioning with Ultrasonic/Ultrasound", Oct. 19, 2018, 7 pages, https://www.leverege.com/blogpost/ultrasonic-indoor-positioning.

Hexamite, "HX19V2 RFID Ultrasonic Positioning System", 1999, https://www.hexamite.com/hx19.htm.

Hu. Wi-Fi Based Indoor Positioning System Using Smartphones. Nov. 2013. [retrieved on Apr. 23, 2018]. Retrieved [from the Internet: (91 pages total).

International Search Report and Written Opinion dated Feb. 6, 2020 issued in connection with corresponding [International Application No. PCT/US2018/019185 (9 pages total).

International Search Report and Written Opinion dated Feb. 10, 2020 issued in connection with corresponding [International Application No. PCT/US2018/019154 (9 pages total).

International Search Report and Written Opinion dated May 14, 2018 issued in connection with corresponding International Application No. PCT/US2018/019154 (10 pages total).

International Search Report and Written Opinion dated May 7, 2018 issued in connection with corresponding [International Application No. PCT/US2018/019185 (7 pages total).

Khemapech et al., Bridge Structural Monitoring and Warning System Aplication in Thailand—Experiences Learned, 2017, TRON Forum ISBN 978-4-89362-330-0, pp. 1-8.

Kyle, "Property Management" Dearborn Real Estate, 2000—Business & Economics, pp. 40-41.

Liu etal.,"A Hybrid Smartphone Indoor Positioning Solution for Mobile LBS" Sensors 2012, issue 12, pp. 17208-17233 (Year: 2012).

Liu, "Survey of Wireless Based Indoor Localization Technologies" accessed at http://www.cse.wustl.edu/-jain/cse574-14/ftp/indoor/index.html, May 5, 2014, 17 pg printout (Year: 2014).

Mordue, Stefan, Paul Swaddle, and David Philp. Building information modeling for dummies. John Wiley & Sons, 2015. (Year: 2015).

Qi, J.; Liu, G.-P. A Robust High-Accuracy Ultrasound Indoor Positioning System Based on a Wireless Sensor Network. Sensors 2017, 17, 2554.

Suermann, Patrick C. Evaluating the impact of building information modeling (BIM) on construction. Florida Univ Gainesvillegraduate School, 2009. (Year 2009).

Thomson, C. P. H. From Point Cloud to Building Information Model: Capturing and Processing Survey Data Towards Automation forHigh Quality 3D Models to Aid a BIM Process. Diss. UCL (University College London), 2016. (Year: 2016).

Wang et al. A wireless structural health monitoring system with multithreaded sensing devices: design and validation. • In: Structure and Infrastructure Engineering. Feb. 16, 2007 (Feb. 16, 2007) Retrieved on Jul. 21, 2019 (Jul. 21, 2019).

Wang et al. Performance Evaluation of Automatically Generated BIM from Laser Scanner Data for Sustainability Analyses. 2015. [retrieved on Apr. 23, 2018]. Retrieved from the Internet: . (8 pages total).

Wang, Siqi, Jinsheng Du, and Jianyong Song. "A Framework of BIM-Based Bridge Health Monitoring System." 2016 InternationalConference on Civil, Transportation and Environment. Atlantis Press, 2016. (Year: 2016).

Wikipedia article "Building Information Modeling", archive data Jan. 15, 2016 on the Wayback machine (Year: 2016).

Yang et ai, "Wi Fi-Based Indoor Positioning", 2015, pp. 150-157 downloaded from the internet I EEE.com databases. (Year: 2015).

Zhihua Wang et al., A Review of Wearable Technologies for Elderly Care that Can Accurately Track Indoor Position, Recognize Physical Activities and Monitor Vital Signs in Real Time, Feb. 10, 2017, Sensors (Basel), 17(2), 341, p. 1-36; doi: 10.3390/s 17020341 (Year: 2017).

Zou et al., "SmartScanner: Know More in Walls with Your Smartphone!" IEEE Transactions on Mobile Computing, vol. 15, No. 11, Nov. 2016, pp. 2865-2877 (Year: 2016).

\* cited by examiner

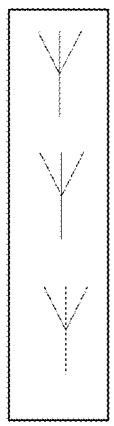 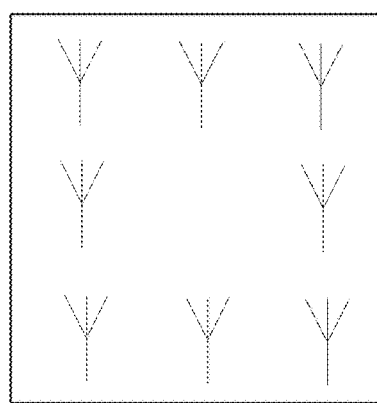 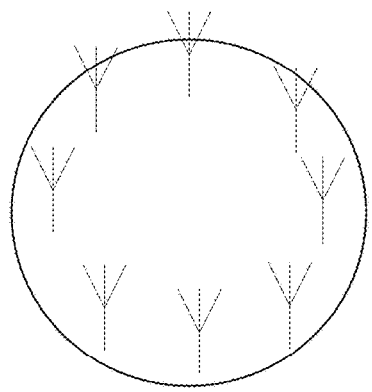
FIG. 4A   FIG. 4B   FIG. 4C
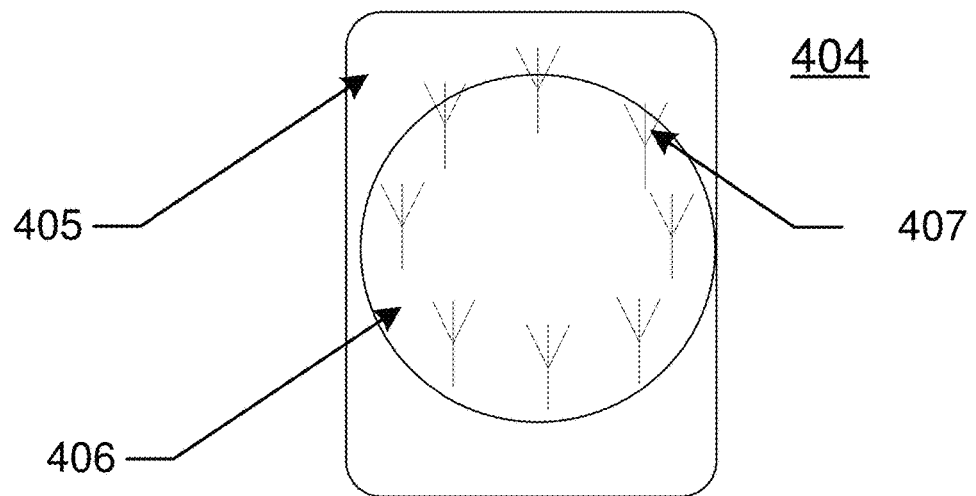
FIG. 4D

```
┌─────────────────────────────────────────────────────────────────────────┐
│ TRANSMIT A LAYER ONE LOCATION DESIGNATION OF AT LEAST ONE AGENT         │
│                  SUPPORTED POSITION TRANSCEIVER                          │
│ 1022                                                                     │
└─────────────────────────────────────────────────────────────────────────┘
                                   │
┌─────────────────────────────────────────────────────────────────────────┐
│ RECEIVE A DESIGNATION OF A LAYER TWO POSITION REFERENCE TRANSCEIVER     │
│                   BASED UPON THE LAYER ONE LOCATION                      │
│ 1023                                                                     │
└─────────────────────────────────────────────────────────────────────────┘
                                   │
┌─────────────────────────────────────────────────────────────────────────┐
│       CALCULATE A DISTANCE FROM MULTIPLE LAYER TWO POSITION REFERENCE   │
│ 1024     TRANSCEIVERS AND AT LEST ONE AGENT SUPPORTED TRANSCEIVER        │
└─────────────────────────────────────────────────────────────────────────┘
                                   │
┌─────────────────────────────────────────────────────────────────────────┐
│ REPEAT STEP 2024 FOR MULTIPLE CALCULATED DISTANCES UNTIL A POSITION OF  │
│ THE AGENT SUPPORTED TRANSCEIVER MAY BE CALCULATED BASED UPON THE        │
│ CALCULATED DISTANCES                                                     │
│ 1025                                                                     │
└─────────────────────────────────────────────────────────────────────────┘
                                   │
┌─────────────────────────────────────────────────────────────────────────┐
│          REPEAT STEP 1025 MULTIPLE TIMES USING A SAME FREQUENCY          │
│ 1026                                                                     │
└─────────────────────────────────────────────────────────────────────────┘
                                   │
┌─────────────────────────────────────────────────────────────────────────┐
│ 1027       REPEAT STEP 1025 MULTIPLE TIMES USING DIFFERENT FREQUENCIES  │
└─────────────────────────────────────────────────────────────────────────┘
                                   │
┌─────────────────────────────────────────────────────────────────────────┐
│    CALCULATE AN ESTIMATED POSITION OF THE AT LEAST ONE AGENT SUPPORTED  │
│            POSITION TRANSCEIVER BASED UPON A MATHEMATICAL PROCESS        │
│ 1028                                                                     │
└─────────────────────────────────────────────────────────────────────────┘
                                   │
┌─────────────────────────────────────────────────────────────────────────┐
│ GENERATE A VECTOR BASED UPON AT LEAST ONE OF THE POSITION OF THE AGENT  │
│ SUPPORTED TRANSCEIVER BASED UPON THE CALCULATED DISTANCES AND THE       │
│ ESITMATED POSITION OF THE AT LEAST ONE AGENT SUPPORTED POSITION         │
│ TRANSCEIVER                                                              │
│ 1029                                                                     │
└─────────────────────────────────────────────────────────────────────────┘
```

FIG. 10

```
┌─────────────────────────────────────────────────────────────────────────┐
│ CALCULATE A LOCATION OF A FIRST POSITION TRANSCEIVER SUPPORTED BY AN AGENT BASED │
│        UPON WIRELESS COMMUNICATION WITH A REFERENCE POSITION TRANSCEIVER         │
│ 1132                                                                             │
└─────────────────────────────────────────────────────────────────────────┘
                                        │
┌─────────────────────────────────────────────────────────────────────────┐
│ CALCULATE A LOCATION OF A SECOND POSITION TRANSCEIVER ALSO SUPPORTED BY THE AGENT│
│      BASED UPON WIRELESS COMMUNICATION WITH A REFERENCE POSITION TRANSCEIVER     │
│ 1133                                                                             │
└─────────────────────────────────────────────────────────────────────────┘
                                        │
┌─────────────────────────────────────────────────────────────────────────┐
│ GENERATE A VECTOR BASED UPON THE LOCATION OF THE FIRST POSITION TRANSCEIVER AND │
│ 1134              THE POSITION OF THE SECOND POSITION TRANSCEIVER                │
└─────────────────────────────────────────────────────────────────────────┘
                                        │
┌─────────────────────────────────────────────────────────────────────────┐
│                 QUERY A DATABASE BASED UPON THE VECTOR                           │
│ 1135                                                                             │
└─────────────────────────────────────────────────────────────────────────┘
                                        │
┌─────────────────────────────────────────────────────────────────────────┐
│ GENERATE A USER INTERFACE BASED UPON A RESPONSE TO THE QUERY BASED UPON THE     │
│                                   VECTOR                                         │
│ 1136                                                                             │
└─────────────────────────────────────────────────────────────────────────┘
                                        │
┌─────────────────────────────────────────────────────────────────────────┐
│       DISPLAY THE USER INTERFACE ON A SMART DEVICE ASSOCIATED WITH THE AGENT    │
│ 1137                                                                             │
└─────────────────────────────────────────────────────────────────────────┘
```

FIG. 11

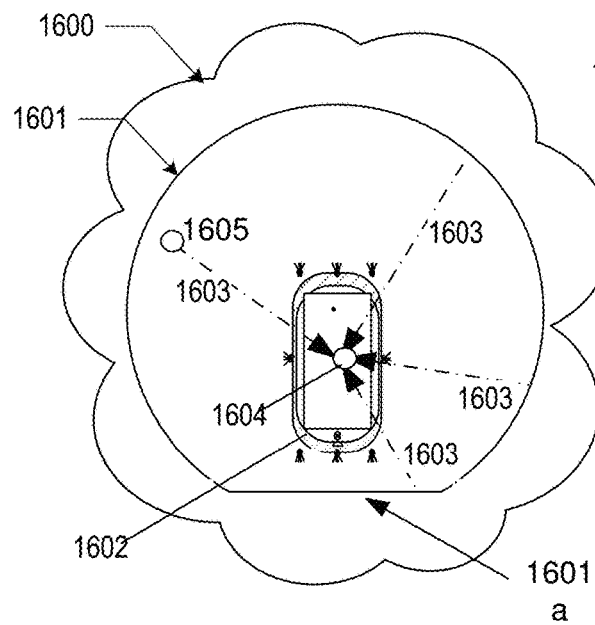
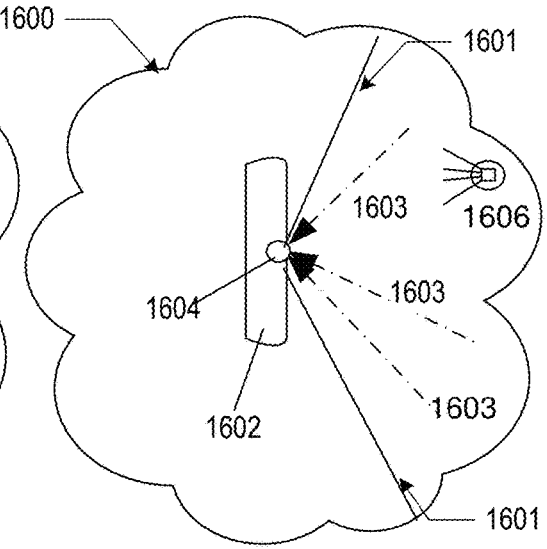
FIG. 16A
FIG. 16B
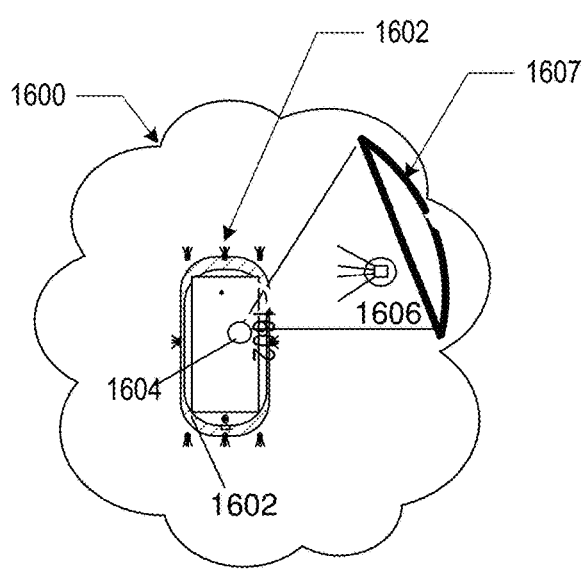
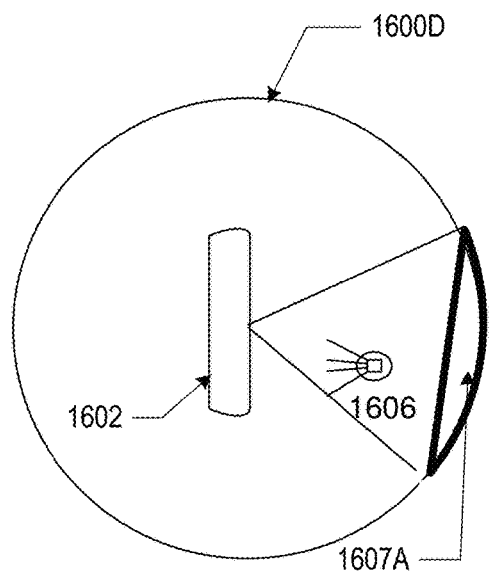
FIG. 16C
FIG. 16D

METHOD AND APPARATUS FOR INTERACTING WITH A TAG IN A COLD STORAGE AREA

CROSS REFERENCE TO RELATED APPLICATIONS

This application claims priority to the Non-Provisional patent application Ser. No. 16/943,750 filed Jul. 30, 2020 and entitled COLD STORAGE ENVIRONMENTAL CONTROL AND PRODUCT TRACKING as a continuation in part application, which in turn claims priority to the Non-Provisional patent application Ser. No. 16/915,155 filed Jun. 29, 2020 and entitled METHOD OF WIRELESS DETERMINATION OF A POSITION OF A NODE as a continuation in part application, which in turn claims priority to the Non Provisional patent application Ser. No. 16/775,223, filed Jan. 28, 2020 and entitled SPATIAL SELF-VERIFYING ARRAY OF NODES as a continuation in part; which in turn claims priority to the Non Provisional patent application Ser. No. 16/688,775, filed Nov. 19, 2019 and entitled METHOD AND APPARATUS FOR WIRELESS DETERMINATION OF POSITION AND ORIENTATION OF A SMART DEVICE as a continuation in part and to Non Provisional patent application Ser. No. 16/721,906, filed Dec. 19, 2019 and entitled METHOD AND APPARATUS FOR DETERMINING A DIRECTION OF INTEREST as a continuation in part; the present application also claims priority to the Non-Provisional patent application Ser. No. 16/900,753 filed Jun. 12, 2020 and entitled METHOD AND APPARATUS FOR AUTOMATED SITE AUGMENTATION as a continuation in part application; and to the Non-Provisional patent application Ser. No. 16/898,602 filed Jun. 11, 2020 and entitled METHOD AND APPARATUS FOR ENHANCED POSITION AND ORIENTATION DETERMINATION as a continuation application, which in turn claims priority to Non-Provisional patent application Ser. No. 16/817,926 filed Mar. 13, 2020 and entitled APPARATUS FOR OPERATION OF CONNECTED INFRASTRUCTURE as a continuation in part application; and to Non-Provisional patent application Ser. No. 16/905,048 filed Jun. 18, 2020 and entitled APPARATUS FOR DETERMINING A DIRECTION OF INTEREST as a continuation application; and to Non-Provisional patent application Ser. No. 16/503,878 filed Jul. 5, 2019 and entitled METHOD AND APPARATUS FOR ENHANCED AUTOMATED WIRELESS ORIENTEERING as a continuation in part application; and to Non-Provisional patent application Ser. No. 16/142,275 filed Sep. 26, 2018 and entitled METHODS AND APPARATUS FOR ORIENTEERING as a continuation in part application, which in turn claims priority to Provisional application Ser. No. 62/769,133 filed Nov. 19, 2018 and entitled METHODS AND APPARATUS FOR ORIENTEERING. The contents of each of the heretofore claimed matters are relied upon and incorporated herein by reference.

INCORPORATION BY REFERENCE TO RELATED APPLICATIONS

This application references the Non Provisional U.S. patent application Ser. No. 16/504,919, filed Jul. 8, 2019 and entitled METHOD AND APPARATUS FOR POSITION BASED QUERY WITH AUGMENTED REALITY HEADGEAR, the entire contents of which are hereby incorporated by reference. This application references the Non Provisional patent application Ser. No. 16/297,383, filed Jul. 5, 2019 and entitled SYSTEM FOR CONDUCTING A SERVICE CALL WITH ORIENTEERING, the entire contents of which are hereby incorporated by reference. This application references the Non Provisional patent application Ser. No. 16/249,574, filed Jan. 16, 2019 and entitled ORIENTEERING SYSTEM FOR RESPONDING TO AN EMERGENCY IN A STRUCTURE, the entire contents of which are hereby incorporated by reference. This application references the Non Provisional patent application Ser. No. 16/176,002, filed Oct. 31, 2018 and entitled SYSTEM FOR CONDUCTING A SERVICE CALL WITH ORIENTEERING, the entire contents of which are hereby incorporated by reference. This application references the Non Provisional patent application Ser. No. 16/171,593, filed Oct. 26, 2018 and entitled SYSTEM FOR HIERARCHICAL ACTIONS BASED UPON MONITORED BUILDING CONDITIONS, the entire contents of which are hereby incorporated by reference. This application references the Non Provisional patent application Ser. No. 16/165,517, filed Oct. 19, 2018 and entitled BUILDING VITAL CONDITIONS MONITORING, the entire contents of which are hereby incorporated by reference. This application references the Non Provisional patent application Ser. No. 16/161,823, filed Oct. 16, 2018 and entitled BUILDING MODEL WITH CAPTURE OF AS BUILT FEATURES AND EXPERIENTIAL DATA, the entire contents of which are hereby incorporated by reference. This application references the Non Provisional patent application Ser. No. 15/887,637, filed Feb. 2, 2018 and entitled BUILDING MODEL WITH CAPTURE OF AS BUILT FEATURES AND EXPERIENTIAL DATA, the entire contents of which are hereby incorporated by reference. This application references the Non Provisional patent application Ser. No. 15/716,133, filed Sep. 26, 2017 and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non Provisional patent application Ser. No. 15/703,310, filed Sep. 5, 2017 and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non Provisional patent application Ser. No. 16/528,104, filed Jul. 31, 2019 and entitled SMART CONSTRUCTION WITH AUTOMATED DETECTION OF ADVERSE STRUCTURE CONDITIONS AND REMEDIATION, the entire contents of which are hereby incorporated by reference. This application references the Non-Provisional U.S. patent application Ser. No. 16/657,660, filed Oct. 18, 2019 and entitled METHOD AND APPARATUS FOR CONSTRUCTION AND OPERATION OF CONNECTED INFRASTRUCTURE, the entire contents of which are hereby incorporated by reference.

FIELD OF THE INVENTION

The present invention relates to storage areas with automated environmental condition tracking and control. More specifically, the present invention relates to methods and apparatus for quantifying thermal conditions and other environmental variables in a cold storage facility and tracking the locations of products in the cold storage facility and environmental conditions experienced by the product during the product's cold storage life cycle.

BACKGROUND OF THE DISCLOSURE

Cold storage facilities are used in a variety of industries with differing needs and product storage life cycles. Cold storage temperatures may vary depending on a type of goods to be stored and a length of a storage period. For example, storage temperatures may be as high as about 5° C. for non-frozen goods such as fresh meats, dairy, fresh produce and flowers that are stored for relatively short periods of time. Frozen meat and seafood may be stored at temperatures ranging between −10 to 18° C.; and industrial storage, or blood, and other biological supplies may need to be stored at less than −30° C.

Each temperature range and type of good may have unique needs that may affect how a cold storage facility is optimally cooled and how important control of other environmental factors, such as moisture, light, and vibration, may be to maintaining product quality during storage.

Accurate, uniform, and efficient control of the environmental conditions in cold storage facilities may be difficult to achieve, particularly in large facilities. Without such control, the quality of goods may be negatively affected. Additionally, due to lack of uniformity in environmental control, it may be difficult to assess which goods have suffered a decrease in product quality. As such, there remains a need for improved control and monitoring of environmental conditions in cold storage facilities.

SUMMARY OF THE DISCLOSURE

Accordingly, the present invention provides apparatus and methods for quantifying and alerting a user as to what conditions exist in a cold storage facility and what goods or other items are present in the cold storage facility and where respective items are located and what conditions the items experienced while in the cold storage facility.

Locations are determined based upon wireless communications between transceivers located within specified areas of the cold storage facility. The wireless communications may indicate a location of a condition quantified by a automated sensor. Quantified conditions may include, for example, one or more of: a temperature currently present in the facility, a temperature experienced by an item stored in the facility, conditions of air introduced by an HAVC; humidity, barometric pressure, air flow, door position, presence of humans in the cold storage space, presence of a pallet, presence of a particular item, length of presence in the facility; whether an item has been dropped or otherwise jarred; location of an item, pallet or person; and a location and position of almost any condition quantifiable via electronic sensor. Notifications and/or alerts may be transmitted indicating one or both of a condition present and a location of the condition.

Provided according to embodiments of the invention, are methods, apparatus, devices, and systems for tracking products throughout the storage life cycle at a cold storage facility. Tracking includes both location tracking and tracking of the environmental conditions in which the product has been stored at each location in the facility.

Further provided according to embodiments of the invention are systems and methods for control of environmental conditions within a cold storage facility. In some embodiments, a three-dimensional (3D) profile of temperature, humidity, and/or other environmental conditions may be created and analyzed over time. The information regarding environmental conditions over time may be correlated with the information regarding the location of products over time to determine the environmental conditions of a particular product throughout its time in the cold storage facility. Additionally, monitoring changes in the 3D environmental profiles in the facility over time may allow for optimization of cooling or heating cycles, air input and extraction, and other HVAC operations in view of the specific events occurring at the facility, the specific configuration of the facility, and the type of products in the facility. For example, changes in temperature may be correlated with specific actions at certain locations, and the system may use this information to optimize heating or cooling in the facility, either automatically or with user input.

Further provided according to embodiments of the invention are methods of tracking and locating the facility's employees, infrastructure, equipment, and sensors. This tracking combined with orienteering methodology and devices may allow for facile location of persons or objects in the facility. Additionally, in the event of an adverse event with such persons or objects, appropriate aid or resources may be routed to the appropriate location using the devices and methodology herein.

Also provided according to embodiments of the invention are user interfaces, devices, systems, and apparatus for tracking products, employees, infrastructure, equipment, and sensors. Such devices, systems, and apparatus may perform the methods described herein. Additionally, the devices, systems, and apparatus may be in logical communication with warehouse management systems (WMS) or other databases that track and control processes in the cold storage facility.

BRIEF DESCRIPTION OF THE DRAWINGS

The accompanying drawings, that are incorporated in and constitute a part of this specification, illustrate several embodiments of the disclosure and, together with the description, serve to explain the principles of the disclosure:

FIGS. 4A-4D illustrate exemplary configurations of antenna arrays.

FIG. 10 is a flow chart providing method steps for determining an Agent's location.

FIG. 11 is a flow chart providing method steps for determining an Agent's location.

FIGS. 16A-16G provide illustrations of a field of view depiction of a Smart Device.

DETAILED DESCRIPTION OF EMBODIMENTS OF THE INVENTION

Figure 1:
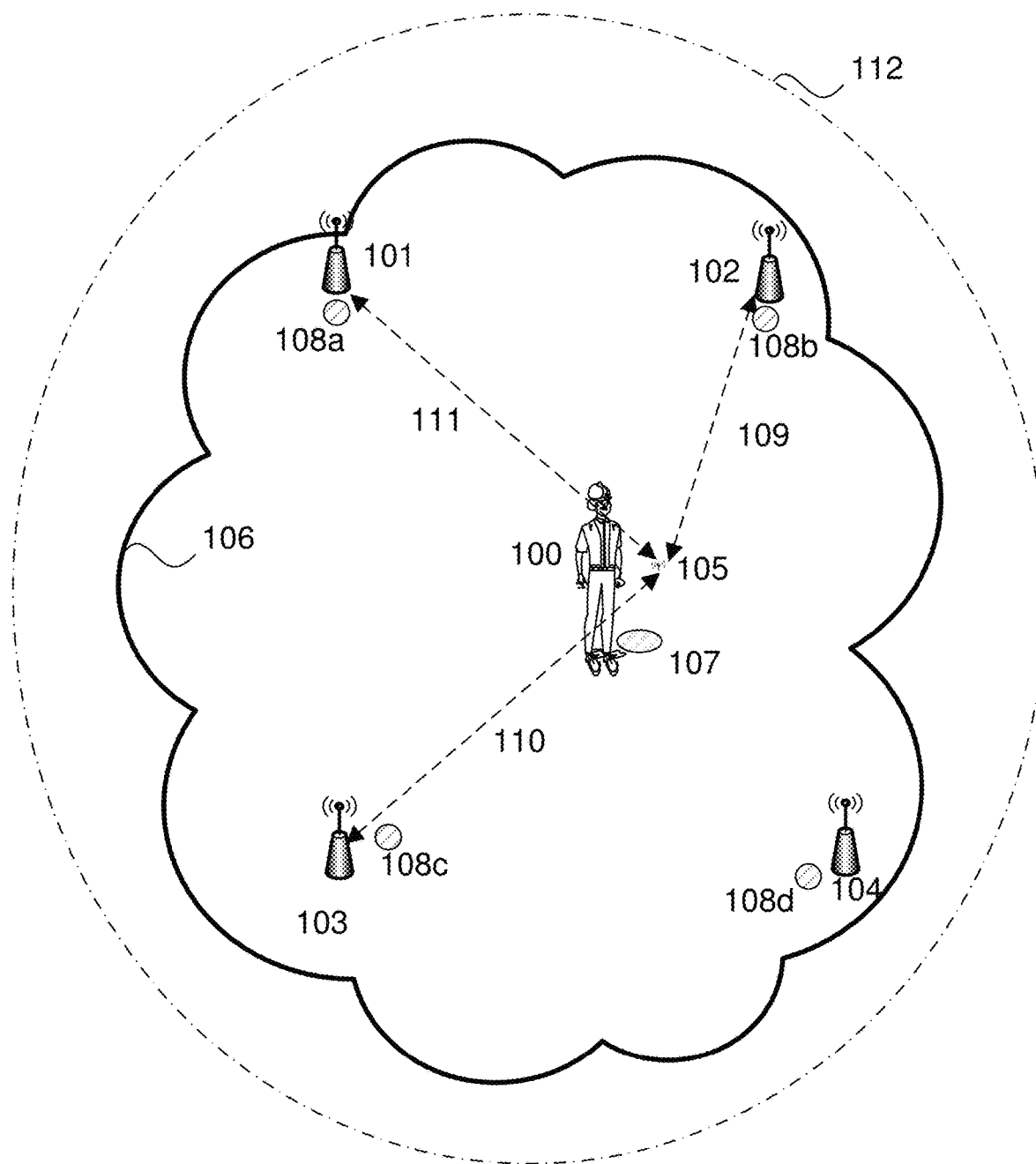
FIG. 1 illustrates how an Agent with Smart Device may be located using Reference Point Transceivers according to some embodiments of the invention.

As used in the description of the invention and the appended claims, the singular forms "a," "an" and "the" are intended to include the plural forms as well, unless the context clearly indicates otherwise.

A number of embodiments of the present disclosure are described herein. While this specification contains many specific implementation details, they should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings and the detailed description thereto are not intended to limit the present disclosure to the form disclosed, but to the contrary, the present disclosure is to cover all modification, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

GLOSSARY

"Agent" as used herein refers to a person or automation capable of supporting a Smart Device at a geospatial location relative to a ground plane. As used herein, the term "Cold Storage Employee" or "Employee" may be used interchangeably with Agent as a specific example, but it should be understood that any suitable Agent may be used in lieu of an Employee, including an automated Agent. One example of an automated Agent is a transport such as a forklift that is used to transport products in the cold storage facility.

"As Built," as used herein, includes data that quantifies details of how a specific physical structure was actually constructed. In the present invention, a cold storage facility may be designed and modeled in a 3D virtual setting. As Built data is combined with a design model in a virtual setting to generate an Augmented Virtual Model. As Built data may reflect one or more of: fabrication of the Facility; repair; maintenance; upgrades; improvements; and work order execution associated with the Facility.

An "Augmented Virtual Model" or "AVM" of a Property or Structure may include a CAD model (or similar virtual model) of the Property or Structure, augmented with relevant data about the Property or Structure. This data may include As Built or Experiential data about rooms, features, utilities, or other facts about the Property or Structure.

"Experiential Data," as used herein, may be generated and entered into the AVM virtual model of the structure. Experiential Data may include data indicative of a factor that may be tracked and/or measured in relation to the Facility. Experiential data is typically generated by Sensors in or proximate to the Facility and may include, by way of non-limiting example, one or more sensors, such as: vibration Sensors (such as accelerometers and piezo electro devices); force transducers; electronic temperature sensing device (e.g. thermocouple, thermistor, resistance based, etc.); amp meters, ohmmeters, switches, motion detectors; light wavelength capture (such as infrared temperature profile devices), water flow meters; air flow meters; and the like. Some examples of Experiential Data may include: details of operation of equipment or machinery in the Processing Facility; vibration measurements; electrical current draws; machine run times, machine run rates, machine run parameters; interior and/or exterior temperatures; opening and closings of doors and windows; weight loads; preventive maintenance; cleaning cycles; air circulation; mold contents; thermal profiles and the like.

"Image Capture Device" as used herein refers to an apparatus for capturing digital or analog image data. An Image Capture Device may be a two- or three-dimensional camera and may include a charge-coupled device (known as a "CCD").

A "Modality," as used in conjunction with a transceiver, transmitter, and/or receiver, refers to one or both of a bandwidth of wireless communication and a protocol associated with a bandwidth. By way of non-limiting example, a modality, as used in relation to a transceiver, transmitter, and/or receiver may include: Wi-Fi; Wi-Fi RTT; Bluetooth; UWB; ultrasonic; sonic; infrared; or other logical communication medium.

"Node" as used herein means a device including at least a processor, a digital storage, and a wireless transceiver. A "Base Node" may have additionally functionality including the ability to aggregate data over time, perform controller functions, transmit data via one or more wireless modality, be powered by utility-based alternating current, and/or communicate via a hardwired medium (e.g., via ethernet cabling).

"Property," as used herein, means a Structure/Facility or piece of real property to be navigated in accordance with the orienteering methods and apparatus described herein. In general, the term "Property" will refer to the cold storage Facility and/or the real property on which it sits.

"Ray" as used herein refers to a straight line including a starting point and extending indefinitely in a direction.

"Reference Point Transceiver" as used herein means an electronic device capable of one or both of transmitting or receiving data, and whose position within a Property is known or capable of being known. An example of a Reference Point Transceiver is a Node.

"Smart Device" as used herein includes an electronic device including, or in logical communication with, a processor, controller, and digital storage, and capable of executing logical commands.

"Structure" as used herein refers to a manmade assembly of parts connected in an ordered way. Examples of a Structure in this disclosure include a building that includes a Cold Storage Facility. "Cold Storage Facility" or "Facility," as used herein, refers to one or more enclosed spaces, which may include doors, bays, vents, or other methods of ingress/egress, but are generally temperature controlled via an HVAC or other cooling system. Examples of Cold Storage Structures include vaults, lockers, rooms, warehouses, and the like. A cold storage warehouse or Facility may be described with reference to many embodiments herein, but it is to be understood that the same systems and methods could be used with other cold storage Structures.

"Environmental Control System" includes at least one processing device in communication with an environmental sensor. In some embodiments, the processing device acts as or is in communication with a controller that performs an action based on environmental data in the Facility obtained by a sensor, wherein such actions include creating visual displays, generating alarms, and modifying a heating or cooling cycle by the cooling system. An environmental control system may include a temperature control system, but may also include other non-temperature sensors including humidity, light, motion, vibration, weight, volume, LIDAR, other location positioning sensors/devices. A "Temperature Control System" is one type of "Environmental Control System," in which the environmental data is temperature data.

As used herein, a "3D thermal detection apparatus" refers to any apparatus or device that can create a 3D temperature profile. In some embodiments, the apparatus may include thermal imaging software with depth of field parameters. Examples include LIDAR relief map with thermal infrared imaging overlaid thereon. In some cases, the 3D thermal detection apparatus may include a series of temperature sensors, such that a 3D profile can be obtained by extrapolating between sensors.

As used herein, a "3D temperature profile" refers to a display or readout that provides temperature measurements throughout a 3D space, whereby temperature can be measured on X, Y, and Z axes or using polar coordinates. The sensitivity and mechanism of display may vary depending on the apparatus used to create the 3D temperature profile. Other types of environmental data may monitored in a 3D space to create 3D profiles. Examples include 3D humidity profiles, 3D air flow profiles, and 3D radiation profiles.

Tracking Position, Direction of Interest, and Field of View

Methods of tracking position of persons, objects, equipment, sensors, and other infrastructure will first be described. Such methods, devices, and systems may be used in various embodiments described herein.

Orienteering methods and apparatus may provide accurate determination of the position of a Smart Device, and/or an Employee or Agent in possession of the Smart Device, relative to a destination or feature of interest. In some cases, highly accurate location position may be determined via automated apparatus and multiple levels of increasingly accurate location determination. A first level may include use of a GPS device (i.e., within the Smart Device) providing a reading to first identify the location of a Property on which a Cold Storage Facility sits (i.e., the cold storage warehouse). The GPS device may further be associated with a high-level, general description of the Property, such as an address, lot number, or other recorded designator.

A second level may use position transmitters located within, or proximate to, the Cold Storage Facility to execute triangulation processes in view of on-site location references, such as a Reference Position Transceiver, near field radio communication beacons at known X-Y position reference points; line of sight with physical reference markers; coded via ID such as bar code, hash tag, and alphanumeric or other identifier. In some embodiments, triangulation may calculate a position within a boundary created by the reference points to within millimeter range. In some embodiments, differential GPS may be used to accurately determine a location of a Smart Device with a sub centimeter accuracy. This location may be determined with reference to two- or three-dimensional Cartesian or polar coordinates.

In some examples, a reference point Node may be placed in a fixed location and function as a transceiver of signals. For example, a Node may receive and transmit signals in a radio frequency band of the electromagnetic spectrum. In a simple form, a Node may receive an incoming wireless radio frequency communication and also broadcast a radio frequency wireless communication. Radio frequencies utilized for wireless communication may include those within the electromagnetic spectrum radio frequencies used in UWB, Wi-Fi, and Bluetooth modalities, as well as IR, bisible and UV light as examples.

In some embodiments, a Node is operative to communicate timing data and data generated by a sensor. Such communications may provide identifying information unique to the Node, data related to the synchronization of timing with reference point transceivers, and/or data received from other Nodes.

A triangulation calculation of the position of a Smart Device or a Node may result from a system of multiple reference position Nodes communicating timing signals to or from the Smart Device or Node. Methods of calculating positions via wireless communications may include one or more of: RTT, RSSI, AoD, AoA, timing signal differential and the like. Triangulation or other mathematical techniques may also be employed in determining a location.

The process of determination of a position based upon triangulation with the reference points may be accomplished, for example via executable software interacting with a controller in a Node, a Smart Device, or server.

Referring now to FIG. 1, an exemplary embodiment of a cold storage Employee with a Smart Device in a Cold Storage Facility with Reference Position Transceivers to assist in precise location identification is shown. Reference Position Transceivers 101-104 may be deployed in a defined area 106 to determine a location 107 of an Employee/Agent 100 within or proximate to the defined area 106. Reference Position Transceivers 101-104 may be fixed in respective locations 108a, 108b, 108c and 108d and transceive in a manner suitable for a triangulation determination of the position of the Employee. Transceiving may occur via wireless transmission to one or more Transceivers 105 supported by the Employee 100. By way of non-limiting example, Transceivers 105 supported by the Employee 100 may be included in, or be in logical communication with, a Smart Device with Transceivers 105 able to transceive with the Reference Position Transceivers 101-104. Wireless communications between the Reference Point Transceivers and one or more Transceivers 105 supported by an Agent 100 include timing data or other information useful to determine a location 107 of the Transceiver 105 supported by the Agent 100, within or proximate to the defined area 106.

The Reference Position Transceivers 101-104 may include devices such as a radio transmitter, radio receiver, a light generator, or an image-recognizable device (i.e., an apparatus set out in a distinctive pattern recognizable by a camera). A radio transmitter may include a router or other Wi-Fi, Bluetooth or other communication device for entering into logical communication with a controller. In some embodiments, Reference Position Transceivers 101-104 may include a Wi-Fi router that additionally provides access to a distributed network, such as the Internet. Cartesian coordinates (including Cartesian coordinates generated relative to a GPS or other reference point), or any other coordinate system, may be used as data that may be utilized for one or more of: locating one or both of an Employee 100; indicating a direction of interest; and identifying a Structure or defined area 106. A radio transmitter may include a router or other Wi-Fi device. The radio transmitter may include transmissions on traditional Wi-Fi frequencies (300 MHz-60 GHz), including ultra-wideband frequencies (a bandwidth above 500 MHz, e.g. between 3.1 and 10.6 GHz or 24 GHz), some specific products may utilize bandwidths of between 6 to 8.5 GHz; 6 to 9 GHz, 3.5 to 6.5 GHz, 6 to 8 GHz, and the like. The light generator may distribute light at human-safe intensities and at virtually any frequency known in the art. Such frequencies include, without limitation, infrared, ultraviolet, visible, or nonvisible light. Further, the light beacon may comprise a laser, which may transmit light at any of the aforementioned frequencies in a coherent beam.

Positions of the Reference Point Transceivers 101-104, which are fixed in respective locations 108(a-d) within or proximate to the defined area 106, define a wireless communication area (WCA) 112. Essentially the WCA 112 defines an area in which a location of a person may be tracked. A sensor may continue to quantify a physiological state of the person supporting an appropriate sensor whether or not the person is within the WCA 112.

In some embodiments, data quantifying a physiological state of a person may be stored within a Node or Tag supported by the person and transmitted via wireless communication once a Node or Tag is within wireless communication range of a Reference Point Transceiver 101-104. The Reference Point Transceivers 101-104 may include devices capable of wireless communication via a same modality as that utilized by the Agent-supported Transceiver 105. A radio frequency transceiver included in one or both of the Reference Point Transceivers 101-104 and the Agent-supported Transceiver 105 may therefore transmitters and receivers operative to communicate via wireless modalities that include, for example: Wi-Fi, Bluetooth, Ultra-wideband ("UWB"), ultrasonic, infrared, or other communication modality capable of logical communication between Transceivers 101-105.

In some embodiments, a Reference Point Transceiver 101-104 may include a multi-modality transceiver, that communicates more locally via a first modality, such as Ultrawideband ("UWB"), Bluetooth, Wi-Fi, ANT, Zigbee, BLE, Z Wave, 6LoWPAN, Thread, Wi-Fi, Wi-Fi-ah, NFC (near field communications), Dash 7, Wireless HART or similar modality; and to a greater distance via a second modality, such as a cellular communication modality (e.g. 3G, 4G, 5G and the like), sub GHz modality, Internet Protocol modalities and the like which may provide access to a distributed network, such as the Internet. Other modalities are also within the scope for the present invention.

Wireless communications between Transceivers 101-105 may engage in logical communications to provide data capable of generating one or more of: Cartesian coordinates, polar coordinates, vector values, AoA, AoD, RTT, RSS, a GPS position, or other data that may be utilized for one or more of: locating one or both of an Agent 100; indicating a direction of interest; and identify a defined area 106.

A precise location may be determined via logical processes, such as triangulation; trilateration; and/or angle phase change; based upon timing values or other mechanism to generate a distance from one or more antennas in the multiple Reference Point Transceivers 101-104 to one or more antennas in an Agent-supported Transceiver (s) 105.

For example, a radio transmission or light transmission be measured and compared from three Reference Point Transceivers 101-103. Measurement may include, one more of: a timing value, a received transmission strength, received transmission amplitude, and received transmission quality.

Other embodiments may include a device recognizable via image analysis via a sensor, LiDAR, Image Capture Device, CCD device, and the like which may capture an image of three or more recognizable features. Image analysis may identify three or more of the recognizable features and a size ratio of the respective image captured recognizable features may be utilized to calculate a distance from each and thereby a position of the Agent 100. Similarly, a height designation may be made via triangulation using the position identifiers as reference to a known height or a reference height.

A plurality of modalities may allow for increased accuracy because each modality may have a different degree of reliability. For example, a Smart Device may measure the timing signal transmitted by a Wi-Fi router within a different error tolerance than it may measure the receipt into a photodetector of infrared laser light. This has at least two principle benefits. First, the location calculation may, in some embodiments, be a weighted average of the location calculated from each modality. Second, outliers may be shed. For example, if the standard location calculation comprises a weighted average of the location as calculated by five modalities, but one modality yields a location greater than two standard deviations from the average computed location, then that modality may not be considered for future weighted location calculations.

Additionally, the radio transmitters and/or transceiver in the Smart Device may comprise multiple antennas that transmit signals in a staggered fashion to reduce noise. By way of non-limiting example, if there are three antennas, then they may transmit a signal in intervals of 20 milliseconds. Given this rate of transmission, a detected time of arrival may be used to determine the distance between the transmitter and the antenna (i.e., the Smart Device). Moreover, the antennas may comprise varying lengths to accommodate desirable wavelengths. Further, dead reckoning may be used to measure location, using traditional methods of numerical integration.

A precise location may be determined based upon wireless transmissions between Nodes, such as between an Smart Device and the Reference Position Transceivers. Timing determinations—as well as signal qualities like angle of arrival, angle of departure, transmission strength, transmission noise, and transmission interruptions—may be considered in generating relative positions of Nodes. Additional considerations may include AI and unstructured queries of transmissions between Nodes and triangulation logic based upon a measured distance from three or more Reference Position Transceivers 101-104. For example, a radio transmission or light emission may be measured, and timing associated with the radio transmission or light to determine a distance between Nodes. Distances from three Reference Position Transceivers 101-103 may be used to generate a position of a Node in consideration. Other methodologies include determination of a distance from one or more Nodes and a respective angle of arrival and/or angle of departure of a radio or light transmission between the Node in consideration and another Node (Reference Point Node or dynamic position Node).

Other embodiments may include a device recognizable via analysis of an image from an Image Capture Device which may include a sensor, LiDAR, CCD device or MOS device camera. The Image Capture Device may capture an image of three or more recognizable features which may in an example occupy positions of Reference Position Transceivers. Image analysis may recognize the identification of each of three or more of the recognizable features and a size ratio of the respective image-captured recognizable features (compared, in some embodiments, to a known absolute size of the subject) may be utilized to calculate a precise position. Similarly, a height designation may be made via triangulation using the position identifiers as reference to a known height or a reference height. Discernment of a physical artifact may, for example, be based upon topographical renditions of physical aspects included in the Structure, such as those measured using LIDAR, a magnetic force, image data (or a point cloud derived from image data). A pattern on a surface may convey a reference point by a recognizable pattern (which may be unique to the setting), Vernier or three-dimensional structure as non-limiting examples. A Smart Device ascertaining a physical reference mark and a distance of the Smart Device to the mark may determine a relative location in space to a coordinate system of the marks.

In some embodiments of the invention, position determination in a Cold Storage Facility or on the Property contemplates determination of a geospatial location using triangulation, trilateration, or multilateration techniques. In some embodiments, a geospatial location relative to one or more known reference points is generated. The geospatial location in space may be referred to as having an X,Y position indicating a planar designation (e.g. a position on a flat floor), and a Z position (e.g. a level within a Structure, such as a second floor) may be generated based upon indicators of distance from reference points. Indicators of distance may include a comparison of timing signals received from wireless references. A geospatial location may be generated relative to the reference points. In some embodiments, a geospatial location with reference to a larger geographic area is associated with the reference points, however, in many embodiments, a controller will generate a geospatial location relative to the reference point(s) and it is not relevant where the position is located in relation to a greater geospatial area. In addition to these Cartesian coordinates, polar coordinates may be used, as further described below.

A geospatial location based upon triangulation may be generated based upon a controller receiving a measurement of angles between the position and known points at either end of a fixed baseline. A point of a geospatial location may be determined based upon generation of a triangle with one known side and two known angles. Referring again to FIG. 1, triangulation essentially includes determining an intersection of three distances 109-111, each distance 109-111 calculated from a reference point 101-104 to an Agent-supported device 105. The present invention allows for a first distance 109 to be determined based upon a wireless communication in a first modality; and a second distance 109 and a third distance 110 determined based upon a wireless communication in a same or different modality as the first modality. For example, a first distance 109 may be determined based upon a wireless communication using Wi-Fi; a second distance 110 may be determined based upon a wireless communication using Bluetooth; and a third distance 111 may be determined based upon a wireless communication using ultrasonic communication (other combinations of same and/or different communication modalities are also within the scope of the present invention).

A geospatial location based upon trilateration may be generated based upon a controller receiving wireless indicators of distance and geometry of geometric shapes, such as circles, spheres, triangles and the like.

A geospatial location based upon multilateration may be generated based on a controller receiving a measurement of a difference in distance to two reference positions, each reference position being associated with a known location. Wireless signals may be available at one or more of: periodically, within determined timespans, and continually. The determination of the difference in distance between two reference positions provides multiple potential locations at the determined distance. A controller (such as one in the Smart Device) may be used to generate a plot of potential locations. In some embodiments, the potential determinations generally form a curve. Specific embodiments may generate a hyperbolic curve.

The controller may be programmed to execute code to locate a relatively exact position along a generated curve, which is used to generate a geospatial location. The multilateration system thereby receives as input multiple measurements of distance to reference points, wherein a second measurement taken to a second set of stations (which may include one station of a first set of stations) is used to generate a second curve. A point of intersection of the first curve and the second curve is used to indicate a specific location.

In examples described thus far, a position of an agent or user may be determined as discussed. It may be equally possible for a transceiver to be associated with a package, storage element or other physical entity as shall be described further herein, utilizing the techniques as have been described relating to a user or agent.

In exemplary embodiments, as described herein, the distances may be triangulated based on measurements of UWB, Wi-Fi or sub GHz strength at two points. Transceiver signals propagate outward as a wave, ideally according to an inverse square law. Ultimately, a crucial feature of the present invention relies on measuring relative distances between two points. In light of the speed of Wi-Fi waves and the real-time computations involved in orienteering; these computations need to be as computationally simple as possible. Thus, depending upon a specific application and mechanism for quantifying a condition or location, such as a measurement, various coordinate systems may be desirable. In particular, if the Smart Device moves only in a planar direction while the elevation is constant, or only at an angle relative to the ground, the computation is more simple.

Cartesian coordinates (including Cartesian coordinates generated relative to a GPS or other reference point), or any other coordinate system, may be used as data that may be utilized for one or more of: locating one or both of an Agent 100; indicating a direction of interest; and identifying a defined area 106. A radio transmitter may include a router or other Wi-Fi device. The radio transmitter may include transmissions via a Ultra-Wideband ("UWB") frequencies including, for example, frequencies above 500 MHz, 3.5-6.5 GHz or other frequencies usable with a UWB modality; on Wi-Fi frequencies (300 MHz-60 GHz), sub GHz frequencies or other modality. A light generator may distribute light at human-safe intensities and at virtually any frequency known in the art. Such frequencies may include, without limitation: infrared, ultraviolet, visible, or nonvisible light. Further, a light beacon may comprise a laser, which may transmit light at any of the aforementioned frequencies in a coherent beam.

One exemplary coordinate system includes a polar coordinate system. One example of a three-dimensional polar coordinate system is a spherical coordinate system. A spherical coordinate system typically comprises three coordinates: a radial coordinate, a polar angle, and an azimuthal angle (r, $\theta$, and $\varphi$, respectively, though $\theta$ and $\varphi$ are occasionally swapped conventionally).

By way of non-limiting example, suppose Point 1 is considered the origin for a spherical coordinate system (i.e., the point (0, 0, 0)). Each Wi-Fi emitter e¬1, e2, e3 can be described as points (r1, $\theta$1, $\varphi$1), (r2, $\theta$2, $\varphi$2), and (r3, $\theta$3, $\varphi$3), respectively. Each of the ri's ($1<i<3$) represent the distance between the Wi-Fi emitter and the Wi-Fi receiver on the Smart Device.

It is understood that in some embodiments, an azimuth may include an angle, such as a horizontal angle determined in an arcuate manner from a reference plane or other base direction line, such as an angle formed between a reference point or reference direction; and line (ray or vector) such as a ray or vector generated from or continuing to a Smart Device. In preferred embodiments, the ray or vector may be generally directed from a Reference Position Transceiver towards, and/or intersect one or more of: an item of interest; a point of interest; an architectural aspect (such as a wall, beam, header, corner, arch, doorway, window, etc.); an installed component that may act as a reference in an augmented virtual model (AVM) (such as, for example, an electrical outlet, a light fixture, a plumbing fixture, an architectural aspect; an item of equipment; an appliance; a multimedia device, etc.); another Reference Position Transceiver or other identifiable destination.

Accordingly, in some embodiments, a spherical coordinate system may include Reference Position Transceiver that is capable of determining an angle of departure of a location signal and a Transceiver that is capable of determining an angle of arrival of the location signal; one or both of which may be used to facilitate determination of an applicable azimuth.

According to various embodiments of the present invention, one or both of an angle of departure and an angle of arrival may therefore be registered by a Transceiver that is transmitting and/or receiving wireless signals (e.g. radio frequency, Bluetooth 5.1, sonic frequency, or light frequency).

In another, aspect, multiple timing signals that have been wirelessly communicated may be mathematically processed to increase an overall accuracy, such as, for example, combined into a weighted average, average, mean, weighted mean. In situations with multiple timing signals communicated via different modalities a weighted average may be determined to be most beneficial. In some embodiments, conditions in an environment through which the wireless communication of values for variables enabling determination of a location of a Transceiver 105 may be quantified by sensors and the quantified conditions may be used to further ascertain a beneficial mathematical process. For example, if sensors indicate significant electrical interference in a particular bandwidth of the electromagnetic spectrum, such as a spectrum utilized by UWB and/or Bluetooth modalities, a mathematical process may give a higher weight to a value (for a variable useful in determining the position of a Transceiver 105) transmitted via an infrared modality which is not effected by the electrical interference. Likewise, if a sensor reading quantifies a significant amount of particulate or other interference in an atmosphere through which a wireless communication is transmitted, a lower mathematical weight may be allocated to an infrared transmission (or other light beam effected by particulate) value.

Also, processing may allow for outliers of values for variables useful in determining a location to be shed. For example, if a standard location calculation comprises a weighted average of multiple values for variable useful for determining a location, which may include values generated based upon wireless communication using multiple modalities, but a particular modality yields a location greater than two standard deviations from an average computed location, then that modality may not be considered a recalculation and/or in future weighted location calculations. Similarly, values generated using a single modality that fall outside a designated deviation (e.g. two standard deviations or three standard deviations) may be excluded from a value generated via mathematical processing (e.g. average, weighted average, mean, median, mode, etc.).

Additionally, the radio transmitters, receivers, and/or transceivers in a Tag, Node and/or Smart Device may include multiple antennas that transmit and/or receive electromagnetic transmissions. In some embodiments, the multiple antennas may transmit and/or receive in a staggered fashion suitable to reduce noise.

Additional considerations may include AI and unstructured queries of transmissions between Tags and triangulation logic based upon a measured distance from three or more Reference Point Transceivers 101-104. For example, a radio transmission or light emission may be measured, and timing associated with the radio transmission or light emission to determine a distance between disparate transceivers included in Tags, Nodes, Smart Devices and the like. Distances from three Reference Point Transceivers 101-103 may be used to generate a position of a Transceiver in consideration. Other methodologies include determination of a distance from one or more Transceiver and a respective angle of arrival and/or angle of departure of a radio or light transmission between the Node in consideration and another Transceiver (Reference Point Transceiver or dynamic position Transceiver, e.g. an Agent supported Tag or Node).

In some embodiments, locating an Agent occurs in or proximate to a Cold Storage Facility in which Reference Position Transceivers, (including, for example, one or more of: Wi-Fi Transceivers, UWB Transceivers, Bluetooth Transceivers, infrared Transceivers and ultrasonic Transceivers) may be located above and/or below an Employee. In these embodiments, a cylindrical coordinate system may be more appropriate. A cylindrical coordinate system typically comprises three coordinates: a radial coordinate, an angular coordinate, and an elevation (r, 0, and z, respectively). A cylindrical coordinate system may be desirable where, for example, all Wi-Fi emitters have the same elevation. Angles may be determined as described above.

In some embodiments of the present invention, sound waves may be used to perform one or more of: location determination, movement tracking in interior or exterior locations, and distance calculation from a position to an Employee, which may be accomplished based upon transmission and receipt of sonic transmission. Sound wave transmissions include several significant attributes, which may be beneficial for a given set of circumstances when used for radiofrequency-based location determination. According to the present invention, sonic waves may be deployed independently, or in combination with, transmissions and reception of logical communications utilizing other bandwidths, such as bandwidths associated with Wi-Fi, Bluetooth, ANT, infrared or almost any wavelength in the Industrial, Scientific and Medical bands (sometimes referred to as "ISM Bands"). Methods, devices, and apparatus for using sound waves in location determination may be found, for example, in U.S. Pat. No. 10,628,617, the contents of which are incorporated herein.

In certain embodiments of the invention, a direction of interest of an Agent or Smart Device may be determined. In some cases, a direction determination may be based upon a movement of a device. For example, a device with a controller and an accelerometer, such as mobile Smart Device, may include a user display that allows a direction to be indicated by movement of the device from a determined location acting as a base position towards an As Built feature in an extended position. In some implementations, the Smart Device may first determine a first position based upon triangulation with the reference points and a second position (extended position) also based upon triangulation with the reference points. These position determinations may proceed as described above. The process of determination of a position based upon triangulation with the reference points may be accomplished, for example via executable software interacting with the controller in the Smart Device, such as, for example via running an app on the Smart Device.

Figure 2:
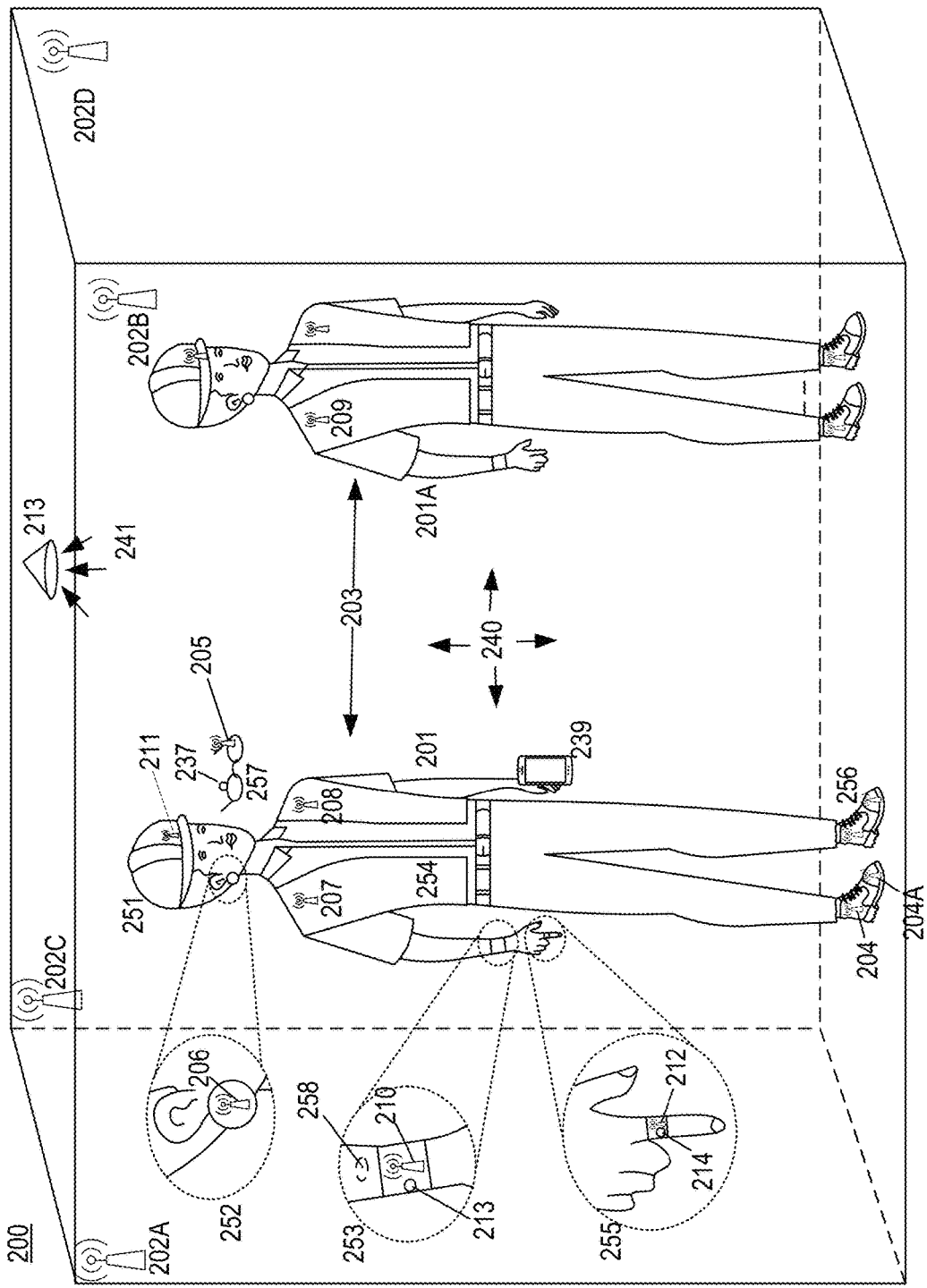
FIG. 2 illustrates a person with wearable wireless communication transceivers.

Fig. Fig. Referring now to FIG. 2, according to the present invention an Agent, such as a human person 201, supports one or more Transceivers 204-212 within a wireless communication area, such as an interior of a structure 200. In some examples, the structure may be a cold storage facility or an apparatus such as a cold storage truck that may have structure to it. The Agent supported Transceivers 204-212 may be operative to wirelessly communicate with Reference Point Transceivers 202A-D located within the structure 200. Information included in wireless communications between the Reference Point Transceivers and the Agent supported Transceivers 204-212 include values for variables that may be used to generate a position of the Agent supported Transceivers 204-212.

The Agent supported Transceivers 204-212 are co-located with the Agent resulting from being supported by the Agent, therefore a position of the person 201 may be designated as being the same as the position of one or more of the Agent supported Transceivers 204-212 or some mathematical correlation of the respective positions of the Agent supported Transceivers 204-212, such as for example: an average, a weighted average, a mean, a median, other function or algorithm involving the respective positions of two or more to the Agent supported Transceivers 204-212.

In some embodiments, a person 201 (or other Agent or mammal) will support two or more Transceivers 204-212 and each of the Agent supported Transceivers 204-212 will enter into communication with the Reference Point Transceivers 202A-D in a manner conducive to generating a respective position of the two or more Agent supported Transceivers 204-212 supported by the person 201. A directional vector and/or ray may be calculated based upon respective positions of two or more of the Agent supported Transceivers 204-212 supported by the person 201. The directional vector and/or ray may be used, for example, to designate a forward facing position of the person 201 or a direction of interest associated with the person 201. For example (and discussed in more detail below) headgear 251 may include multiple headgear mounted transceivers 211, such as a transceiver 211 along a front portion of a headgear (front brim or front headband portion or front of eyeglasses) and a second headgear transceiver along a rear portion of the headgear (not shown in FIG. 2) a directional vector and/or ray may be generated from the position of the transceiver along a rear portion of the headgear through a front portion of the headgear (defined by the position of the front portion headgear transceiver 211) and a frontward facing direction (and/or a rearward or sideways facing direction) may be designated based upon the directional vector/ray. The directional vector/ray may be used to determine if the agent was facing in a direction of a item stored in the cold storage.

Other wearable items 252-257 or subcutaneously implanted items, which may also be considered a wearable item 258, may also include Transceivers 204-212, such as those supported at areas of the person 201 other than the person's head. By way of example, Transceivers 204-212 may be attached to, incorporated into, mounted on, held by, or otherwise supported by items wearable by a person 201 or items that may be held in the person's hand.

A subcutaneously implanted item, such as wearable item 258 may include sensors of various kinds to measure physiological measurements as well as communication and identification devices. A subcutaneously implanted item may have an outer casing consistent with insertion under the skin such as, in a non-limiting sense, glass or hydrogels. The implant may measure temperatures, pressures, electrical signals and the like. In some examples, the subcutaneously implanted item may include antennas for the reception of signals and energy. The subcutaneously implanted item may be paired with other devices such as transponders and sensors to provide sensed measurements, location and orientation information. For purposes of discussion, some examples of subcutaneously implanted sensors and devices may be classified as a type of wearable item in the discussion herein.

The present invention additionally provides for Sensors 204-212 (with additional sensors illustrated and discussed in subsequent figures) that are supported by the person 201 or located within the structure 200. The sensors quantify a condition within the structure 200. For example, the condition may be a physical state present in the structure or a physiological state present in the person 201.

In some preferred embodiments, Sensors may be placed on an inner surface of a wearable item such the sensor has access to a skin surface on the person 201. Access to a skin surface may allow, or improve quantification of a physiological condition (sometimes referred to herein as a Biometric). For example, access to a skin surface may allow for electronic quantification of a body temperature, a heart rate, a blood oxygen level, a blood sugar level, blood pressure, intracranial pressure and other conditions present and quantifiable via electronic sensors supported by the person 201.

In other embodiments, a structure sensor 213 may be positioned, such as mounted on an architectural aspect or equipment item, and receive energy from an environment around the sensor in a manner that allows the structure sensor 213 to quantify a condition within the environment. For example, a structure sensor 213 may receive environmental input 241 such as infrared energy into the sensor and based upon the receipt of environmental input 241, such as for example infrared energy, the structural sensor 213 may quantify surface temperatures of items within the structure 200. The items within the structure may include person(2) and the structural sensor may quantify a respective surface temperature of each person 201-201A. If a structural sensor 213 is positioned to receive environmental input, such as infrared energy 241 from a known area, the position of a person 201-201A may be determined via wireless communications (as discussed herein) and a quantified temperature may be correlated to a particular person based upon the location of the person 201-201A and the known area monitored and quantified by the structural sensor 213.

In another aspect, a location of Agent supported Transceivers 204-212 may be determined via wireless communications with Reference Point Transceivers 202A-D and used to designate a forward facing direction of a person 201 at a particular instance in time. Therefore, one or more of: triangulation, trilateration and determination of an angle of transceiving may be used to designate a forward facing position. For example, an AoD and/or AoA may be used to designate a frontward facing direction (or rearward, sideways facing direction) at a particular instance in time (and/or timeframe) while triangulation is used to generate a geospatial position during the same timeframe (or an overlapping timeframe).

As illustrated in FIG. 2, as well as in FIGS. 2A-2F, according to some embodiments of the present invention, sensors 214-236 are also placed in and/or on a wearable item 251-258. The sensors may quantify a condition in an environment that is ambient to the person 201 or quantify a condition experienced by the person 201. For example, a sensor worn in a wrist strap 253 type item, such as a watch or a compressive band or other type wrist strap 253 may include one or more sensor(s) that quantify a condition experienced by the person 201 by measuring physiological conditions experienced by the person, such as, for example: a body temperature, a heart rate, a skin temperature, shaking, falling, impact, vibration, acceleration, deceleration, remaining stationary, appendage movement, head movement, eye movement, and the like.

Sensors in other wearable items, may quantify similar or variant conditions. For example, an accelerometer or piezo device in a footwear 256 may quantify steps. A Transceiver in a ring 212 may quantify hand movement, such as a natural swing movement during walking or running, a rotational movement while operating a steering wheel, a vertical movement while lifting or climbing a ladder, etc., and in some embodiments may work in correlation with an image capture device, such as stereoscopic cameras in a head gear 251 to quantify hand and finger movements that may be processed and translated into control commands.

An eye covering 257 type item supported by the person may include, for example, eye glasses, goggles, an augmented reality (A/R) headset, a virtual reality (V/R) headset, facemask or other item that is generally placed in position in front of a person's 201 eyes may include one or multiple transceivers 205 that may transceive to help determine a position of the person 201 wearing the eye covering 257. The one or multiple transceivers 205 may also transceive in a manner that allows for determination of a forward direction of the eye covering 257 such that a designation of a direction the person 201 is facing may be correlated with the forward direction of the eye covering 257. The forward direction of the eye covering may be determined according to the methods and devices discussed herein for determining a direction, such as a direction of interest.

In another aspect, one or more sensors 237 mounted on the eye covering 257 may monitor and quantify eye movement and a direction of eye focus. A direction of eye focus quantified by the sensor 237 may assist in determining one or more of: a forward facing direction, what the eye is focused on, whether the person 201 is looking down or up, nystagmus movement or other health and/or performance condition.

As discussed above, Transceivers 212-236 may be mounted on a wearable item 251-258 such that as a wearable items with one or more Transceivers 212-236 and a Transceiver 204-212 may quantify a condition experienced by the person 201 wearing the wearable item 251-258. A condition experienced by the person may include one or more physiological state(s) of the person 201, such as, for example, a heartrate, a body temperature, a breathing rate, breathing pause, eye movement, body conductivity, body capacitance, or other biophysical and/or biochemical state or condition.

Sensors incorporated into a wearable item may therefore provide quantification of bodily conditions present in the wearer. The quantified body conditions may be transmitted via a wireless communication to a processor that is operative to identify a bodily condition. For example, the processor may check to ascertain if a quantified body condition is within thresholds determined to indicate a healthy condition of the body; or if the quantified body condition indicates a transitory state that may ultimately result in an unhealthy state; or if the quantified body condition indicates a present state of a human body that is in an unhealthy state.

As further discussed herein, a condition quantified by a sensor may precede execution of a remedial action based upon a value of a variable used to represent the condition quantified by the sensor. In those embodiments that include a body condition being quantified by a sensor worn in a wearable item 251-258 by a person 201, a remedial action may include, by way of non-limiting, one or more of: alerting the person 201 wearing the wearable item 251-258. An alert to the person 201 wearing the wearable item 251-258 may include, for example, a human audible alert, a kinetic action, such as a vibration or TENS (Transcutaneous electrical nerve stimulation), a visual indication (such as a light), or activation of another device perceptible by the person 201. An alert may also be generated that is communicated to a person other than the person 201 wearing the wearable item 251-258, or a server, processor, controller or other automation. For example, a supervisor in a processing plant may receive one or both of an email and a text message indicating that a person 201 wearing a wearable item 251-258 and working in the processing plant has a body temperature that exceeds 100° F. and an elevated heartrate. The supervisor may recognize that a fever and elevated heartrate may be indicative of a viral infection and therefore contact the person 201 wearing the wearable item 251-258 and direct the person 201 to be further assessed. In addition, because the person will also be associated with wireless position tracking via a transceiver included in a wearable wrist band, the present invention may determine where the person 201 has moved about while the person 201 has generated an indication of a fever, e.g. an elevated body temperature. Moreover, a position of a first person 201 may be determined relative to a position of a second person 201A during one or more time intervals. Additional remedial actions may be implemented if the first person 201 has been located at a position within a threshold distance 240 from the second person 201A. For example, both the first person 201 and the second person 201A may be placed in quarantine until such time as it is determined that both the first person 201 and the second person 201A are free of viral infection. Alternatively, in some embodiments, a comparison of a first pattern of wireless positions indicative of a path travelled by a first person 201 and a second pattern of wireless positions indicative of a path travelled by a second person 201A may indicate that the second person 201A is not likely to contract a virus from the first person 201 because the second person 201A did not come within a distance 240 determined to be statistically favorable to transfer of the virus.

In some embodiments, Transceivers 212-236 may quantify almost any condition present in an area defined by a range of a Reference Point Transceiver 202A-202D communicating with a Transceivers 204-212 associated with a Transceivers 212-236. Embodiments will include an area of communication between the Transceiver 204-212 and the Reference Point Transceivers 202A-202D that includes an interior of a facility or other structure 200, and an area immediately surrounding the structure. As discussed above, a condition quantified by sensors within range of the Reference Point Transceivers 202A-202D may be a physiological state of a person 201. In addition, the condition quantified by sensors within range of the Reference Point Transceivers 202A-202D may include a condition in an environment within the area, such as an atmospheric environment and/or a condition in a structure 200 or an item of machinery.

As such, in some embodiments, a wearable item 251-258 that includes a wristband, headgear, vest, gown, footwear, or other capable of assessing a condition of a person 201 and an environment item, may include sensors 214-236 that quantify a condition present in the person 201 that wears the wearable item 251-258 or a condition ambient to the person 201 wearing the wearable item 251-258. Non-limiting examples of conditions ambient to a person include, temperature, humidity, visible light, IR light, UV light, other electromagnetic energy within a defined bandwidth, movement, vibration, impact, noise, motion or other quantifiable condition.

In some embodiments, one or more sensors 213 may be positioned other than as part of a wearable item 251-258. For example, a sensor 213 may be fixedly attached to a structure 200. The structural sensor 213 attached to the structure 200 may receive environmental input 241 descriptive of an environment surrounding a person 201-201A. The present invention is able to generate a position of a person 201-201A, quantify a condition in an environment 238 surrounding the person 201-201A, quantify a condition present as a physiological state of the person 201-201A at multiple instances in time and store each position and quantified condition. In addition, the present invention may generate a user interface indicating a present status of the above listed conditions, a chronology of states of conditions and positions, a summary (including mathematical analysis, such as average, mean, weighted average, median etc.).

The present invention may also provide a user interface or other human discernable device, such as a light, audio instruction, mechanical actuation, video, narrative or other communication medium to indicate what actions the controller deems to be appropriate based upon a particular set of conditions quantified by the sensors 214-236 and algorithmic analysis, such as unstructured queries and artificial intelligence. For example, for a viral contagion, such as, for example, COVID-19, a close contact may be defined as anyone or any tracked item that was within six feet of an infected person for at least 15 minutes starting from 48 hours before the person began feeling sick, if it is known that the virus propagates well in an environment with certain temperature and humidity conditions and does not propagate well in an environment with other temperature and humidity conditions, then the present invention may provide an interface indicating a first value for remedial action, such as a distance 240 between persons 201-201A to maintain, or what should be considered "close contact" based upon a first set of environmental conditions that are quantified, and a second value for what should be considered "close contact" for a second set of environmental conditions.

More specifically, if an exemplary virus propagates well in an environment of less than about 10° C. and in humidity of less than about 75%; and the same virus has limited propagation in environments of over 20° C. and atmospheric humidity of about 80% or more, then the present invention may provide an interface or other indicator of a distance 240 defining a first value for a "close contact" based upon a temperature and humidity of an environment in which a people are situated; e.g. a first value defining a distance 240 between persons 201-201A for close contact as 6 feet or less and a second value defining a distance 240 between persons 201-201A for close contact as 12 feet or less. A choice of the first value for clos contact and the second value for close contact will be contingent upon measured quantifications of a temperature and humidity of an environment 238 in which a person 201-201A is situated. Other quantified environmental conditions may become a factor upon which user interface values are based.

In addition to a suggested distance 240 to maintain between persons 201-201A, the present invention provides for sequential position determination for persons 201-201A based upon wireless communication (position based upon wireless communication is discussed in more detail herein). According to the present invention, wireless communication including values of variables capable of determining a position of a transceiver supported by an Agent, such as a person 201-201A is conducted on a periodic and/or episodic basis. Periodic basis includes a times period between wireless communications, such as every t seconds, or every minute, or every five minutes or other time period appropriate to the circumstances, such as a likelihood of movement and power consumption. A wireless communication based upon an episodic basis may include wireless communicating as a response to an event, such as movement detected by a lower powered device, such as accelerometers, solid state magnetic sensors, gimbals and the like, or other relatively low powered device that is capable of detecting movement. Other events may also precede a wireless communication, such as a detection of another person within a defined distance 240, a change in another variable, such as temperature, carbon dioxide level, inert gas level, oxygen level, presence of a chemical, or almost any other measurable quantity. Essentially, if a threshold level of a quantifiable condition is reached, an onboard controller is programmed to conduct wireless communication and calculation of a position of a transceiver conducting the wireless communication.

In another aspect, environmental conditions and person conditions may be measured by sensors included in wearable items worn by a person, or by sensors located in a position conducive to quantifying a condition of one or both of an environment 238 in which the person 201-201A is located and a position conducive to quantifying a condition inherent in the person 201-201A. For example, a sensor 213, such as an infrared (IR), thermistor, thermocouple, or other sensor type may receive environmental input 241 that the sensor 213 may use to quantify a condition, such as, a temperature of the environment 238 or a condition of a person 201-201A. The sensor 214-236 may be located in a wearable item 251-258, or a sensor 213 may be fixed or removably fixed, in a position in a structure 200. Either way a sensor 213-236 may be operative to quantify a temperature condition of a person 201-201A or an environment 240. A value generated by a sensor 213-236 may be stored and/or processed by a controller. Processing may include a mathematical combination of a sensor reading with other sensor readings. A sensor reading may include a sensor generated value of a variable. Combining of values of variables may include aggregating and mathematically processing the sensor generated values of variables.

As illustrated, a wearable item 251-258 may include, by way of non-limiting example, headgear 251, such as a hat, hardhat, headband, skull cap, cap, A/R headset, V/R headset, surgical cap, scrub cap; an earring 252; an wrist strap 253, including an arm band, a watch, a bracelet, or other item that may be positioned around an arm; a torso covering 254, such as a vest, lab coat, scrub; hazmat suit, smock; a ring 255, footwear 256, such as a shoe, boot, sandal, slipper, cleat, sneaker, or other article fitted to a foot. As illustrated, each of the wearable items illustrated 251-258 has a Transceivers 204-212 associated with it. The Transceivers 204-212 may be fixedly attached, removably attached or incorporated into the wearable item.

In some embodiments, a wearable item 251-258, such as for example a ring 255, an earring 252, or any of the other wearable items may include a transceiver that engages in low power, short distance communication, such as for example, one or more of: LPWAN, WhiskerRF, ANT, Near Field Communications (NFC), Zigby, Bluetooth Low Energy, or other low energy type communication. The wearable item may then communicate sensor data to a higher powered smart device 239, such as one or more of: a communications Tag, a Node, a Smart Phone, a Smart headset, a smart watch and the like, wherein the higher powered smart device 239 may engage in wireless communication with one or more Reference Point Transceivers 202A-202D to determine a position of a person 201-201A and also convey through the wireless communications some or all of the digital content generated by sensors 214-236 included with the wearable item 251-258.

For example, in some embodiments a higher powered smart device 239 may receive from the lower powered sensor multiple values of a variable quantifying a condition present in a structure 200, each value of the variable quantifying a condition present in the structure associated with a chronological time value. Variables, and values for variables will depend upon a type of sensor made operative to quantify a condition. Sensors may be chosen based upon which conditions will be quantified. Similarly, a transceiver 202A-213 may vary based upon an environment in which the transceiver will be deployed.

Sensors 214-236 may include an accelerometer to quantify motion (movement, acceleration); magnetic sensor, which may include magnetic field sensors, Hall Effect Sensors and/or Anisotropic Magneto-Resistive (AMR) sensors, magnetometer (3-axis); ambient temperature sensor; ambient light sensor; specific wavelength of light sensor; viii) ambient humidity; Magnet detector (maintenance button, "docked" indication, etc.); ix) sound pressure level (SPL); optical proximity sensor; power source such as a rechargeable lithium polymer battery; USB connector for charging and/or data transfer; NFC (near field communications) (tag or reader); Battery voltage sensing; audio alert, such as a Beeper; Vibrator; LED indicator(s); manual switch such as a tactile button; Inductive charging; vibration detection; air quality sensing such as CO2, VOC and the like; specific gas detection (CO, CO2, H2S, particulate); Gesture sensing (sense hand swipes over device); tap and double tap detection; Agent fall detection; freefall detection; shock and/or impact detection; IR (infrared) beacon TX and/or RX; pedometer; activity meter; processor enhanced audio monitoring (e.g. listen for fire alarm siren); heartrate monitor; blood oxygen sensing; OLED display; electronic ink display; and most any other electronic sensor of a quantifiable condition.

By way of non-limiting example Transceivers 202-212 may be operative to perform wireless communications suitable for real time location functionality and/or data transfer, transmitting and receiving capabilities using one or more modalities such as: UWB; Bluetooth, including BLE; WiFi RTT; infrared; ultrasonic; sonic; sub GHz; or other modality.

In some embodiments, communication between transceiver, such as those included in Tags, Nodes and/or Smart Devices may be achieved by a burst transmission protocol, such as low-power derivative of Gaussian pulses. In exemplary embodiments, the burst transmission protocol may transmit radio waves having a frequency of 3.0 GHz-11.0 GHz, with a high bandwidth of approximately 500 MHz-1.3 GHz. In some embodiments, the bandwidth may be based on a tolerance from an arithmetic central frequency; for example, if the central frequency for the burst transmissions is 6.0 GHz, then the bandwidth may be a relative tolerance, such as 20% of 6.0 GHz (i.e., 1.2 GHz). An interval between individual pulses may be uniform or variable, based on an implemented encoding scheme. In some exemplary embodiments, burst transmissions may lack carrier waves. Transceiving modalities that may be implemented using burst transmission protocol according to the present invention, include, ultra-wideband, sub-GHz, and industrial, scientific and medical ("ISM") radio bands within the frequency range of 6.7 MHz (megahertz) and 250 GHz.

In some exemplary embodiments, one or more pulses of wireless communication may be relatively short in duration (i.e., 0.01 ns-10 ns). The total pulse train may be written as the sum of individual, time-shifted pulses; i.e., $s(t) = \sum_{n=0}^{\infty} a\_n\, p(t-\tau\_n)$, where s(t) is the pulse train signal, p(t) is a characteristic pulse shape, an is the amplitude of the nth pulse, and τn is the time-offset of the nth pulse.

When two nodes exchange burst transmissions, they may be able to detect a range or distance between the two nodes. This may be accomplished through a "time of flight" (ToF) measurement. The ToF measurement may be made by or supplemented with a time difference of arrival (TDOA) or time delay estimation (TDE). TDOA may rely on a measurement of the amount of time it takes for a signal transmitted by one node to reach a plurality of other nodes. Using multilateration techniques, a location of the transmitting node may be estimated.

Figure 2A:
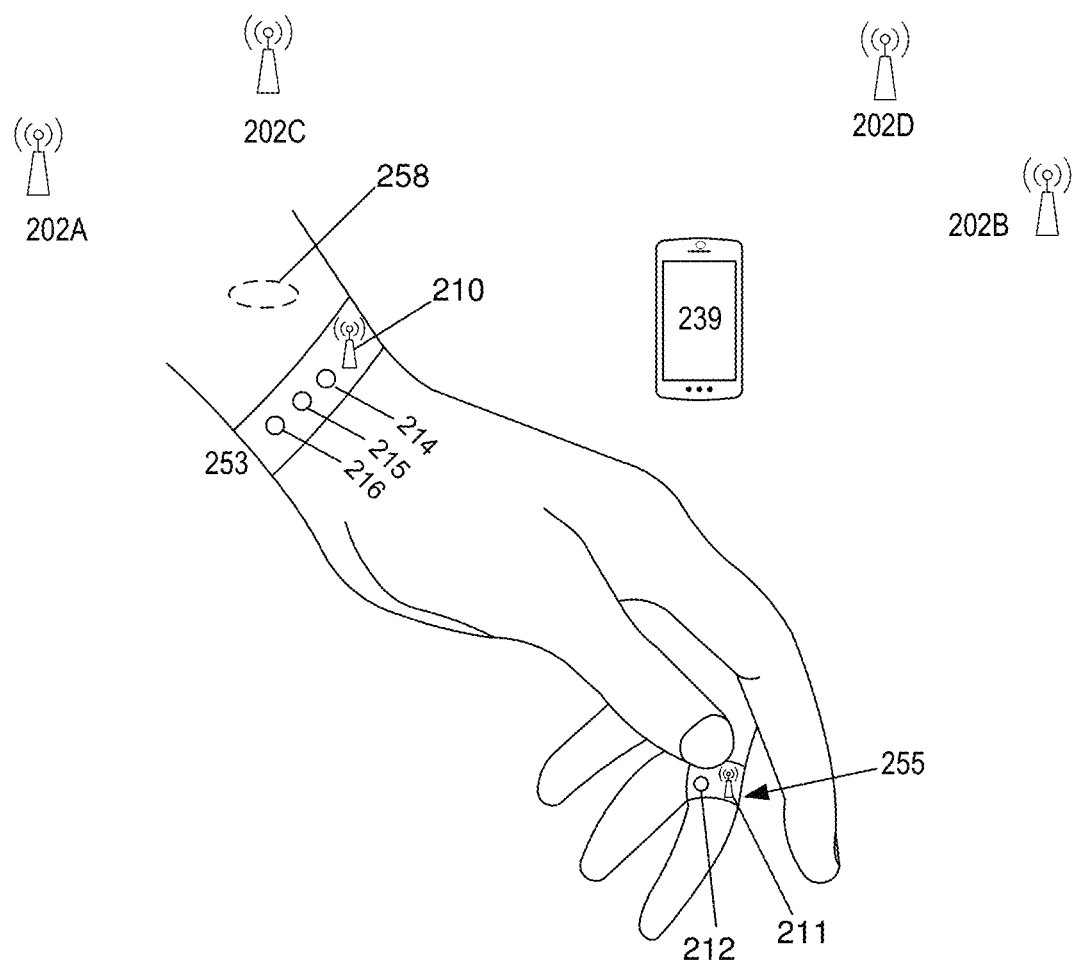
FIG. 2A illustrates wearable items with transceivers and sensors.
Figure 2B:
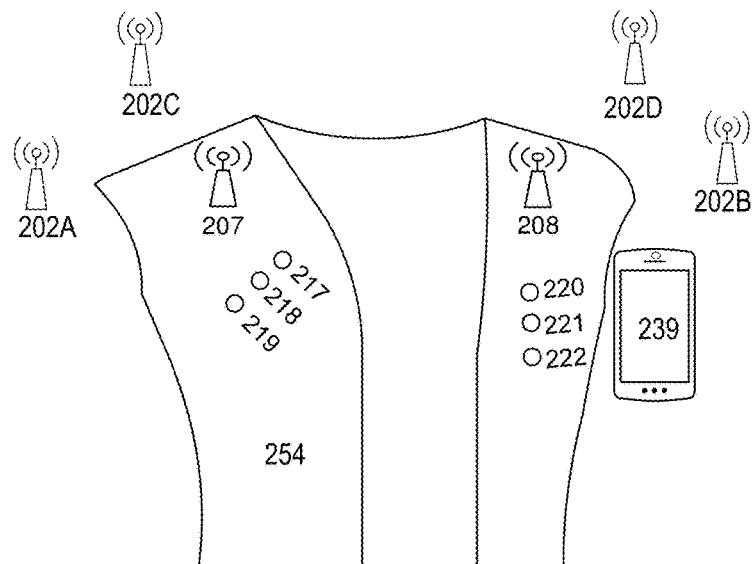
FIG. 2B illustrates a wearable item including vest type garment with transceivers and sensors
Figure 2C:
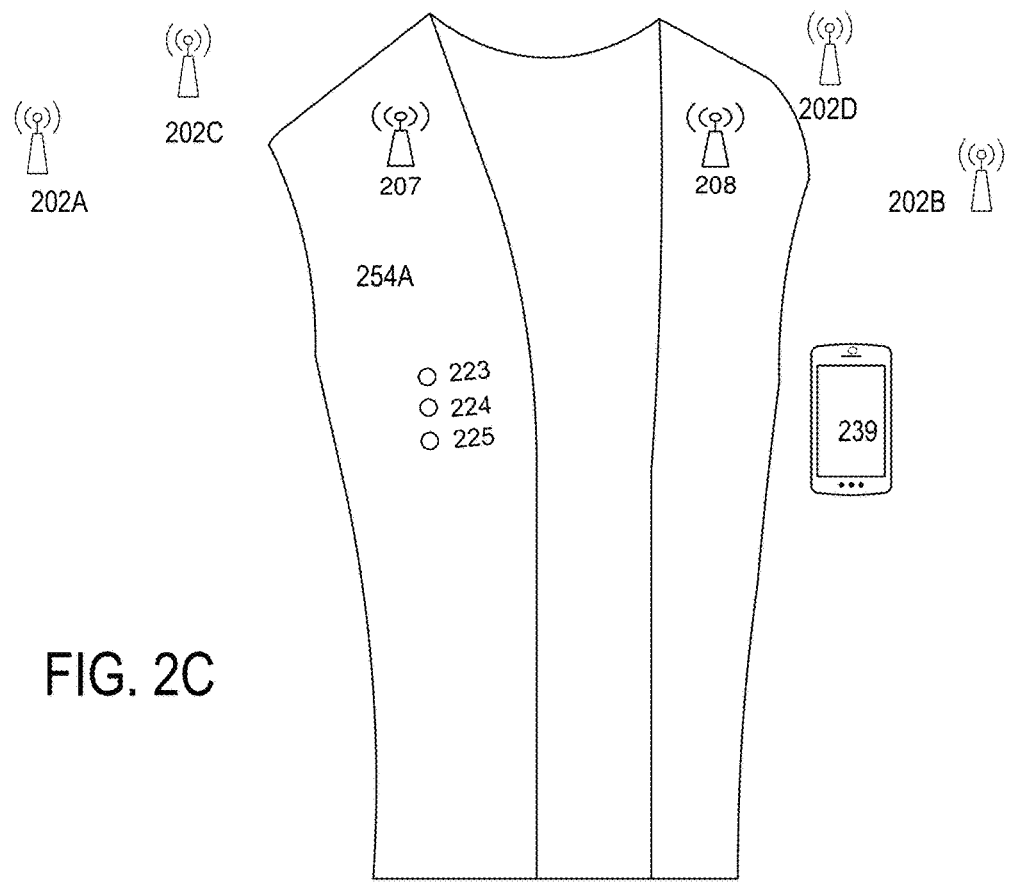
FIG. 2C illustrates a wearable item that is torso supported with transceivers and sensors.
Figure 2D:
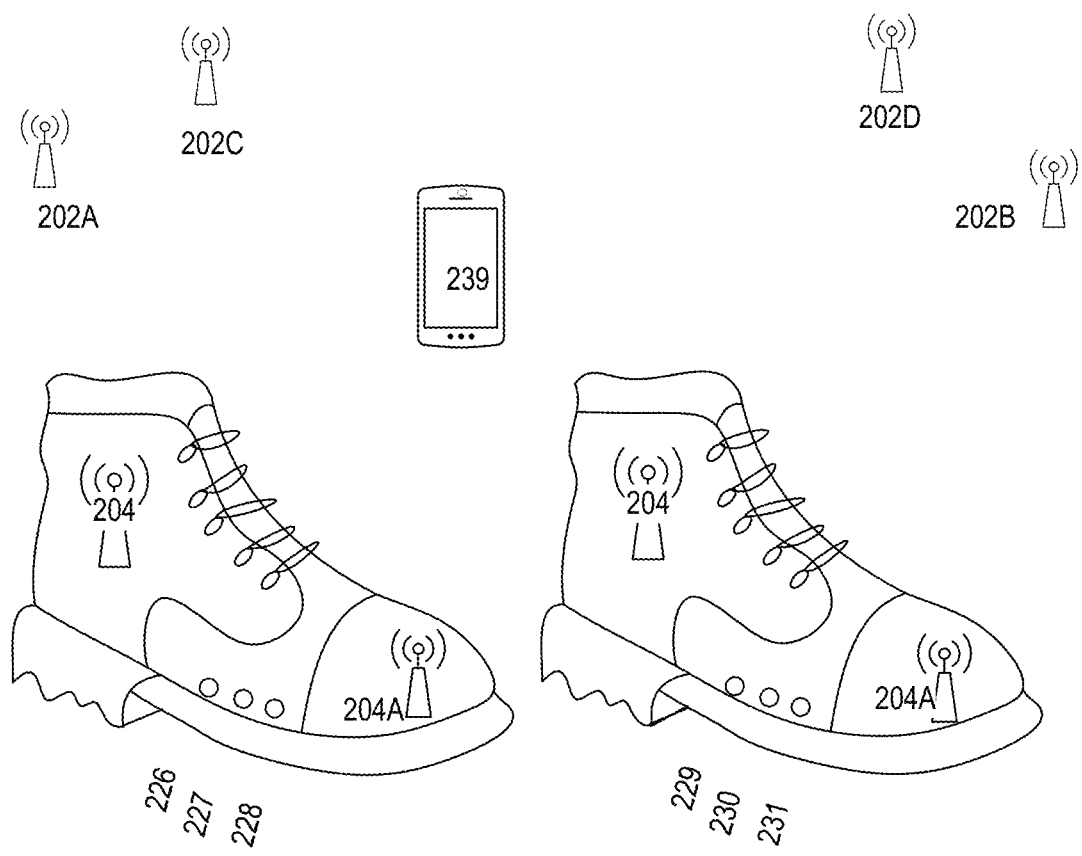
FIG. 2D illustrates wearable item including footwear with transceivers and sensors.
Figure 2E:
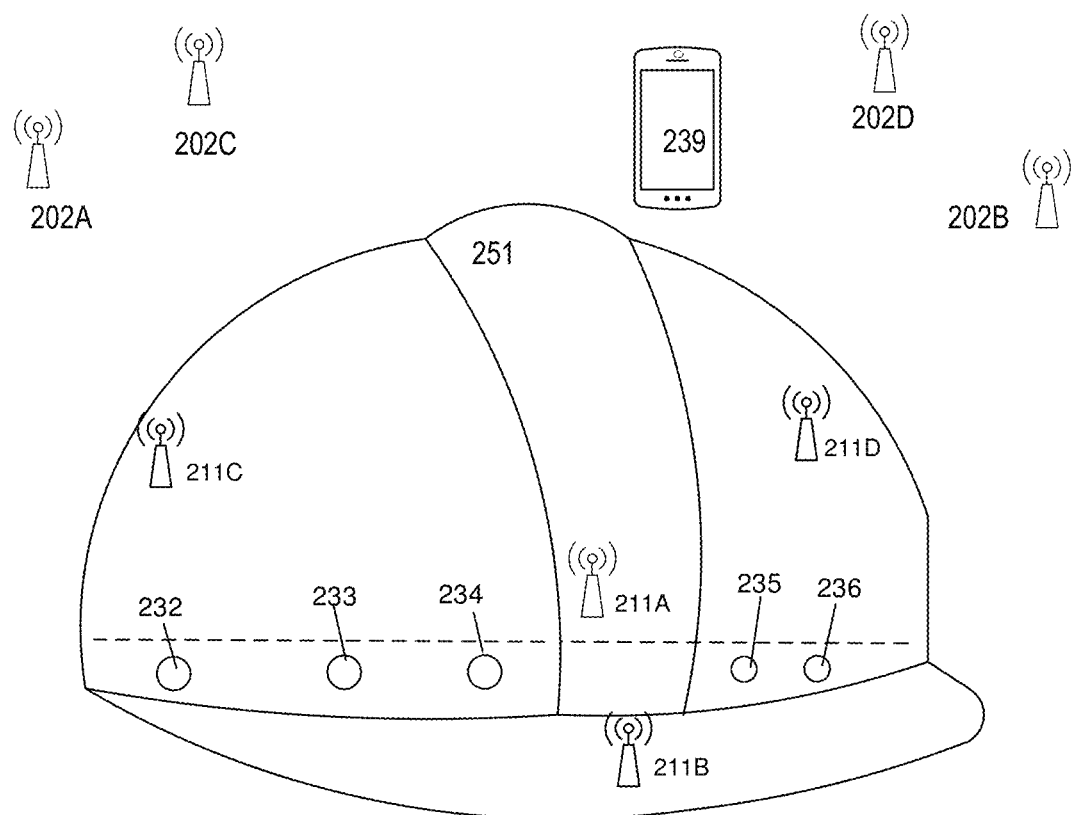
FIG. 2E illustrates a wearable item including headgear with transceivers and sensors.

Referring now to FIGS. 2A-2E, in various embodiments, a wearable item 251-256 may take appropriate forms adapted to be worn or otherwise supported by various parts of a human person 201-201A. For example, FIG. 2A illustrates an arm supported wearable item 253 which may be in the form of a wrist band or arm band or other item that is securable or otherwise supported on an arm of a human person. FIG. 2A also illustrates a finger supported wearable item 255 in the form a ring or other device securable upon a finger of a human person 201-201A. FIGS. 2B-2C illustrate torso supported wearable items 254-254A including a vest 254 and a lab coat 254A or other gown type apparel. FIG. 2D illustrates footwear 256 and FIG. 2E illustrates a wearable item in the form of a headgear 251.

Each wearable item 251-256 may include at least one wireless transceiver 204-212 and one or more sensors 213-236. As discussed herein, the wireless transceiver 204-212 may include a solid state components operable to transmit and/or receive wireless communications. The wireless communications may utilize any of the modalities discussed herein. The transceivers may wirelessly communicate with one or more Reference Point Transceivers 202A-202D and/or a smart device 239, such as a smart phone, smart tablet, smart headgear and the like. Wireless communications may include relatively higher powered and longer range modality, such as UWB, Bluetooth, WiFi, cellular or satellite communications and/or lower powered and shorter range communication modality, such as Zigby, ANT, BLE, or other low power protocol.

Those wearable items 251-256 that are capable of supporting more than one wireless transceiver may be operative to engage in wireless communications with Reference Point Transceivers 202A-202D and generate positional coordinates for each transceiver 204-212 (as illustrated wearable items 251, 254, 256 include multiple transceivers, but any wearable item with a large enough area may include multiple transceivers 204-212). Two or more sets of positional coordinates may be referenced to generate a direction of interest. In the present invention a direction of interest may include a direction a person 201-201A is facing. Accordingly, a headgear 251, a vest 254 and/or a shoe 256 may include multiple transceivers 211A-211D, 207-209 and 204-204A respectively for which corresponding positional coordinates may be generated based upon values of variables transceived according to the methods an apparatus described herein. The multiple positional coordinates may be used in turn to generate a direction of interest, such as, a forward facing direction. A forward facing direction may be important in certain safety situations, such as in the case of a contagion that may be spread by a cough, sneeze of exhale. It may be important to know a separation distance 203 between a first person 201 to a second person 201A in the forward direction. A separation distance 203 in a rearward direction may not have as short a critical distance.

In some embodiments, Sensors 213-236 are hardwired or otherwise in physical logical communication with connected to transceivers 204-212 included in a same wearable device. In physical logical communication may include, by way of non-limiting example, on a same printed circuit board (PCB); in a same semiconductor chip; connected by a circuit tracer or wired connection; or other physical logic pathway capable of conveying a digital value.

Transceivers 213-236 may be operative to engage in wireless communication with one or more of: Reference Point Transceivers 202A-202D; a smart device 239, such as a Smart Phone, Smart Tablet or Smart Headgear; a cellular network; a satellite network; a mesh network or other logical network.

Figure 2F:
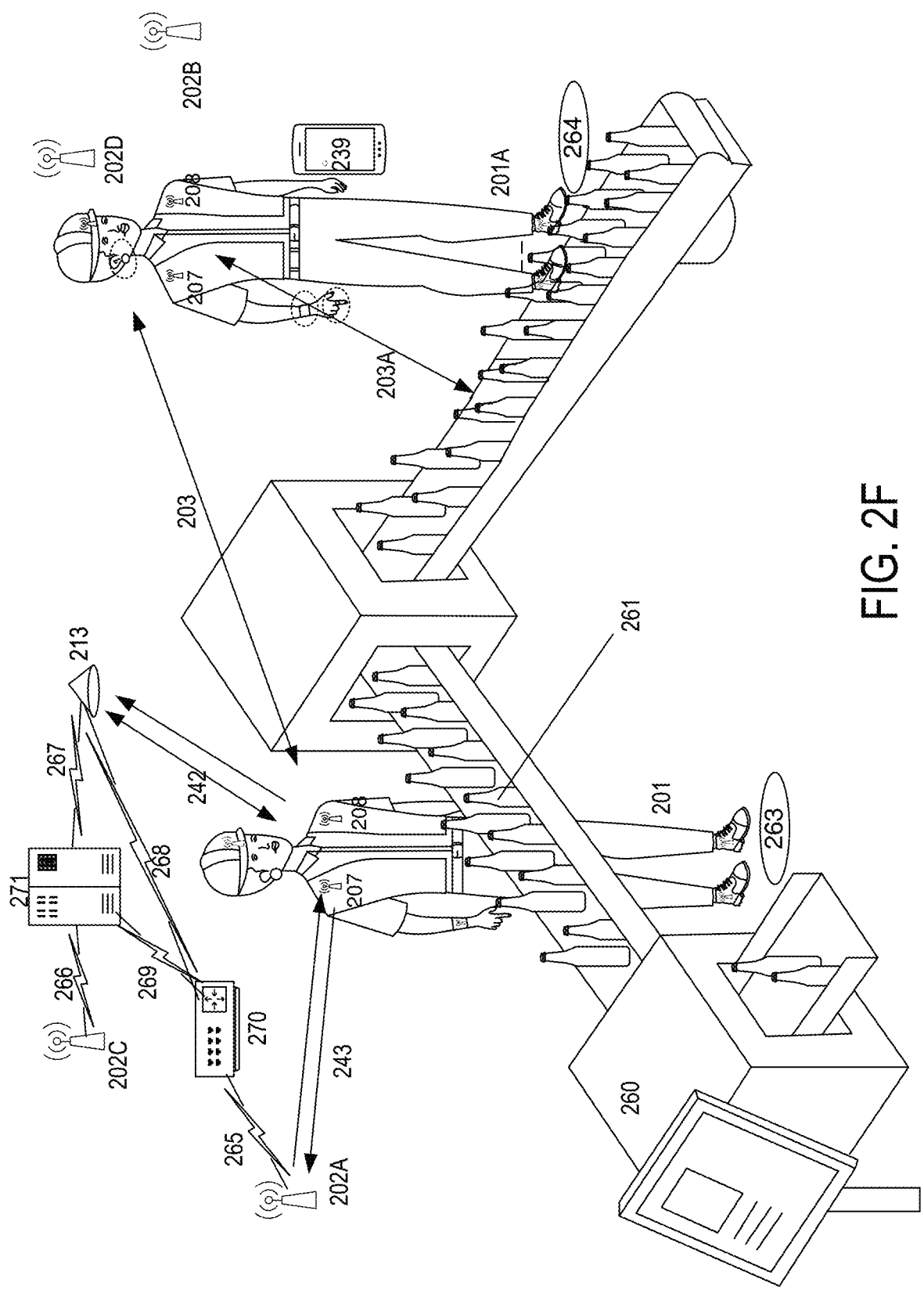
FIG. 2F illustrates a processing plant environment with persons and sensors and transceivers.

Referring now to FIG. 2F, a first person 201 and a second person 201A are illustrated in place to interact with processing equipment 260. Transceivers 207-208 may be supported by the persons 201-201A and engage in wireless communications 243 with one or more Reference Point Transceivers 202A-202D, and values for variables included in the wireless communications 243 may be used to generate location coordinates indicating a respective location 263-264 for the persons 201-201A. Respective locations 263-264 may be referenced to determine separation distance 203 between persons 201-201A and also a separation distance between a person 201A and an item of equipment 260 or other item surface, such as a surface of a product 261. For products such as food items or pharmaceuticals, contamination with a contagion may be particularly sensitive. Separation distance 203-203A may be used to determine a risk on contamination with a contagion. A length of time may also be determined based upon a sequence of wireless communications 243 at known time intervals, wherein the wireless communications are used to generate a location 263-264 of an Agent, such as a person 201-201A.

Ongoing determination of a location 263-264 of an Agent, such as a person 201-201A may also be used to ensure that the person 201-201A does not traverse and area designated as a contaminated area, such as a raw food area, or a chemically contaminated area, and then proceed to a controlled area, such as a non-contaminated area, such as an area with food or other product ready for distribution to the public.

Devices involved in the generation and/or storage and/or transmitting of digital content, such as, one or more of: agent supported transceivers 207-208, reference point transceivers 202A-202D, gateways 270, and servers 271 may each engage in direct logical communications and/or in logical communications with an intermediary device. For example, a reference point transceiver 202A-202D may engage in logical communication with a gateway 270 or other intermediary device and the gateway 270 may engage in logical communication 269 with a server 271; or the reference point transceiver 202A-202D may engage in logical communication 267 directly with the server 271. There may be numerous paths of logical communication 265-269 between various device types. In various embodiments of the present invention, any or all of the devices (e.g. sensors, transceivers, gateways, servers) involved in generation and/or storage and/or transmitting of digital content, may aggregate, store and or process digital content that the device has access to.

Also, variations on a location of a sensor and a transceiver are within the scope of the present invention. As discussed above, a Sensor 204-213 may be located on a wearable item 251-258 or a sensor 213 may be positioned at a point extraneous to a person 201-201A, such as mounted on an architectural aspect (such as, for example, a doorway, a hall entrance, a turnstile or other crowd movement control device; and receive sensor input 242 from a person 201 useful to quantify a condition of the person 201. Transceivers 207-208 may determine a location of a person 201-201A that correlates with a sensor 213 quantification of a condition present with the person 201-201A based upon input 242 received from the person 201-201A. Based upon a location 263 of a person 201, a processor (such as those present in a gateway 270, server 271 or smart device 239) which person is associated with a condition quantified by the sensor 213 mounted on an architectural aspect.

Some embodiments may also include a sensor 213 capable of receiving input 242 sufficient to quantify biometric based identification of the person 201, and/or a physiological state present in the person 201. For example, sensor 213 may receive input enabling facial recognition of the person 201 and correlate input from a sensor 204-213 to quantify a physiological condition and a facial recognition identification. Transceivers 207-208 may engage in wireless communications sufficient to determine a location 263 of the person 201 when the physiological condition and a facial recognition identification took place via other sensors than those co-located with the transceivers supported by the Agent.

Some modalities, such as those modalities that adhere to the Bluetooth 5.1 or BL5.1 standards, allow a Node to determine an angle of arrival (AoA) or an angle of departure (AoD) for a wireless transmission. An array of antennas may be used to measure aspects of the Bluetooth signaling that may be useful to calculate these AoA and AoD parameters. By calibrating an antenna system, the system may be used to determine angles in one or two dimensions depending on the design of the antenna. The result may be significant improvement in pinpointing the location of origin of a signal.

An array of antennas may be positioned relative to each other and a transmitting transceiver to allow for extraction of an AoA/AoD. Such an array may include a rectangular array; a polar or circular array; a linear array; and a patterned array, where a number of antennas are deployed in a pattern conducive to a particular environment for transceiving. Antennas may be separated by characterized distances from each other, and in some examples, a training protocol for the antenna array results in antenna positioning incorporating superior angle and location precision. Some transceivers may transceive in 2.4-2.482 GHz frequency bands, and thus the radiofrequency transmissions may have wavelengths in the roughly 125 mm length scale. A collection of antennas separated by significantly less than the wavelength may function by comparing a phase of RF transmissions arriving at the antennas. An accurate extraction of phase differences can yield a difference in path length that when accumulated can lead to a solution for the angles involved. In some embodiments, Nodes may include antenna arrays combined with batteries and circuitry to form complete self-contained devices. Antenna arrays and methods of using the same for determining position and direction of a Smart Device or other Node are described in U.S. Ser. No. 16/775,223, the contents of which are incorporated herein by reference.

Figure 3A:
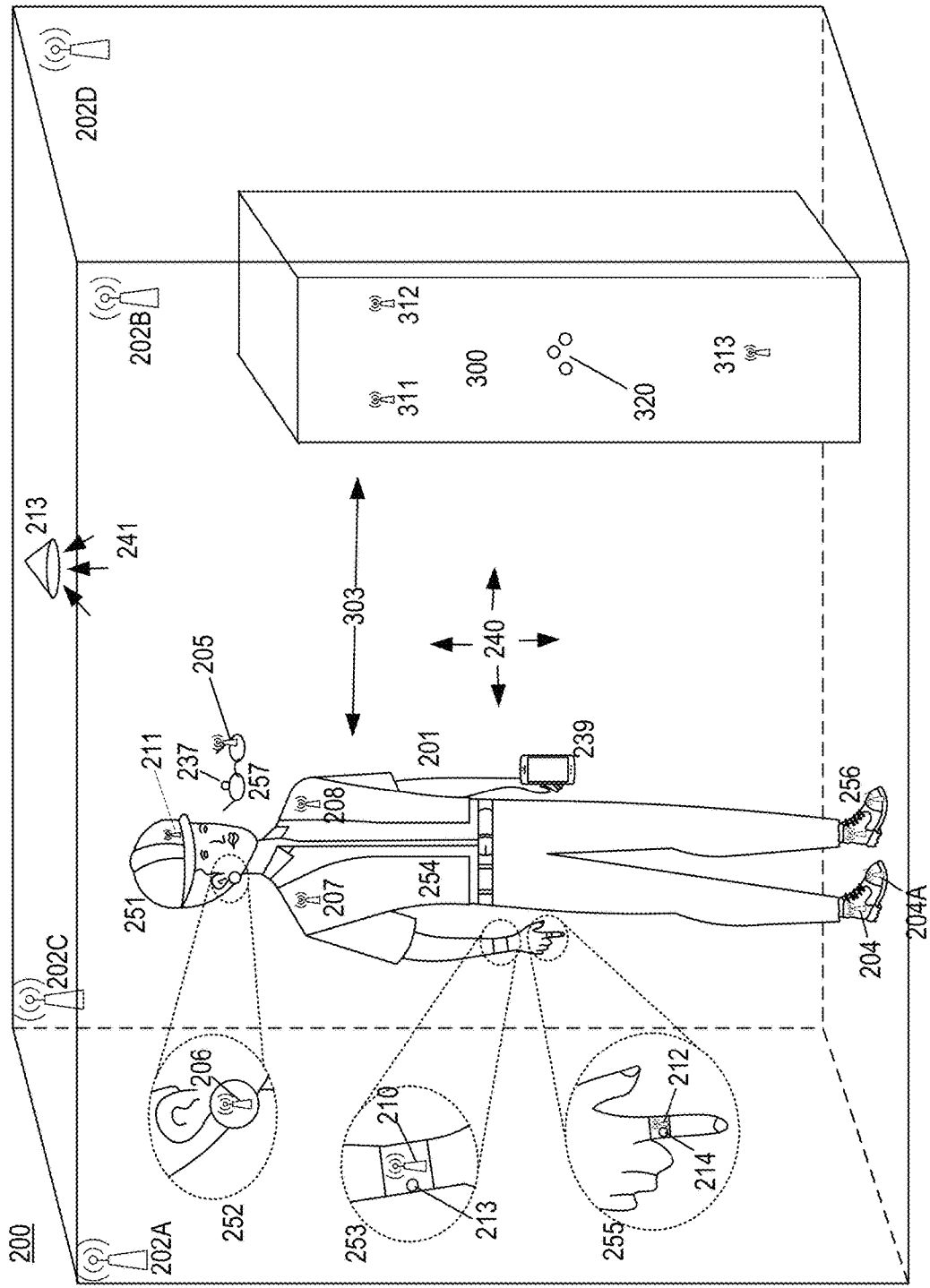
FIG. 3A illustrates an item in cold storage with mounted wireless communication transceivers.

Referring now to FIG. 3A, an example according to the present invention illustrates an Agent, such as a human person 201, supporting one or more Transceivers 204-212 within a wireless communication area, such as an interior of a structure 200. Many of the elements are similar to the elements of FIG. 2 and the referenced elements with numerals in the 200's having the same meaning. However, instead of using transceivers and sensors to characterize interactions between multiple agents, the example of FIG. 3A uses transceivers and sensors to characterize interactions between agents and physical items. For example, the physical item 300 may reside in a cold storage location. The physical item 300 may support one or more Transceivers 311-314 and one or more sensors 320. In manners described in various examples and embodiments herein, the transceivers 311-314 may be used to characterize the position and orientation of the physical item 300. The positions of three Transceivers of the example may be used to determine a plane representing the face of the physical item 300 and its location. Thus, communications may be used to store data from the transceivers and sensors of both the agent 201 and the physical item 300 which may be used to characterize the interaction between them such as in a non-limiting example the distance 303 separating them at given time points as well has whether they faced each other at the respective time points.

The recording of data representing the interactions between agents and items in cold storage could have numerous important functions. For example, the various sensors on the agent could store data relevant to the health status of the agent. The health status indicators can be coupled to the position and orientation information to indicate if it is likely that the agent came sufficiently close to an item in cold storage to effect it is some manners.

The physical item 300 in a cold storage location may also record ambient conditions such as temperature, particulate level and air pressures. Variations in the measurement of temperature may form a record that could be used to disposition the integrity of the physical item kept in cold storage. The sensor data may also be useful in determining likelihood of contamination events between the agent and the physical item. More generally, the sensors on the physical item 300 may record ambient condition data and communicate that with the controlling systems of the cold storage location. FIG. 3A represents interactions between agents and physical items, however, the sensing systems and the communications systems of the structure may interact with the physical item in the absence of any agents and may be used to record ambient conditions, variations and the like. The systems may also be used to adjust and regulate conditions within the cold storage structure.

Figure 3B:
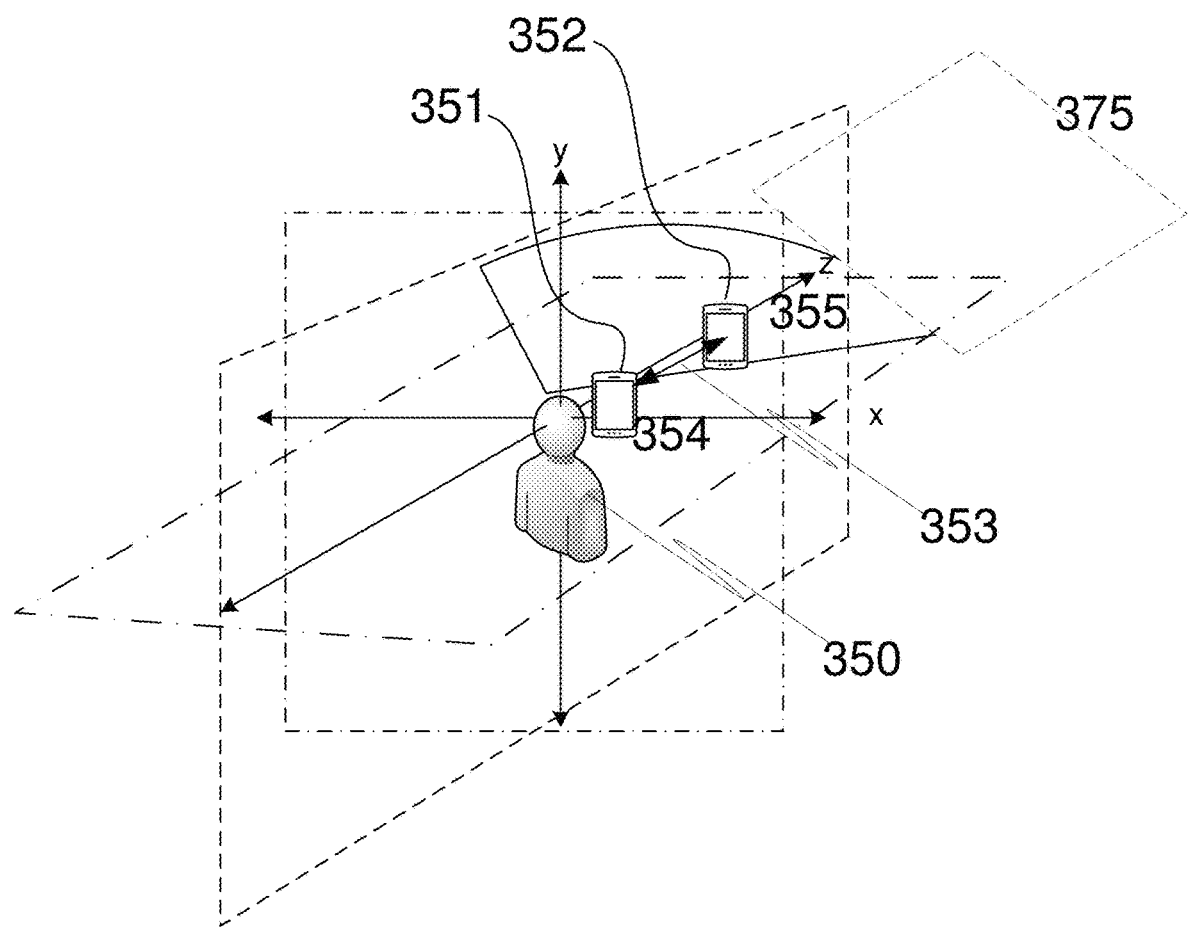
FIG. 3B illustrates methods of orienteering by device movement.

Referring now to FIG. 3B, methods and devices for determining a direction that may be referenced for one or both of data capture and data presentation of a particular portion of the virtual representation of surroundings of a user. An Agent 350 may position a Transceiver 355 in a first position 351 proximate to a portion in a space of interest 375. The first position 351 of the Transceiver 355 may be determined and recorded. The Agent 350 may then relocate the Transceiver 355 to a second position 352 in a general direction of the portion in space of interest. With associated position information obtained for the first and second positions a controller in an external system or in an associated Transceiver 355 may generate one or both of a ray and a vector towards the portion of a space of interest.

In some embodiments, the vector may have a length determined by a controller that is based upon a distance to a feature of interest in space as represented in a model on the controller in the direction of the generated vector. The vector may represent a distance 353 from the second position 352 to the space of interest 375 along the axis defined by a line between the first position 351 and the second position 352. In contrast, a ray may include just a starting point and a direction.

In still other embodiments, a device with a controller and an accelerometer, such as mobile phone, tablet or other Smart Device that includes a Transceiver 355, may include a user display that allows a direction to be indicated by movement of the device from a determined location acting as a base position towards an point in a direction of interest or representing a center of an RTA of the device. The movement may occur to a second location in an extended position. In some implementations, the Smart Device determines a first position 351 based upon triangulation with the reference points. The process of determination of a position based upon triangulation with the reference points may be accomplished, for example via executable software interacting with a controller in the Smart Device, such as, for example by running an app on the Transceiver 355.

An array of antennas positioned at a user reference point may allow for the accurate receipt of orientation information from a transmitter. As discussed earlier a combination devices with arrays of antennas may be used to calculation a position. A single Node with an array of antennas can be used for orienteering and determining a direction of interest. Each of the antennas in such an array receiving a signal from a source may have different phase aspects of the received signal at the antennas due to different distances that the emitted signal passes through. The phase differences can be turned into a computed angle that the source makes with the antenna array.

Referring to FIGS. 4A-D a series of exemplary devices employing matrices (or arrays) of antennas for use with Nodes that communicate wirelessly, such as via exemplary UWB, Sonic, Bluetooth, a Wi-Fi or other modality, is illustrated. Linear antenna arrays 401 are illustrated in FIG. 4A. Rectangular antenna arrays 402 are illustrated in FIG. 4B. Circular antenna arrays 403 are illustrated in FIG. 4C, other shapes for arrays are within the scope of the invention. In addition, an antenna array may be omni-directional or directional.

In some embodiments, see FIG. 4D item 404, a Smart Device 405 may include one or more Nodes 406 internal to the Smart Device 405 or fixedly attached or removably attached to the Smart Device 405. Each Node 406 may include antenna arrays combined with a power source and circuitry to form complete self-contained devices. The Nodes 406 or a controller may determine an RTT, time of arrival, AoA and/or AoD or other related angular determinations based upon values for variables involved in wireless communications. For example, a composite device 404 may be formed when a Node 406 with a configuration of antennas, such as the illustrated exemplary circular configuration of antennas 407, is attached to a Smart Device 405. The Node 406 attached to the Smart Device 405 may communicate information from and to the Smart Device 405 including calculated results received from or about another Node 406, such as a Node 406 fixed as a Reference Point Transceiver or a Node with dynamic locations, wherein the wireless communications are conducive to generation of data useful for determination of a position (e.g. timing data, angles of departure and/or arrival, amplitude, strength, phase change, etc.). A combination of angles from multiple fixed reference points to the antenna array can allow for a location of a user in space. However, with even a single wireless source able to communicate with the antenna array, it may be possible to determine a direction of interest or a device related field of view.

An array of antennas positioned at a reference point may allow for the accurate receipt of orientation information from a transmitter. As discussed earlier a combination devices with arrays of antennas may be used to calculation a position. A single Node with an array of antennas can be used for orienteering and determining a direction of interest. Each of the antennas in such an array receiving a signal from a source will have different phase aspects of the received signal at the antennas due to different distances that the emitted signal passes through. The phase differences can be turned into a computed angle that the source makes with the antenna array.

Figure 5:
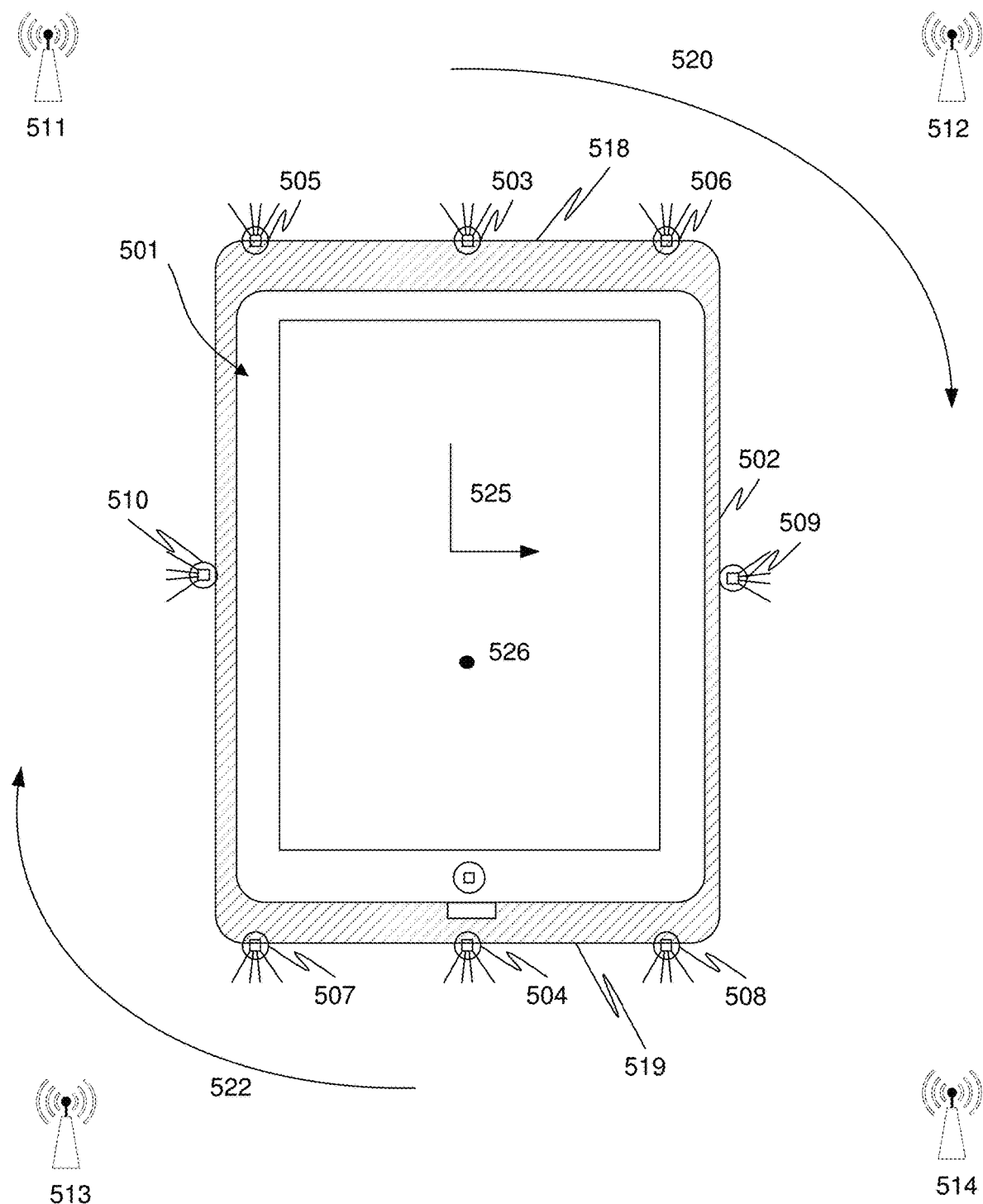
FIG. 5 is an illustration of a smart device in a smart receptacle according to an embodiment of the invention.

Referring now to FIG. 5, in some embodiments, one or both of a Smart Device 501 and a smart receptacle 502 housing Smart Device 501 may be rotated in a manner (such as, for example in a clockwise or counterclockwise movement 520-522 relative to a display screen) that repositions one or more wireless position devices 503-510 from a first position to a second position and moves a top edge 518 and a bottom edge 519 of the Smart Device 501. Multiple wireless Reference Position Transceivers 511-514 may support position determination. A vector 526 may be generated at an angle that is perpendicular 525 or some other designated angle in relation to the Smart Device 501. In some embodiments, an angle in relation to the Smart Device is perpendicular 525 and thereby viewable via a forward-looking camera on the Smart Device. An Agent may position the Smart Device 501 such that an object in a direction of interest is within in the camera view. The Smart Device may then be moved to reposition one or more of the wireless position devices 503-510 from a first position to a second position and thereby capture the direction of interest via a generation of a vector in the direction of interest.

Figure 6:
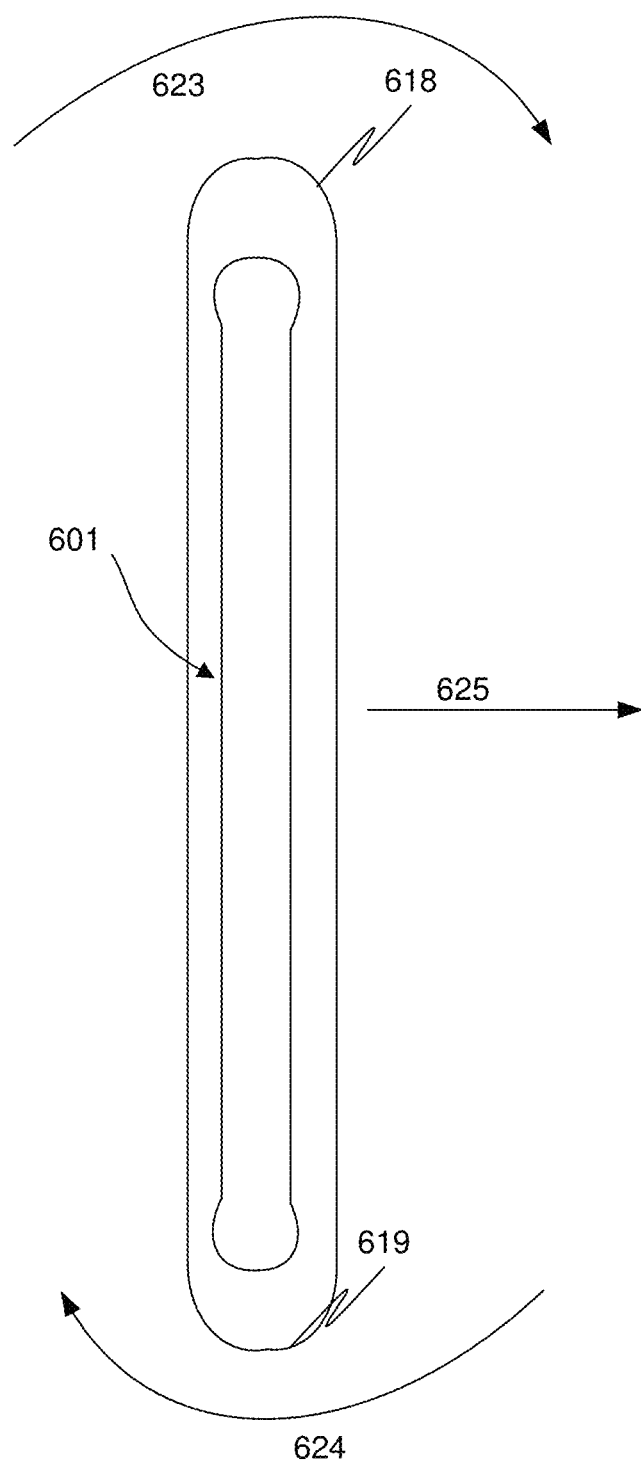
FIG. 6 is a side-view of a smart device in a smart receptacle that may be moved in a rocking motion according to an embodiment of the invention.

Referring now to FIG. 6, as illustrated, a vector 625 indicative of a direction of interest 625 may be based upon a rocking motion 623-624 of the Smart Device 601, such as a movement of an upper edge 618 in a forward arcuate movement 623. The lower edge 619 may also be moved in a complementary arcuate movement 624 or remain stationary. The movement of one or both the upper edge 618-619 also results in movement of one or more wireless position devices 603-610. The movement of the wireless position devices 603-610 will be a sufficient distance to register to geospatial positions based upon wireless transmissions. A required distance will be contingent upon a type of wireless transmission referenced to calculate the movement. For example, an infrared beam may require less distance than a Wi-Fi signal, and a Wi-Fi transmission may require less distance than a cell tower transmission which in turn may require less distance than a GPS signal. In some embodiments, as discussed further above, hybrid triangulation may include one or more distances based upon wireless transmissions of different bandwidths or modalities. For example, a first modality may include Wi-Fi transmissions and a second modality may include Bluetooth transmissions, still another modality may include infrared or ultrasonic modalities.

Figure 7:
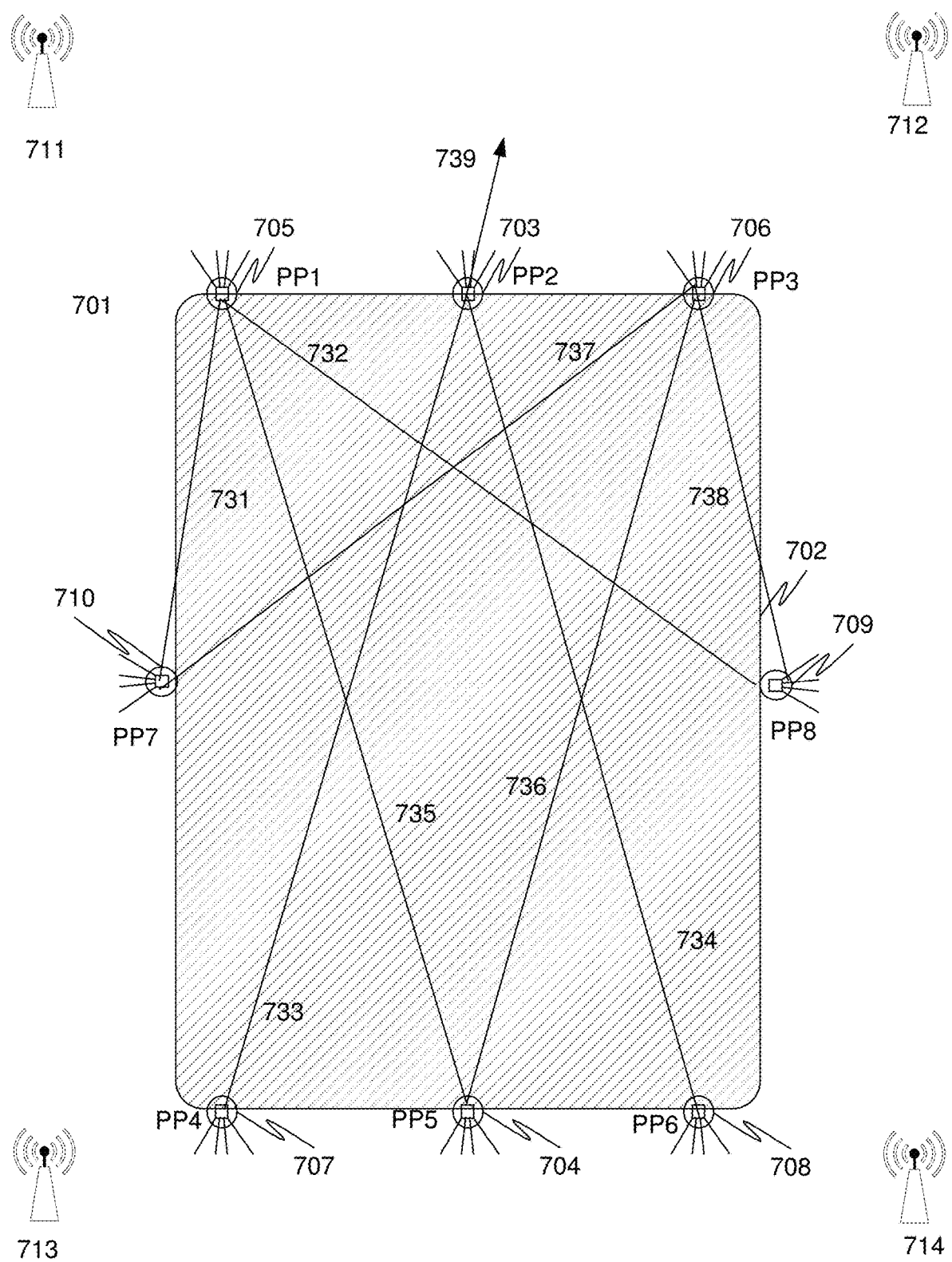
FIG. 7 illustrates line segments that intersect various position points in a smart receptacle according to an embodiment of the invention.

Referring to FIG. 7, line segments 731-738 are illustrated that intersect various generated position points (PP1-PP8)

for Transceivers 703-710. A Smart Device 701 is illustrated with the array or collection of transceivers 703-710 arrayed along the edges 702 of the device. Position points PP1-PP8 may be generated according to the methods and apparatus presented herein, including a mathematical average, median, or other calculation of multiple positions determined via triangulation techniques. In addition, a vector 739 or ray may be generated based upon one or more of the lines 731-738. Wireless position transponders 711-713 may communicate with various devices. In some embodiments, position points may be recorded and sampled in high numbers based upon thousands of logical communications per second and a virtual representation of the position points PP1-PP8 may be generated based upon the recorded position points PP1-PP8. Some embodiments may also include a point cloud type representation a device that comprises the transceivers used to record position point PP1-PP8, wherein the point cloud representation is based upon the multiple positions calculated.

Figure 8:
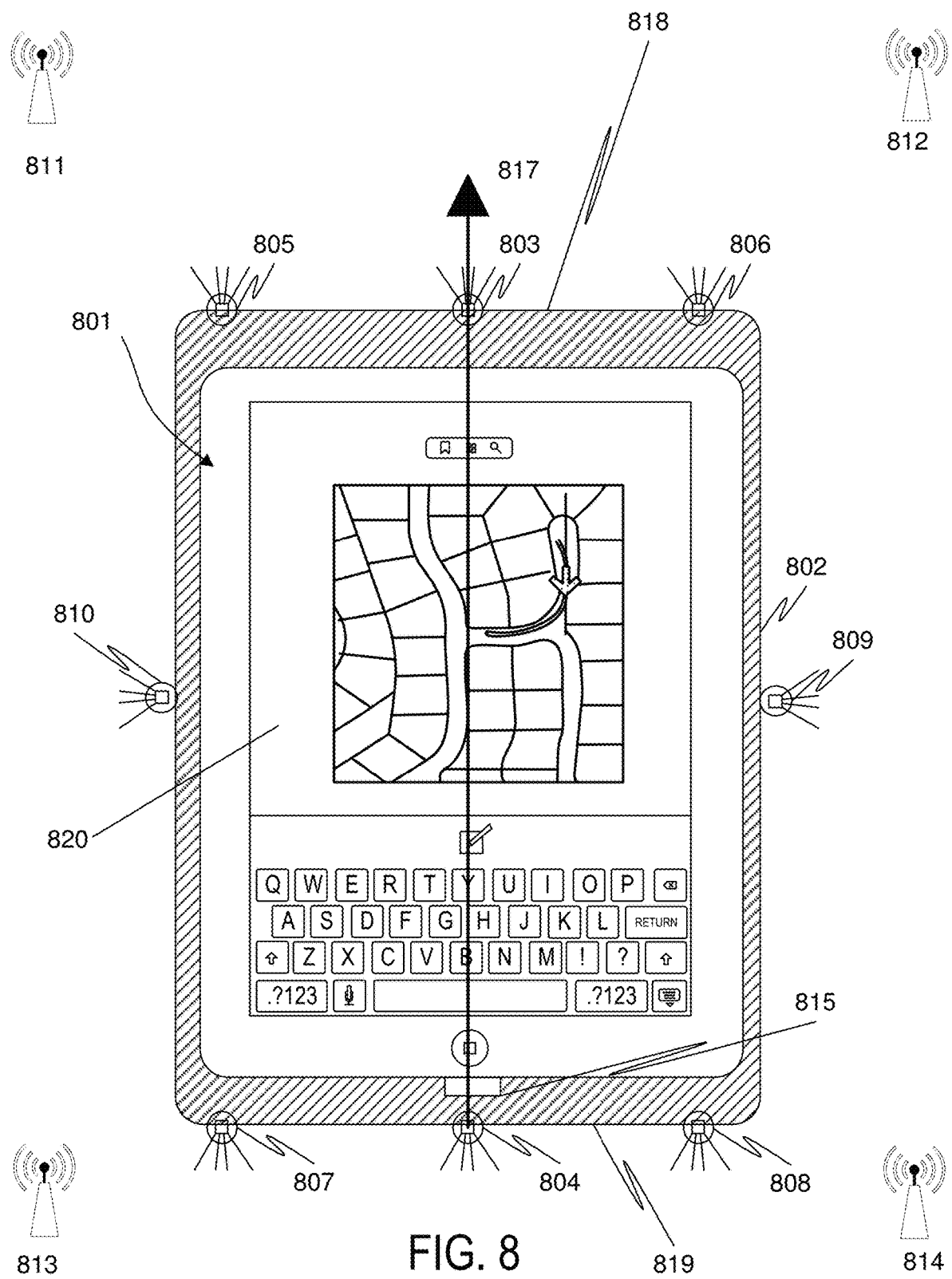
FIG. 8 is an illustration of a smart device in a smart receptacle according to an embodiment of the invention.

Referring now to FIG. 8, additional apparatus and methods for determining a geospatial location and determination of a direction of interest may include one or both of an enhanced Smart Device and a Smart Device in logical communication with wireless position devices 803-810. The importance of geospatial location and determination of a direction of interest is discussed in considerable detail above. As illustrated, a Smart Device 801 may be in logical communication with one or more wireless position devices 803-810 strategically located in relation to the physical dimensions of the Smart Device. For example, the Smart Device 801 may include a smart phone or tablet device with a user interface surface 820 that is generally planar. The user interface surface 820 will include a forward edge 818 and a trailing edge 819.

In some preferred embodiments, the Smart Device will be fixedly attached to a smart receptacle 802. The smart receptacle 802 may include an appearance of a passive case, such as the type typically used to protect the Smart Device 801 from a damaging impact. However, according to the present invention, the smart receptacle 802 will include digital and/or analog logical components, such as wireless position devices 803-810. The wireless position devices 803-810 include circuitry capable of receiving wireless transmissions from multiple wireless Reference Position Transceivers 811-814. The wireless transmissions will include one or both of analog and digital data suitable for calculating a distance from each respective reference point 811-814.

In some embodiments, the smart receptacle 802 will include a connector 815 for creating an electrical path for carrying one or both of electrical power and logic signals between the Smart Device 801 and the smart receptacle 802. For example, the connector 815 may include a mini-USB connector or a lightning connector. Additional embodiments may include an inductive coil arrangement for transferring power.

Embodiments may also include wireless transmitters and receivers to provide logical communication between the wireless position devices 803-810 and the Smart Device 801. Logical communication may be accomplished, for example, via one or more of: UWB, Bluetooth, ANT, and infrared media.

Reference Position Transceivers 811-814 provide wireless transmissions of data that may be received by wireless position devices 803-810. The wireless transmissions are utilized to generate a position of the respective wireless position devices 803-810 in relation to the Reference Position Transceivers 811-814 providing the wireless transmissions to the wireless position devices 803-810. The wireless position devices 803-810 are associated with one or more of: a position in a virtual model; a geographic position; a geospatial position in a defined area, such as Structure; and a geospatial position within a defined area (such as, for example a Property).

According to the present invention, a Smart Device may be placed into a case, such as a smart receptacle 802 that includes two or more wireless position devices 803-810. The wireless position devices 803-810 may include, for example, one or both of: a receiver and a transmitter, in logical communication with an antenna configured to communicate with Reference Position Transceivers 811-814. Communications relevant to location determination may include, for example, one or more of: timing signals; SIM information; received signal strength; GPS data; raw radio measurements; Cell-ID; round trip time of a signal; phase; and angle of received/transmitted signal; time of arrival of a signal; a time difference of arrival; and other data useful in determining a location.

The Nodes 803-810 may be located strategically in the case 802 to provide intuitive direction to a user holding the case 802, and also to provide a most accurate determination of direction. Accordingly, a forward Node 803 may be placed at a top of a Smart Device case and a rearward Node 804 may be placed at a bottom of a Smart Device case 802. Some embodiments each of four corners of a case may include a Node 805, 806, 807, 808. Still other embodiments may include a Node 809 and 810 on each lateral side.

Figure 9:
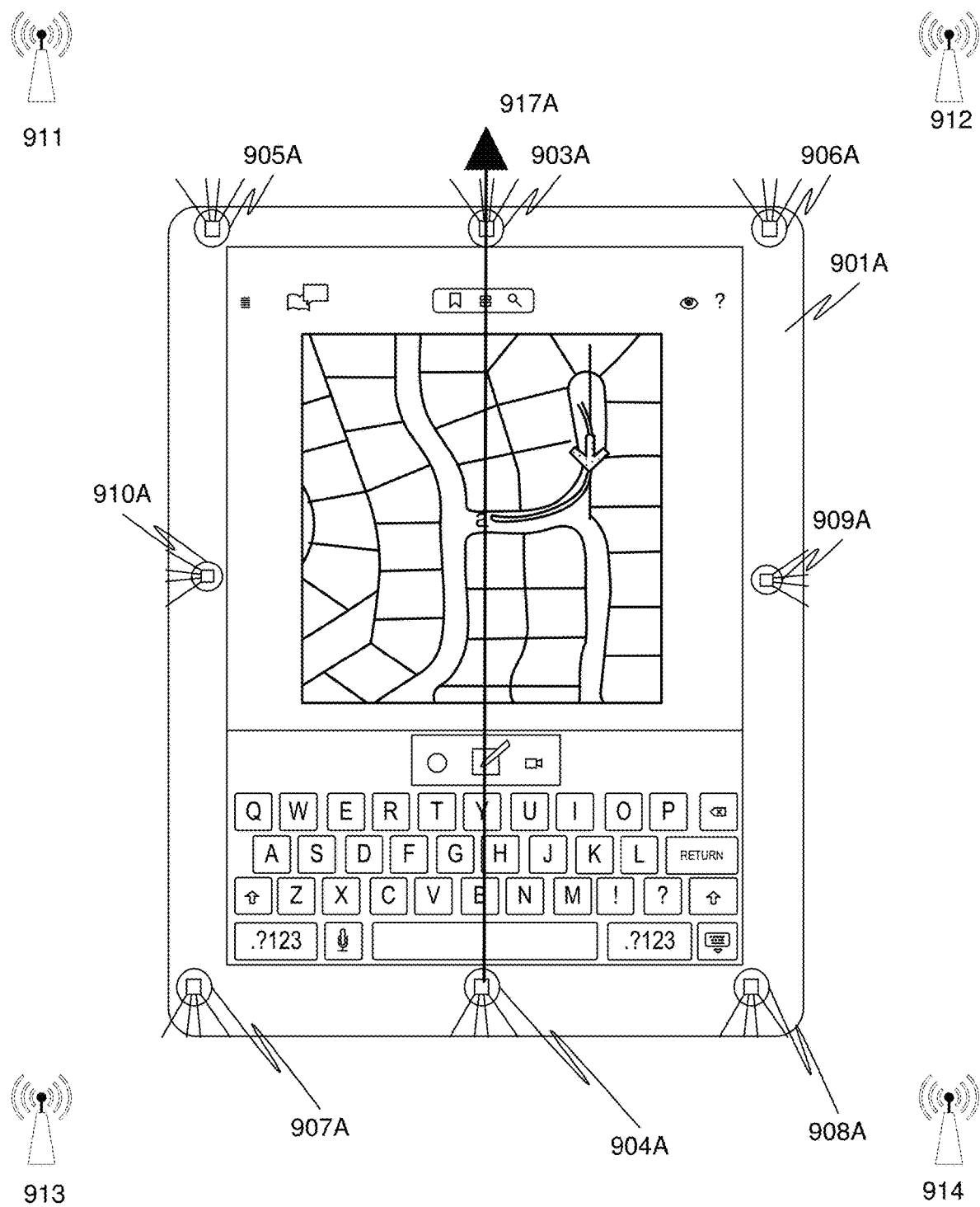
FIG. 9 is an illustration of a smart device with built in transceivers according to an embodiment of the invention.

Referring now to FIG. 9, in some embodiments, Nodes 903A-910A may be incorporated into a Smart Device 901A and not require a smart receptacle to house the Nodes. Nodes 903A-910A that are incorporated into a Smart Device, such as a smart phone or smart tablet, will include internal power and logic connections and therefore not require wireless communication between the controller in the Smart Device 901A and the Nodes 903A-910A. Nodes 903A-910A may communicate with multiple position transponders 911-914.

A Smart Device 901A with integrated Nodes 903A-910A and a Smart Device 901A with Nodes 903A-910A in a smart receptacle 902A may provide a directional indication, such as a directional Vector 917A, without needing to move the Smart Device from a first position to a second position.

Referring now to FIG. 10, method steps are described for determining an Agent position location. At step 1022 a transmission of a layer one location designation may be performed of at least one Agent supported position transceiver. At step 1023 a receipt of a designation of a layer two position reference transceiver based upon the layer one location may occur. At step 1024, a calculation of a distance from multiple layer two position reference transceivers and at least one Agent supported transceiver may occur. At step 1025, the operations of step 1024 may be repeated for multiple calculated distances until a position of the Agent supported transceiver may be calculated based upon these calculated distances. At step 1026, again measurements may be repeated multiple times where the same frequency is utilized. At step 1027, again the measurement steps may be repeated multiple times; however, utilizing different frequencies. At step 1028, the various data may be used to calculate an estimated position of the at least one Agent supported position transceiver based upon a mathematical process. At step 1029, a vector may be generated based upon at least one of the positions of the Agent supported transceiver based upon the calculated distances and the estimated position of the at least one Agent supported position transceiver.

Referring to FIG. 11, at step 1132, a location of a first position transceiver supported by an Agent is calculated based upon wireless communication with a reference position transceiver. Next, at step 1133, a location of a second position transceiver supported by the Agent is calculated based upon wireless communication with a reference position transceiver. At step 1134, a vector is generated based upon the location of the first position transceiver and the location of the second position transceiver. At step 1135, a database is queried based on the vector. At step 1136, a user interface is generated based on a response to the query based on the vector. Finally, at step 1137, the user interface is displayed on a smart device associated with the Agent.

In some embodiments of the invention, determining the location of objects in a Cold Storage Facility may benefit from an Augmented Virtual Model. The present invention references prior applications and issued patents owned by the applicant relating to automated apparatus and methods for generating improved Augmented Virtual Models (sometimes referred to herein as an "AVM") of a Structure. An AVM may include As Built elements, including the locations of Reference Position Transceivers and items of interest to which an Agent may wish to be guided by methods and apparatus described herein.

An AVM may include original design data matched to As Built data captured via highly accurate geolocation, direction and elevation determination. As Built data is matched with a time and date of data acquisition and presented in two- and three-dimensional visual representations of the Property. The augmented models additionally include data relating to features specified in a Property design and data collected during building, deployment, maintenance, and modifications to the Property. In some embodiments, a fourth dimension of time may also be included. As a result, an Employee or other Agent may be guided to, for example, a former location of an item of interest.

The experience of the physical Structure is duplicated in the virtual Augmented Virtual Model. The AVM may commence via an electronic model generated via traditional CAD software or other design type software. In addition, the AVM may be based upon values for variables, including one or more of: usage of a Structure; usage of components within the Structure; environmental factors encountered during a build stage or deployment stage; and metrics related to Performance of the Structure. The metrics may be determined, for example, via measurements performed by sensors located in and proximate to Structures located on the Property.

Figure 12:
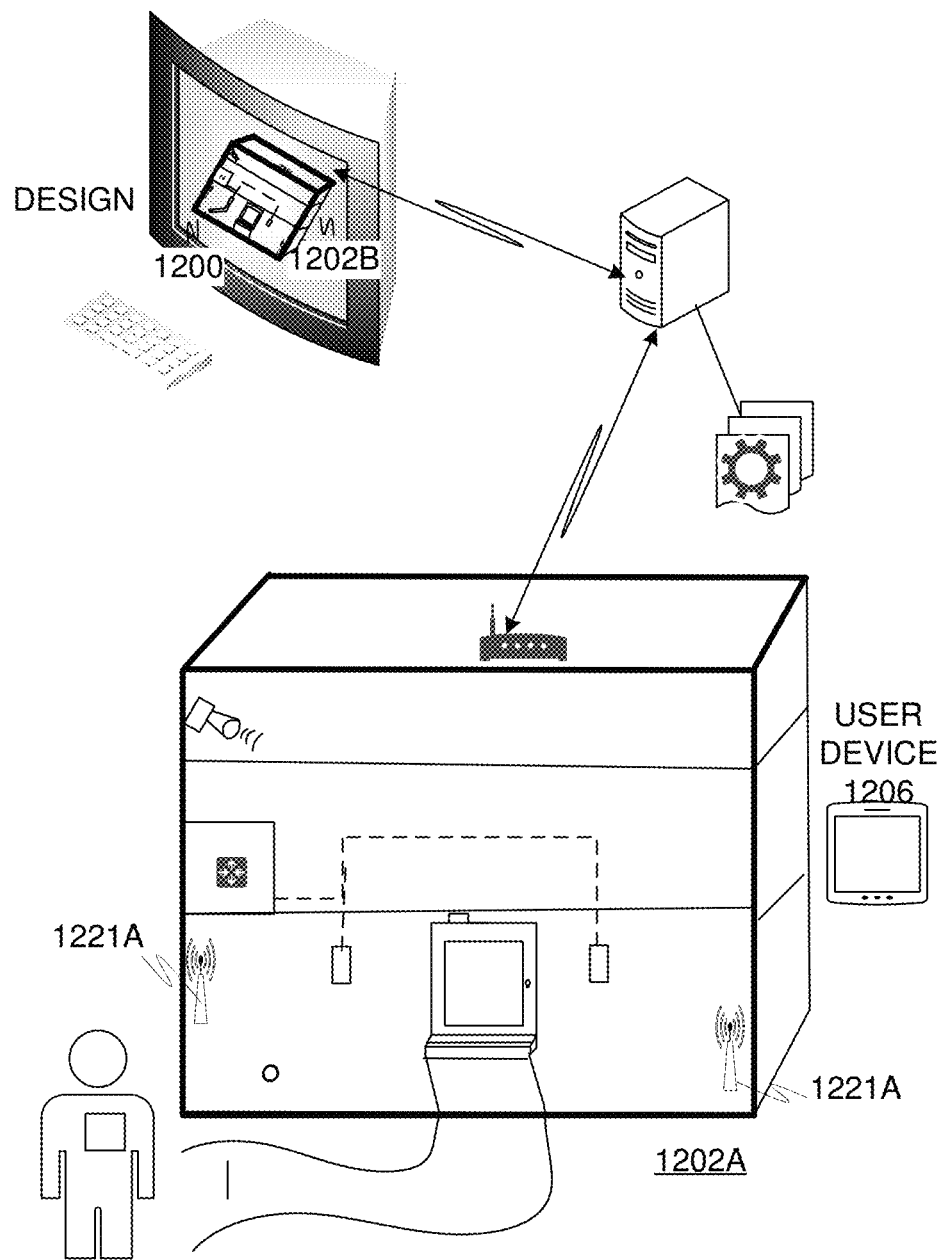
FIG. 12 is an illustration of the use of Augmented Virtual Models in orienteering methods.

Referring now to FIG. 12, based upon the calculated location of the user device 1206, details of the physical Structure 1202A may be incorporated into the virtual structure 1202B and presented to a user via a graphical user interface (GUI) on the user's Smart Device 1206. For example, a user may approach a physical Structure and activate an app on a Smart Device 1206. The app may cause the Smart Device 1206 to activate a GPS circuit included in the Smart Device and determine a general location of the Smart Device 1206, such as a street address designation. The general location will allow a correct AVM 1200 to be accessed via a distributed network, such as the Internet. Once accessed, the app may additionally search for one or more Reference Position Transceivers 1221A of a type and in a location recorded in the AVM. An AVM may indicate that one or more RFID chips are accessible in certain rooms in the Structure. The user may activate appropriate sensors to read the RFID chips and determine their location. In another aspect, an AVM 1200 may indicate that Reference Position Transceivers 1221A are placed at two or more corners (or other placement) of a physical Structure 1202A and each of the Reference Position Transceivers 1221A may include a transmitter with a defined location and at a defined height. The Smart Device 1206, or other type of controller, may then triangulate with the Reference Position Transceivers 1221A to calculate a precise location and height within the physical Structure as discussed above.

Similarly, a direction may be calculated via a prescribed movement of the Smart Device 1206 during execution of code that will record a change in position relative to the Reference Position Transceivers 1221A. For example, a user Smart Device 1206, such as a smart phone or tablet may be directed towards a wall or other Structure portion and upon execution of executable code, the Smart Device may be moved in a generally perpendicular direction towards the wall. The change in direction of the user device 1206 relative to the Reference Position Transceivers 1221A may be used to calculate a direction. Based upon a recorded position within the Structure 1202A and the calculated direction, a data record may be accessed in the AVM 1200 and a specific portion of the AVM 1200 and/or the virtual structure 1202B may be presented on the Smart Device 1206. In other embodiments, a direction may be chosen, or verified via a mechanism internal to the Smart Device 1206, such as a compass or accelerometer.

Embodiments may include models generated using, for example, standard modeling software such as BIM 360™ field which may support the display of a Structure design in a very complete level of detail. Additional events for scanning may occur during the construction process to capture accurate, three-dimensional as-built point-cloud information. Point cloud may include an array of points determined from image capture and/or laser scanning or other data collection technique of as-built features. In some examples, captured data may be converted into a 3D model, and saved within a cloud-based data platform.

In some examples, other methods of capturing spatially accurate information may include the use of drones and optical scanning techniques, which may include high-resolution imagery obtained from multiple viewpoints. Scanning may be performed with light-based methods such as a CCD camera or LIDAR. Other methods may include infrared, ultraviolet, acoustic, and magnetic and electric-field mapping techniques may be utilized.

Structure-related information may include physical features generally associated with an exterior of a Structure such as geolocation, elevation, surrounding trees and large landscaping features, underground utility locations (such as power, water, sewer, sprinkler system, and many other possible underground utility features), paving, and pool or patio areas. Structure-related information may also include features generally related to a Structure such as underground plumbing locations, stud locations, electrical conduit and wiring, vertical plumbing piping, and HVAC systems or other duct work. The acquisition of the data may allow the model system to accurately locate these interior and exterior features. Acquisition of as-built data during different points of the construction completion allows measurements to be taken prior to aspects involved in a measurement process being concealed by concrete, drywall or other various building materials.

Figure 13A:
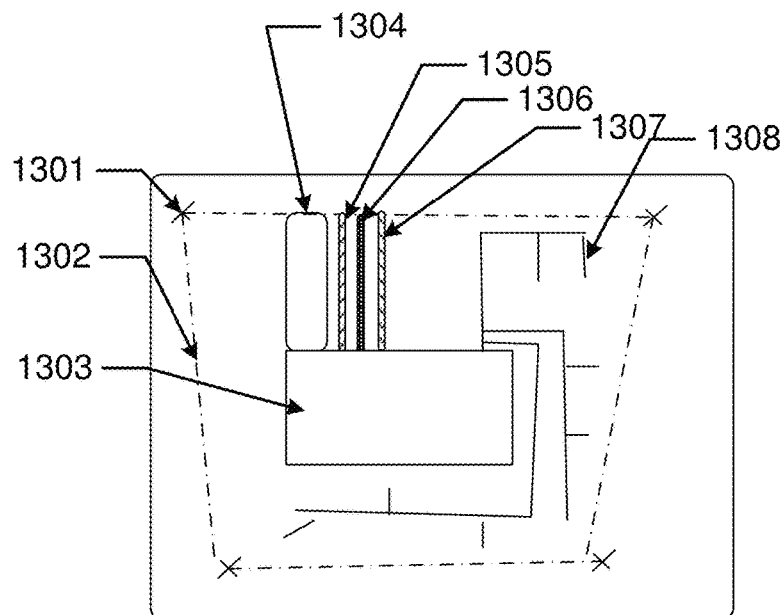
FIGS. 13A-13E are schematics of various internal structures of a Property that may be identified and monitored according to embodiments of the invention.

Referring to FIGS. 13A-13D, an illustration of the collection of data by scanning a Structure during its construction is provided. In FIG. 13A, a depiction of a site for building a Structure is illustrated. The depiction may represent an image that may be seen from above the site.

Indications of Property boundaries such as corners 1301 and Property borders 1302 are represented and may be determined based on-site scanning with Property markings from site surveys or may be entered based on global coordinates for the Property lines. An excavated location 1303 may be marked out. Roadways, parking and/or loading areas 1304 may be located. Buried utilities such as buried telephone 1305, buried electric 1306, buried water and sewer 1307 are located in the model as illustrated. In some examples, other site services such as a buried sprinkler system 1308 may also be located.

Figure 13B:
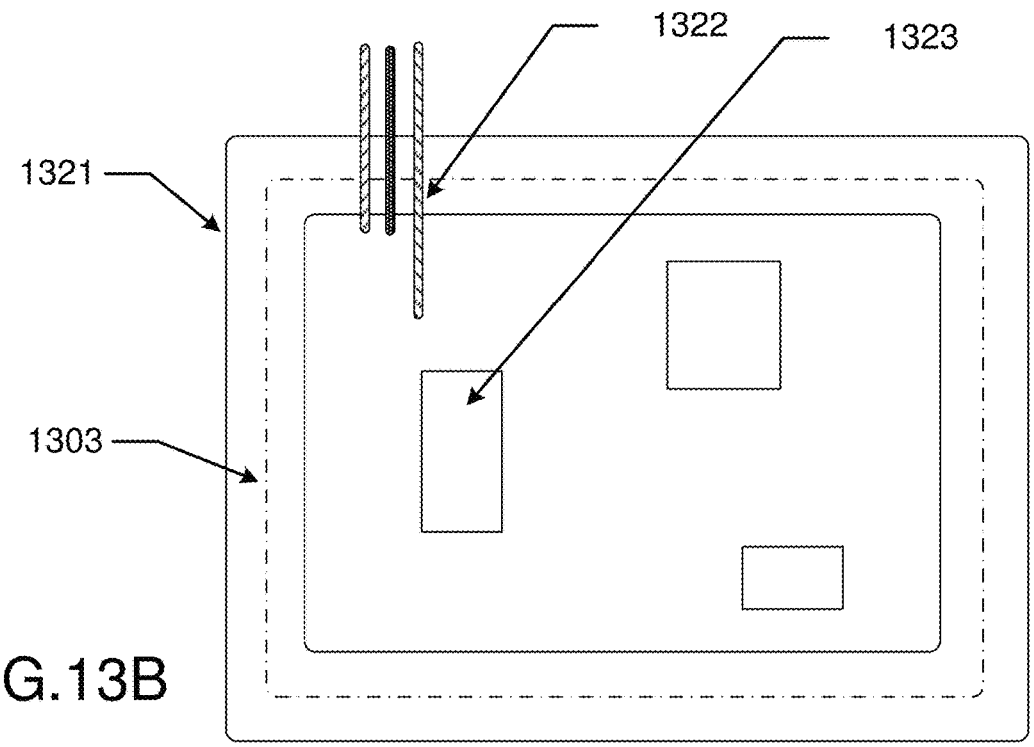

Referring to FIG. 13B, the excavated location 1303 may be scanned or imaged to determine the location of foundation elements. In some non-limiting examples, a foundational footing 1321 along with buried utilities 1322 is illustrated. The buried utilities may include utilities such as electric lines, water supply (whether from a utility or a well on-location), sewer or septic system lines, and telecommunications lines such as telephone, cable and internet. Other footing elements 1323 may be located at structural requiring locations as they are built. In some examples, a scanning system may provide the locational orientation relative to site-orientation markings. In other examples, aerial imagery such as may be obtained with a drone may be used to convert features to accurate location imagery.

Figure 13C:
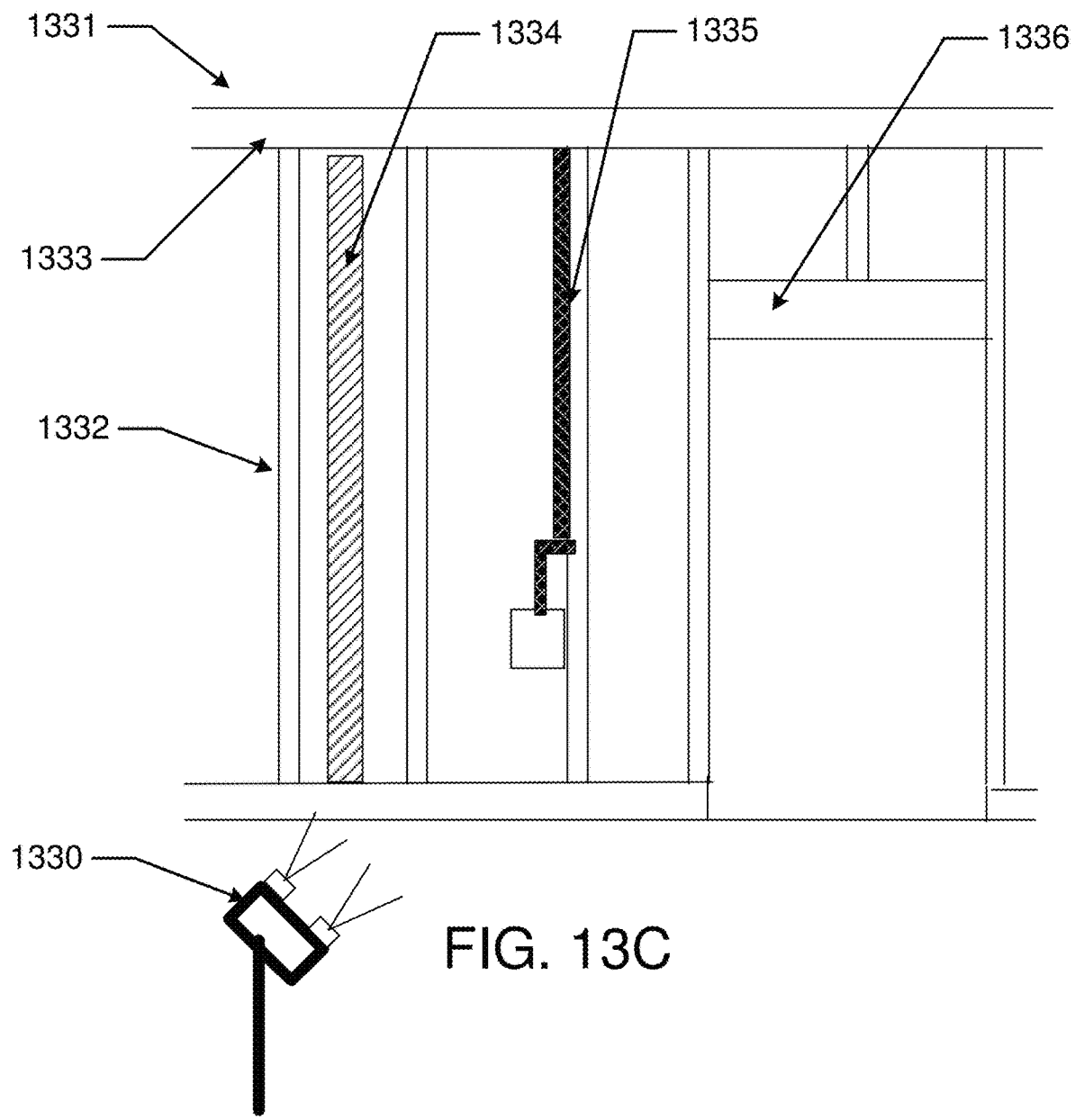

Referring to FIG. 13C, a wall 1331 of the Structure in the process of build is illustrated. The Structure may be scanned by a scanning element 1330. In some examples, a laser three-dimensional scanner may be used. The wall may have supporting features like top plates 1333, headers 1336, studs 1332, as well as internal items such as pipes 1334, electrical conduits, and wires 1335. There may be numerous other types of features within walls that may be scanned as they occur such as air ducts, data cables, video cables, telephone cables, and the like.

Figure 13D:
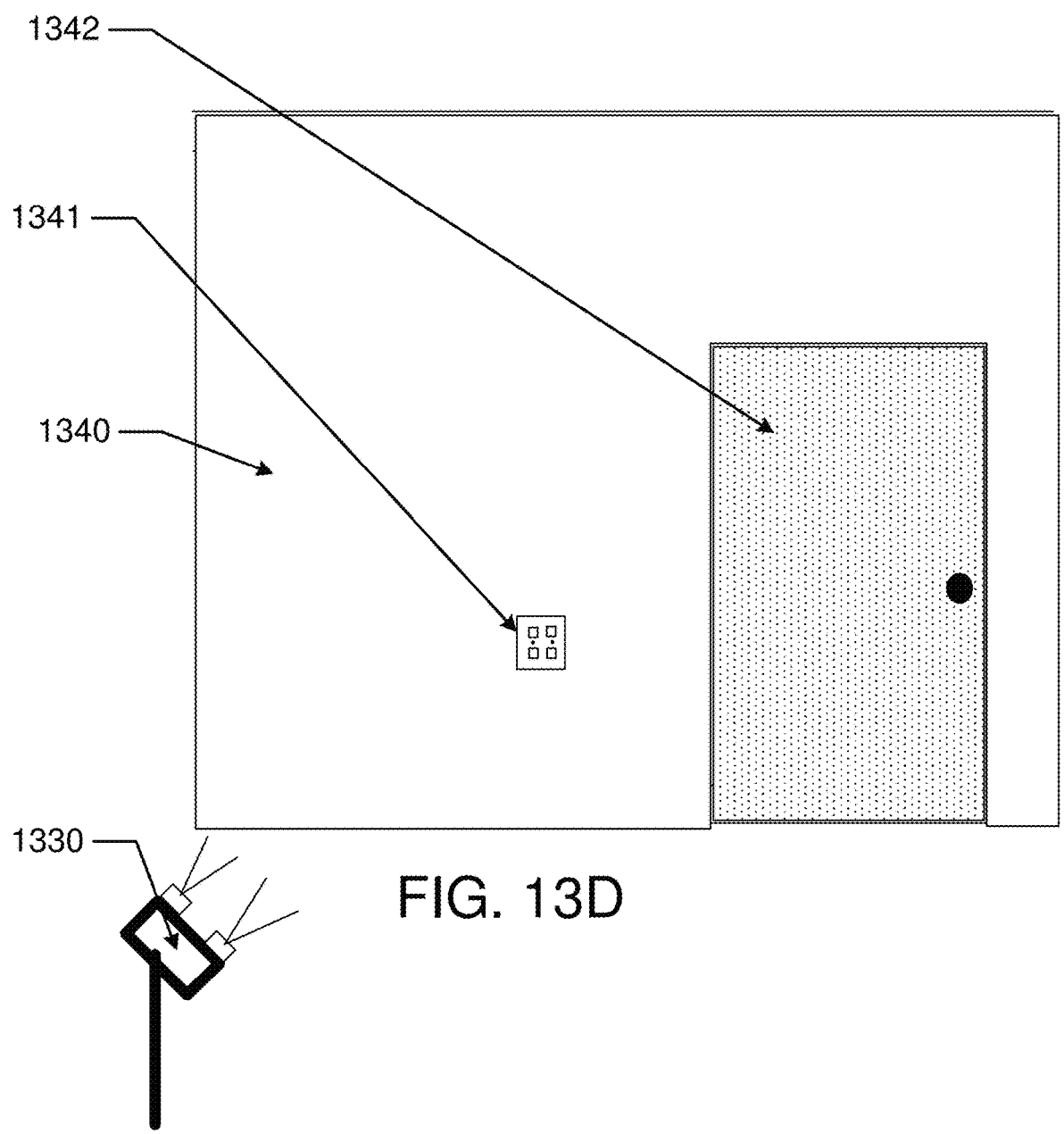

Referring to FIG. 13D, the wall may be completed with Structure components behind wall facing 1340 may no longer be visible. Electrical outlets 1341 and door Structures 1342 may be scanned by a scanning element 1330.

Figure 13E:
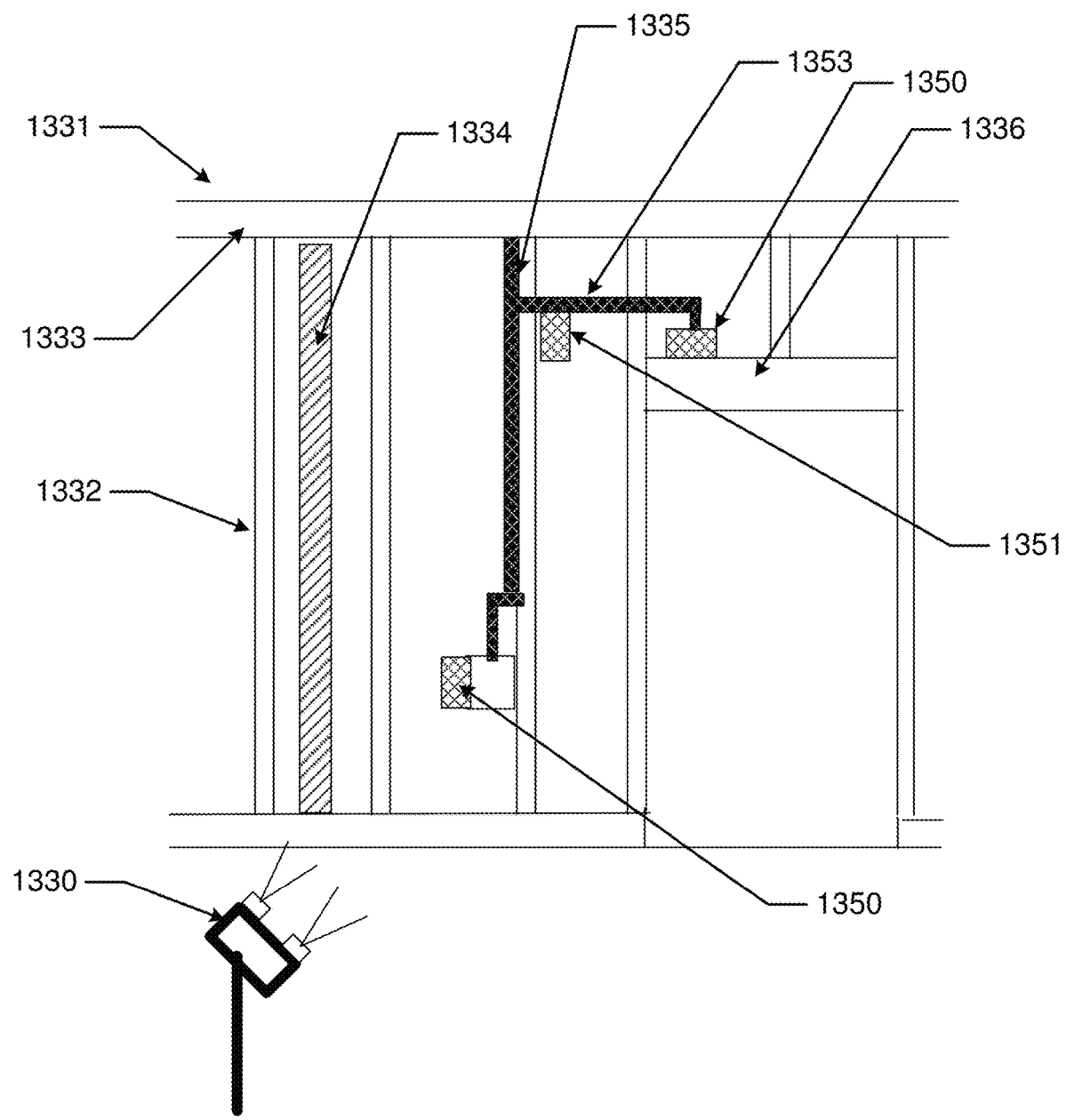

Referring to FIG. 13E, a wireless Node may be fixedly attached to a position in or proximate to a Structure. In some embodiments, attachment may be accomplished during construction and/or retrofitting of a structure, in which case the functionality described herein may be made operational to track Agents, materials, equipment, and the like during a construction phase, and also track a location of materials and equipment included in the structure. Nodes may be installed as Reference Position Transceivers or be attached to items that dynamically change positions, such as, by way of non-limiting example one or more of: Agents, building materials, structural components, electrical components, plumbing components, equipment, machines and architectural aspects (e.g. a corner, an arch, an extremity, and the like).

In some non-limiting examples of a wireless Node, a Bluetooth communications hub compatible with a standard such as, for example BLE5.1 (Bluetooth Low Energy 5.1) or Wi-Fi RTT may be fixedly attached to a structural component, such as a door header 1336 as Node 1350 acting as a Reference Position Transceiver. In another example, a Node 1351 may act as a Reference Position Transceiver and be attached to a wall stud, preferentially one that has electrical conduit 1335 running along it. In some embodiments, the electrical conduit 1335 may supply power to the Node 1351. Alternatively, a Node 1352 may be configured as part of a receptacle box. In some examples, one or more Nodes 1350-1351 may be battery powered. One or more Nodes 1350-1351 may be powered via electrical supply wiring 1353 from a nearby power conduit 1335 so that the Node 1350-1351 may be tied into a centrally powered electrical system. Moreover, the Nodes may be adapted to de-power and de-couple from a network based on a power supply status or a power drain change.

Figure 13F:
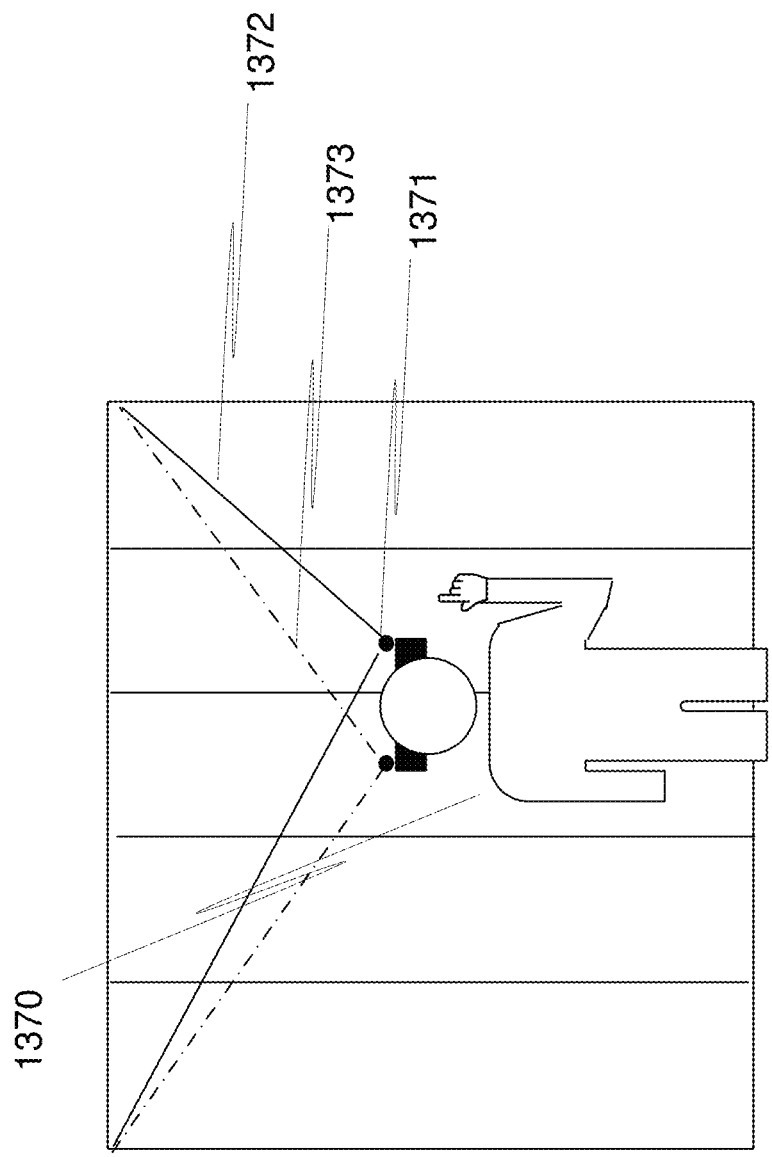
FIG. 13F illustrates an exemplary method of a user utilizing an oriented stereoscopic sensor system to orient a direction of interest.

Referring to FIG. 13F, an illustration of an Agent 1370 utilizing an oriented stereoscopic sensor system 1371 to orient a direction of interest is shown. The stereoscopic sensor system 1371 may obtain two different images from different viewpoints 1372-1373 which may be used to create topographical shape profiles algorithmically. A controller may obtain the image and topographic data and algorithmically compare them to previously stored images and topographic data in the general environment of the user. The resulting comparison of the imagery and topography may determine an orientation in space of the Agent 1370 and in some examples determine a device field of view. The controller may utilize this determined field of view for various functionality as described herein.

With the methods and apparatus described above, the location of an individual with a Smart Device or other Node may be determined. Additionally, the methods and apparatus may be used to determine the individual's direction of interest. Similarly, the location of any object tagged with a transceiver, Node, or Smart Device may be determined, whether stationary or in transit. In a Cold Storage Facility, equipment, sensors, pallets, transports, and employees may hold or be "tagged" with a transceiver, Node, or Smart Device, and each location may be transmitted to monitoring system and/or identified on a user display to monitor the location of each item. Additionally, the item or persons may transmit to a system information about the item/person, either automatically or when queried. For example, the sensors may transmit location and also data for the sensor over any desired time period. Equipment and sensors may be able to transmit information about maintenance history or part numbers. Movement of pallets and transports may be tracked throughout the Facility. Employee movements may also be tracked and information about the Employee, including hours, authorizations, and the like, may be transmitted to a monitoring system. These are non-limiting examples and other types of information may be transmitted from the Node or Smart Device to a monitoring system.

In some cases, it may be prohibitively inefficient or expensive to "tag" or associate a Node or Smart Device with every item to be monitored. For example, it may be cost and time prohibitive to assign each product being stored in the Facility with a Node or Smart Device. As such, other methods of monitoring the products and other items may be used. In some embodiments of the invention, an item may be assigned a "Virtual Tag," in which a Smart Device can identify an object in its field of view and capture its location coordinates based on the position of the Smart Device. A "Virtual Tag" or "icon" may be generated in the Smart Device's field of view at those coordinates and saved in the digital memory. Information regarding the object may also be saved with the spatial coordinates. This information can be transmitted to the monitoring system so that others may find the object by routing to the particular coordinates. In addition, when that Smart Device, or another Smart Device in logical communication with the monitoring system, views the particular location, the Smart Device will identify that a virtual tag exists at that location with, for example, an icon. The icon may also be interactive so that information associated with the object may be known. Thus, the monitoring system may be in logical communication with both physical tags such as Smart Devices or Nodes and with Virtual Tags created by a Smart Device. This will be described in further detail below.

Figure 14:
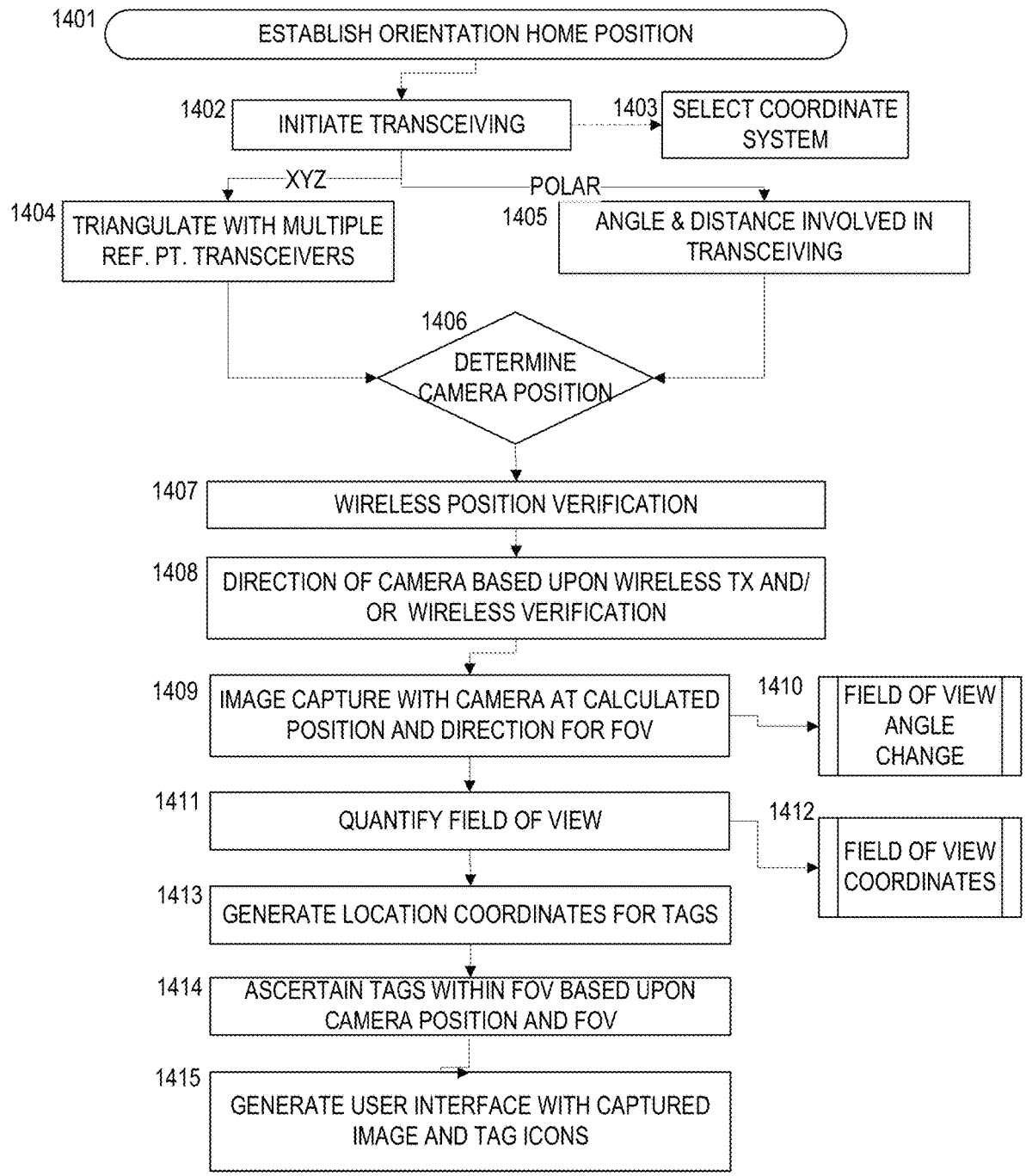
FIG. 14 is a flow chart with method steps for creating and visualizing a virtual tag.

Creating of Virtual Tags may, in some embodiments, performed using the following steps. Referring to FIG. 14, in a first step 1401, an orientation home position is established. At step 1402, the Smart Device initiates transceiving and at step 1403, a coordinate system is selected. If Cartesian coordinate system is selected, at step 1404, the Smart Device may triangulate with Reference Point Transceivers/Nodes to determine the position of the Image Capture Device in the Smart Device (step 1406). If a polar coordinate system is selected, at Step 1505, an angle and distance involved in transceiving is measured, and the camera position is determined (step 1406). In some embodiments, the Image Capture Device may be a camera, including a charge-coupled device (CCD), or a LIDAR apparatus, including a solid-state LIDAR or a MEMS-based LIDAR.

At step 1407, the position of any Nodes or Reference Point Transceivers is verified, and in step 1408, the direction of the Image Capture Device is determined based on the methods described herein, using the Smart Device and any Nodes or Reference Point Transceivers nearby.

At step 1409, the Image Capture Device captures an image. This may be done by capture of wireless energy of a first wavelength is received into a wireless receiver in the Smart Device. In exemplary embodiments, this step may comprise receiving image data based on visible light into a camera of the smart device. The wireless energy may be dispersed over a one-, two-, or three-dimensional space in a defined physical area, and may be received into a one-, two-, or three-dimensional array in the receiver. The wireless energy may take the form of electromagnetic radiation, such as light in the human-visible light spectrum (generally having a wavelength between 380 nm-740 nm), ultraviolet light (generally having a wavelength between 10.0 nm-400 nm), or infrared light (generally having a wavelength between 740 nm-2.00 mm). The set of wireless energy available to the wireless receiver is the smart device's Field of View. In step 1410, the Field of View may change as the angle or position of the Smart Device changes.

In step 1411, the Field of View is quantified. In some embodiments, a pattern of digital values is generated based upon receipt of wireless energy into the wireless receiver. This pattern of digital values may be based on one or more qualities of the received wireless energy, including its intensity, spatial dispersion, wavelength, or angle of arrival. The pattern may be placed into an appropriate array. For example, if the display of the smart device is a two-dimensional display, then the pattern of digital values may comprise a two-dimensional representation of the image data received. In some embodiments, the pattern of digital values may be based on an aggregated set of values from an array of receivers. For example, if the basis of the digital values is the intensity of the wireless energy received into the receiver, then the digital value assigned to a given entry in the array may be based on a weighted average of intensity of wireless energy received at a plurality of the receivers in the array. The set of digital values within the Field of View is the Digital Field of View. In step 1412, optionally, the coordinates of the space in the Digital Field of View may also be determined. Any suitable method may be used, but in some embodiments, LIDAR may be used to determine the presence and distance from the Smart Device of various items in the Field of View and therefore determine the position of items. In step 1413, items or space in the Field of View may be "tagged" such as via a touch screen or cursor. Using similar steps for step 1412, the location coordinates for the Virtual Tags may be known and transmitted, for example, to a monitoring system or controller.

Referring to step 1414, when a Smart Device that is part of the monitoring system approaches the location of the Virtual Tag, the Smart Device will identify that the Virtual Tag is within the Smart Device's Field of View. In step 1415, when this occurs, the Smart Device will generate an icon in the position of the Virtual Tag. This icon may be interactive so that information regarding the location or Virtual Tag may be ascertained. For example, the Virtual Tag may provide a location and environmental history of the product at the coordinates, as will be discussed in further detail below.

Figure 15:
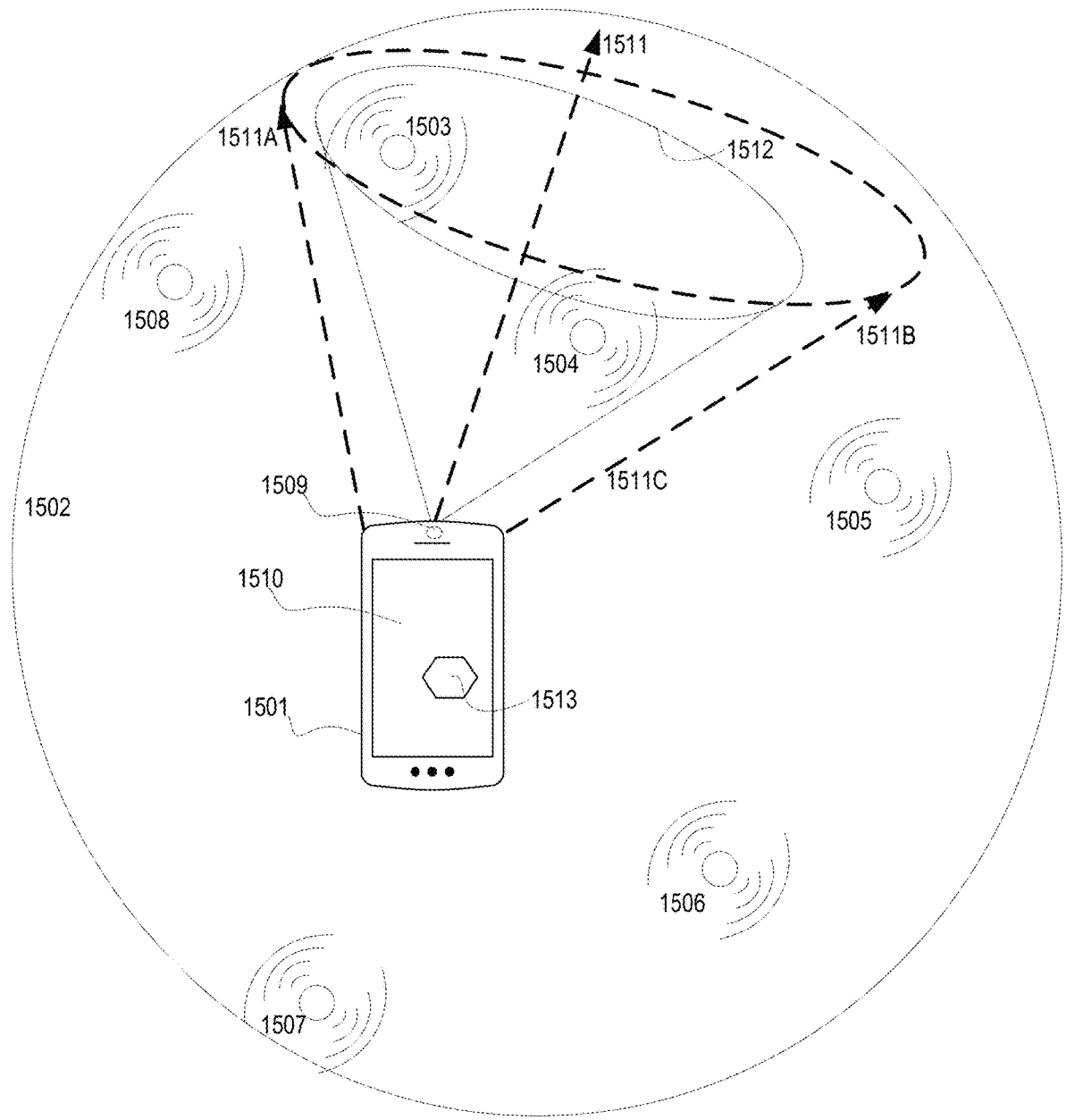
FIG. 15 provides an illustration of a field of view of a Smart Device.

Next, additional details regarding how the Field of View may be determined will be discussed. Referring now to FIG. 15, a Smart Device 1501 is illustrated in within a wireless communication area (WCA) 1502. The WCA 1502 may be dimensioned according to a bandwidth and/or modality of wireless communication the Smart Device 1501 uses to transmit and receive information. For example, bandwidths may include those associated with UWB, WiFi, Bluetooth, ANT, ultrasonic, infrared and cellular modalities of communication. In general, unless otherwise contained by physical modification such as a directional antenna or radio frequency interference from a physical object (such as objects with significant metallic content; objects with high water content; electrical fields; etc.), a WCA 1512 will include spherical area(s) emanating from one or more transceivers and/or transceiver antennas operated by the Smart Device 1501.

As discussed extensively herein, the location of the Smart Device 1501 is determined based upon wireless coordinates to and/or from the Smart Device 1501; and described via a coordinate system, such as Cartesian coordinates, or other X,Y,Z coordinates, polar coordinates, spherical coordinates, and cylindrical coordinates. Aspects of wireless communications that may be referenced to generate location coordinates may include one or more of: RTT (round trip time), time of flight, RSSI (received signal strength indicator); angle of arrival, angle of departure, and other aspects described herein.

With the location of the Smart Device 1501 determined, a location of the WCA 1502 may be extrapolated based upon the location of the Smart Device and a transceiving distance the Smart Device is capable of. According to the present invention, a portion of the WCA 1512 is selected as a radio target area (RTA) 1512 from which the Smart Device 1501 may receive specific bandwidths of electromagnetic radiation. In preferred embodiments, the RTA 1512 will include a frustum expanding outward in a conical shape from one or more energy receivers 1509 included in the Smart Device 1501. The frustum shaped RTA 1512 will overlap a portion of the WCA 1502 sphere. Other shapes for a radio target area 1502 are also within the scope of the invention. In some embodiments, a shape of the RTA 1512 will be based upon receiving capabilities of the one or more energy receivers 1509. For example, an energy receiver 1502 with a charge coupled device (CCD) or complementary metal oxide semiconductor (CMOS) receiver may have a single plane receiving surface and be best matched with a frustum of a generally conical shape, an energy receiver 1509 with multiple receiving surfaces (e.g. with multiple CCD and/or CMOS devices) may be arranged to enable a more complex shaped RTA 1512.

In some preferred embodiments, a direction of interest 1511 will intersect the RTA 1512. As discussed herein, the direction of interest 1512 may be represented by a ray or vector 1511. In addition, the direction of interest may be represented as a direction of interest area, such as a frustum 1511C defined by multiple rays or vectors 1511, 1511A, 1511B. In various embodiments, the direction of interest 1511 area may encompass the RTA 1512 or be a subset of the RTA 1512.

A direction of interest may be determined for example via the methods and devices described herein and may be associated with a direction based upon a ray or vector indicative of a direction of interest 1511, a direction based upon a magnetic field sensor, an accelerometer, a light beam, correlation between two tags or nodes, Agent gestures, or other Smart Device recognized apparatus and/or method.

One or more transceivers 1503-1504 (typically included within a Smart Device, Tag, or Node) will be located within an area defined by the RTA 1512. According to the present invention, a position of the transceiver 1503-04 will be determined and a user interactive mechanism will be generated at a position of the transceiver 1503-04 within a graphical user interface emulating aspects of the RTA 1512 on the Smart Device 1501 or another user interactive interface screen (not shown, and maybe at a site remote to the RTA 1512).

According to the present invention, some portion of the RTA 1512 (which may include the entirety of the RTA 1512) may be portrayed on an Agent interface 1510, including, in some embodiments, a human readable graphical user interface (GUI). The interface 1510 may include a representation of a particular level of electromagnetic energy received via the energy receiver 1509 and associated with a particular area of the RTA 1512. For example, energy levels of an infrared wavelength that has emanated from or reflected off of an item in the WTA 1512 and received via an infrared receiver in the Smart Device 1512 may be used to generate a heat map type interface display, similarly energy that has emanated from or reflected off of an item in the RTA 1512 in the 400 nM to 700 nM range and been received via a charged couple device in the Smart Device 1501 may be portrayed as a human visible image of items in the area included in the RTA 1512. Other embodiments may include a point cloud derived from electromagnetic energy bouncing off of or emanating from items included in the RTA 1512 or a series of polygons generated based upon a LIDAR receiver in the Smart Device 1512. An Agent interface 1510 may be presented in a modality understandable to an Agent type. For example, an interface presented to a UAV or UGV may include a digital pattern and an interface presented to a human Agent may include multiple pixels or voxels generating a pattern visible to a human being.

The wireless location methods and apparatus described herein may be deployed in conjunctions with one or more Tags and/or Nodes 1503-08 located with the WCA 1502 to generate location coordinates for the Tags and/or Nodes 1503-08. A controller or other device operating a processor may determine which Tags and/or Nodes 1503-08 are located within the three dimensional space included in the RTA 1512 based upon a) the location of the Tags and/or Nodes 1503-08; and b) the location of area included in the RTA 1512.

In another aspect of the present invention, in some embodiments, some energy levels may not be represented in the Agent interface 1510. For example, in some embodiments, energy levels reflected off of a particular item may not be included in the Agent interface 1510 which would a simulation that the item is not within the RTA 1512. Other embodiments may only represent energy levels that have reflected off of selected items within the RTA 1512 thereby emphasizing the presence of the selected items and ignoring the presence of other items within the RTA 1512.

In some embodiments of the invention, sensors throughout the facility may be virtually tagged via a Virtual Tag method described herein or from an AVM using As Built data. As such, throughout the facility, when a Smart Device views the sensor, an icon may be generated. When a user interacts with the icon, the icon may generate information about the sensor or equipment. For example, the following equipment could be virtually tagged: refrigeration compressors; refrigeration pumps; refrigeration valve groups; refrigeration evaporative condensers and fan coil units; air compressors; boilers; and electrical panels. Examples of sensors that could be virtually tagged include sensors that detect temperature, humidity, air flow, current/amperage, pressure, water flow, water sensor, and ammonia levels. When icons associated with such equipment or sensors are generated, a user may interact with the icon, and information about the items may be displayed on the smart device. For example, when touched by a user, the icon may bring up a menu of the information about the equipment or sensor, including a user's manual, parts list, maintenance history, and/or history of data generated by the sensor or equipment over a certain time period. The icons may also provide an indication or warning if there is a problem with the equipment or sensor.

As a non-limiting example, ammonia sensors may be installed in various locations in the cold storage facility, including the refrigeration machine room, along the ammonia piping, near valve groups, at the fan coils, within ductwork (if applicable), and the like. A smart device may provide an AVM of the facility that identifies each ammonia sensor, and if the icon for each sensor is opened, information about the particular sensor may be obtained, including the ammonia detection over time (for a predetermined time period), maintenance history for the sensor, part numbers, and user manual. In addition, if an ammonia sensor shows a reading outside a predefined ranged deemed acceptable, a warning or alert may be generated and the Agent/Employee may be notified. In addition, the icon itself may generate a label identifying the sensor with the readings outside the predefined concentration range. Additionally, the icon may allow for various alerts to be generated on the icon so that the urgency of the problem may be understood by the Employee. For example, different colors may denote different levels of urgency, such as yellow denoting a mild increase about the predefined concentration range, orange denoting a higher concentration, and red indicating a dangerously high level of ammonia detected. Of course, any color combination may be used, and other methods of identifying the urgency with the problem may be used including increase in intensity of an icon, increase in sound or frequency of an alert, or a flashing icon (with an increase in flashing frequency indicating increasing urgency). Additionally, the orienteering methods may allow for an Agent to locate the problematic sensor, either via the smart device or a heads up display associated therewith.

Similarly, this technology may be useful with detectors for carbon monoxide, fire protection leaks, fire protection water tank storage levels and/or water quality, and hazardous materials in areas such as chemical storage rooms. Many other types of sensors and processes can be monitored with using smart devices by such methods. In addition to sensors and equipment in the facility, virtual tags may allow for an Employee to locate key underground features in U/G piping, stormwater, process waste, sanitary, etc., such as turns in pipes, lift stations, manholes, etc. This would allow for isolation of the 3D model of the underground systems and display using augmented reality using a smart device or head's up display and using the location sensors to "anchor" the model so that it's always accurate.

Another example is the use of virtual or physical tags for moisture detection, such as moisture sensors in duct and pipe insulation (underside, low points, etc.), including those installed indoors or outside, that are subject to condensation and leaks. Based on active 'warnings' from the smart device, an Agent can locate the condensation issues using the orienteering methods described herein using a smart device or head's up display.

Referring now to FIGS. 16A-16G, exemplary Wireless Communication Areas (WCA) and Radio Target Areas (RTAs) are illustrated. In general, a WCA is an area through which wireless communication may be completed. A size of a WCA may be dependent upon a specified modality of wireless communication and an environment through which the wireless communication takes place. In this disclosure (and as illustrated), a WCA may be portrayed in a representative spherical shape; however, in a physical environment, a shape of a WCA may be amorphous or of changing shape and more resemble a cloud of thinning density around the edges. In general, a RTA is an area from which an energy-receiving Sensor will receive energy of a type and bandwidth that may be quantified by the energy-receiving Sensor. The RTA shape and size may be affected by an environment through which the energy must be conveyed and further effected by obstructions.

According to the present invention, a WCA and RTA may be used to provide an augmented reality user interface indicating a location of various persons within the WCA and RTA and indications of sensor readings related to those persons as well as links to further information.

Referring now to FIG. 16A, a side view illustrates a WCA 1600 surrounding a Node, such as a Smart Device 1602. Energy 1603, which is illustrated as rays, is received by one or more energy-receiving Sensors 1604 in the Smart Device 1602 (energy-receiving Sensors may also be in a Smart Receptacle associated with the Smart Device, though this is not illustrated in FIG. 16A). An exemplary ray 1603 proceeds from a position 1605 within RTA 1601 boundary to the energy-receiving Sensor 1604.

As illustrated, a portion 1601a of the RTA 1601 may flatten out in response to a ground plane, wall, partition, or other obstruction encountered. A Node 1606 may be located on or within a surface that makes up a relevant obstruction and the Node 1606 may appear to be along a perimeter of the RTA 1601. Similarly, a Virtual Tag may be associated with location coordinates that appear on or within a floor, wall, partition, or other article acting as a radio frequency obstruction and thereby appear to be a part of the obstruction, however, since it is virtual, the Virtual Tag will not effect the physical properties of the obstruction. Essentially, a Virtual Tag may have location coordinates that correspond to anywhere in the physical real-world. In some examples, a software limit or setting may limit location coordinates of Virtual Tags to some distance from a base position or a distance from a designated position, such as a location of a designated Physical Tag, Reference Point Transceiver or other definable position.

In addition to obstructions, a topography of an environment within an RTA 1601 may also limit wireless conveyance of energy within an RTA 1601 to an energy-receiving Sensor 1604. Topography artifacts may include, for example, a terrain, buildings, infrastructure, machinery, shelving or other items and/or other structures that may create impediments to the receipt of wireless energy.

Energy received 1603 into the energy-receiving Sensor 1604 may be used to create aspects of a user interface that is descriptive of the environment within the RTA 1601. According to the present invention, environmental aspects, Nodes 1606, Tags (both physical Tags and Virtual Tags) and the like may be combined with user interactive mechanisms, such as switches or other control devices built into a user interactive device, and included in a user interactive interface. For example, energy levels received into an energy-receiving Sensor 1604 may be combined with location coordinates of Physical Tags and/or Virtual Tags and a user interactive device may be positioned in an interactive user interface at a position correlating with the position coordinates and be surrounded with a visual indicator or the received energy levels.

In this manner, a single user interface will include a static image representative of received energy levels at an instance in time; a visual representation of a location(s) of Physical and/or Virtual Tag(s), and devices with user interactive functionality. In some embodiments, the devices with user interactive functionality may be positioned at a location in the user interactive interface correlating with the position(s) of the Physical and/or Virtual Tag(s).

This disclosure will discuss RTAs 1601 that are frustums of a generally conical shape, however, RTAs 1601 of other volume shapes are within the scope of the invention. For example, if an energy-receiving Sensor 1604 included a receiving surface that was a shape other than round, or had multiple receiving surfaces, each of a round or other shape, the RTA 1601 associated with such an energy-receiving Sensor 1601 may have a shape other than a frustum of generally conical shape.

Referring now to FIG. 16B, a top-down view of a RTA 1601 is depicted. A RTA 1601 will include some portion of a WCA 1600. As illustrated, the WCA 1600 includes a space with irregular boundaries encompassing 360 degrees around the Smart Device 1602. Aspects such as topography, strength of signals and atmospheric conditions (or other medium through which a wireless communication will travel) may affect and/or limit a perimeter of the WCA 1600. A location of the RTA 1601 may be referenced to determine which Tags (Physical and/or Virtual) such as node 1606 are included within an interactive user interface. Generally, preferred embodiments may only include Tags with location coordinates with the RTA 1601 in the interactive user interface. However, embodiments may include Tags external to the RTA 1601 in a particular interactive user interface.

Referring now to FIG. 16C, a side view of a WCA 1600 is presented where an energy-receiving Sensor 1604 is capable of quantifying a particular form of energy, such as a particular bandwidth of energy received from a user selected RTA 1607. A Smart Device 1602 may incorporate or be in logical communication with multiple energy receiving devices 1604, each energy receiving device capable of quantifying a limited energy spectrum in an environment defined by the RTA 1607 selected by the user.

Some embodiments include a RTA 1607 that varies according to a type of energy receiving device 1604 receiving a corresponding type of energy. For example, an energy-receiving Sensor 1604 that receives energy in a lower bandwidth may have an RTA 1607 that extends a greater distance than an energy-receiving Sensor 1604 that receives energy in a higher bandwidth. Similarly, some energy-receiving Sensors 1604 may be effected by forces outside of the RTA 1607, such as a magnetometer which may be sensitive to signal interactions around all of the WCA 1600, and a RTA 1607 associated with a magnetometer may accordingly be the same as the WCA 1600.

By way of non-limiting example, a RTA 1607 for a CCD-type energy receiver may be represented as a frustum with an expansion angle of approximately 60 degrees in shape. Accordingly, the RTA 1607 subtends only a portion of the universal WCA 1620.

Referring now to FIG. 16D, a top view of a WCA 1600D is illustrated with a RTA 1607A comprising a frustum with an expansion angle of approximately 60 degrees. A Smart Device with an energy receiver 1602 that quantifies a specified bandwidth of energy from the RTA 1607A may generate a user interface with an image based upon energy quantified from RTA 1607A.

In FIG. 16D, the WCA 1600D is represented as a spherical area. A WCA 1600D may be designated that is less than an entire area of possible radio communication using a specific designated wireless communication modality. For example, WCA 1600D may be spherical and stay within boundaries of a modality based upon a UWB wireless communication protocol.

A user interface based upon quantified energy in an RTA 1607, 1607A, may present a representation of energy within the respective RTA 1607, 1607A as quantified by an energy-receiving Sensor 1602. Energy levels of other three-dimensional spaces within the WCA 1600 may be quantified by energy receivers and presented in a user interface by directing energy from a selected three-dimensional space into the energy receivers and thereby defining a different RTA. In this manner, energy levels may be quantified from essentially any area within the WCA 1620 and represented as part of a user interface. Quantified energy levels may vary based upon a receiving Sensor. For example, a CCD Sensor may quantify visible light spectrum energy, and a LIDAR receiver a broad spectrum, an infrared receiver may quantify infrared energy levels, and energy-receiving Sensors. A particular feature present in a particular portion of the electromagnetic spectrum quantified by an energy-receiving Sensor may have a unique physical shape which characterizes it and which may be associated with a corresponding virtual-world aspect and Tag associated with the location.

In some examples, as has been described, quantification of energy levels associated with aspects of the physical world may be for one or more of: characterizing an RTA 1607, 1607A by quantifying energy levels and patterns existing at an instance in time, determining a location and/or orientation of a Smart Device 1602 or other Node, such as node 1606; and verifying a location and/or orientation of a Smart Device. In some examples, energy levels associated with aspects of the physical world may be communicated by the Smart Device to a remote controller for further processing, and the remote controller may communicate information back to the Smart Device or to another user interface. Information communicated from the controller may include, for example, an orientation of physical and/or virtual aspects located within the universal RTA in relation to the Smart Device; quantified energy indicating of or more of: a topographical feature, a surface temperature, a vibration level, information associated with a Virtual Tag, information associated with a physical Tag, sensor data, or other information associated with the RTA 1607A.

A view of a Radio Target Area 1607A may be a relatively small portion of the entire WCA that surrounds a Smart Device. An area of energy to be quantified by a sensor (sometimes referred to herein as the Radio Target Area) may be displayed surrounded by the WCA 1630.

Figure 16E:
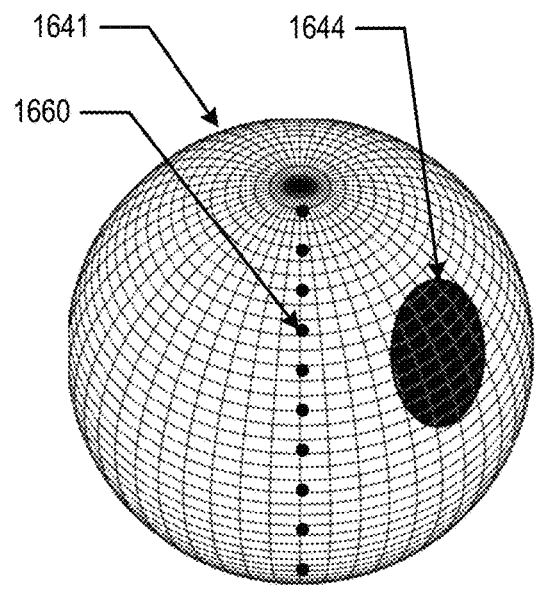

Referring now to FIG. 16E, an exemplary presentation of a RTA 1644 superimposed upon a representation of a WCA 1641 is illustrated. The WCA 1641 is illustrated with a perspective view of a spheroid with an alignment feature 1660 such as a spheroid dividing arc, or a line. A blackened ellipsoid feature is a representation of the RTA 1644 associated with a particular Smart Device which would be located at a center of the spheroid WCA 1641. If desired, one or more energy receiving devices associated with or incorporated into a Smart Device may be repositioned or have a changed orientation in space to ultimately scan all of the accessible universal Radio Target Area space.

Figure 16F:
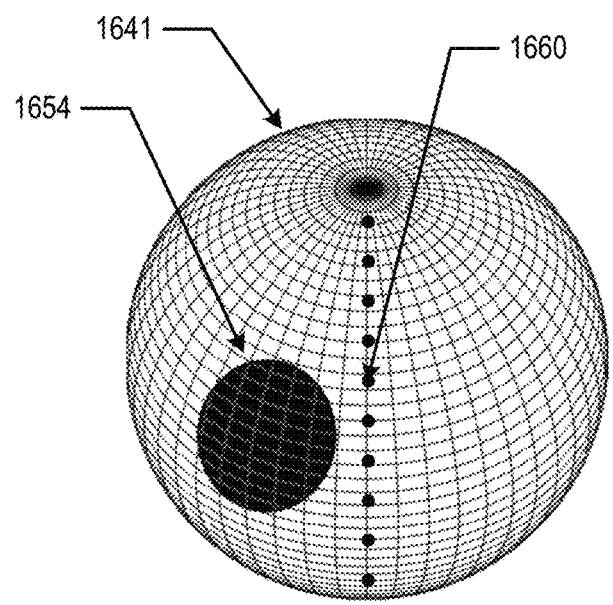

Referring to FIG. 16F, an illustration of how moving the one or more energy receiving devices around in space may alter an area defined as the RTA 1654. The same orientation of the universal WCA 1641 may be noted by a same location of the alignment feature 1660. Relative movement of the ellipsoid feature illustrates a change in an area designated as RTA 1654.

Figure 16G:
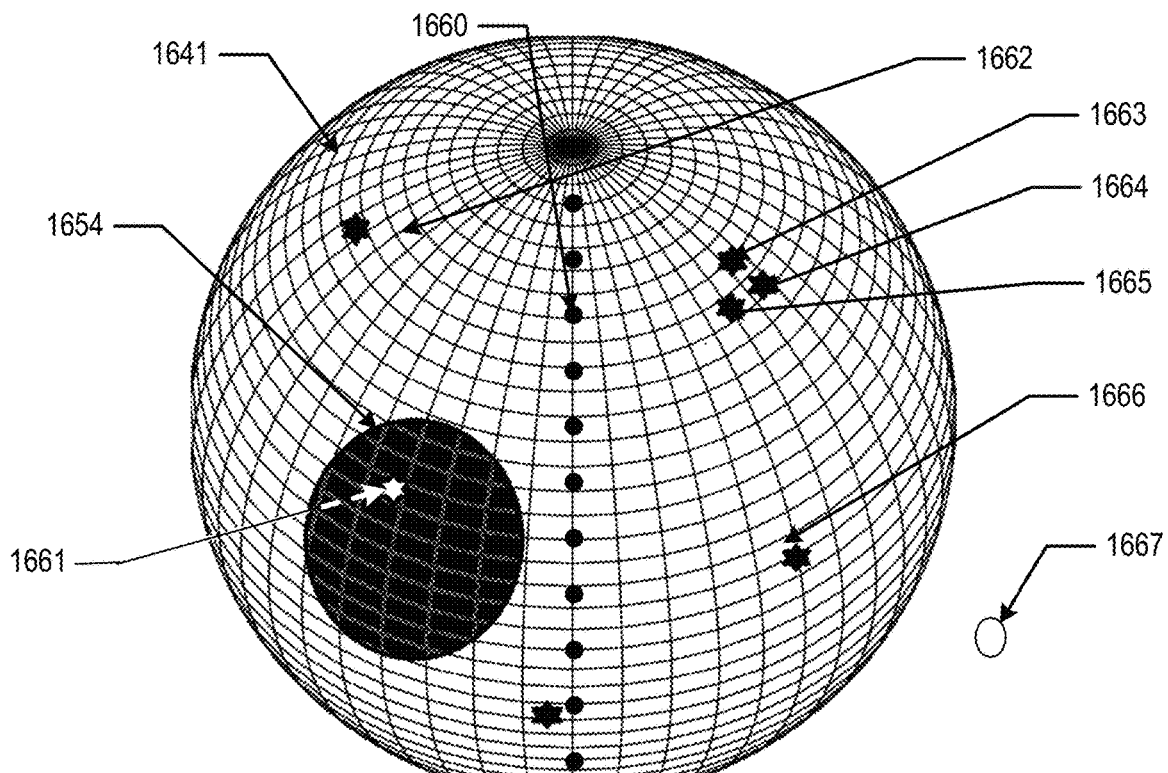

Referring to FIG. 16G, an illustration of adding Tag locations (which may be Physical Tags or Virtual Tags) to a mapping of the WCA 1641 is provided. A Tag may be represented in the WCA, for example, as an icon (two- or three-dimensional) positioned in space according to a coordinate system, such as Cartesian coordinates, polar coordinates, spherical coordinates or other mechanism for designating a position. Coordinates may specify one or both of physical real-world Tags and Virtual Tags.

A location of a real-world Tag or Virtual Tag may be in either RTA 1661, the WCA 1641 or external to both the RTA 1661 and the WCA 1641. Examples of Tags outside the RTA 1661 and within the WCA 1641 include Tags 1662-1666. An example of a Tag in the device RTA is Tag 1661. A Tag located external to of the WCA 1641 and the RTA 1661 includes Tag 1667.

In some examples, a display on the user's Smart Device may illustrate image data captured via a CCD included in a Smart Device. Portions of the image data captured via a CCD may be removed and replaced with an icon at position correlating to a position in space within the RTA 1661. The icon may indicate of a Tag 1661 located within the RTA 1661, or at least the direction in the RTA 1664 along which the Tag 1661 may be located at an instance in time. In addition, an area of a user interface portraying the Icon may user interactive device such that when the device is activated, the Smart Device is operative to perform an action.

The actual positions of the Tags in real-world space (or the digital equivalent in the real-world space) may be stored and maintained in a database. Positions of physical Tags may be determined via techniques based upon wireless communication and be updated periodically. A period of update may be contingent upon variables including, user preference, Tag movement, change in environmental conditions, User query or other variable that may be converted into a programmable command. In another example of some embodiment, an Agent may interact with a user interface and understand the presence of Tags that are outside of the RTA 1661 and adjust one or both of a position and direction that the Smart Device to cause the Smart Device to be positioned such that the RTA 1661 encompasses a position of the Tag of interest.

Figure 17A:
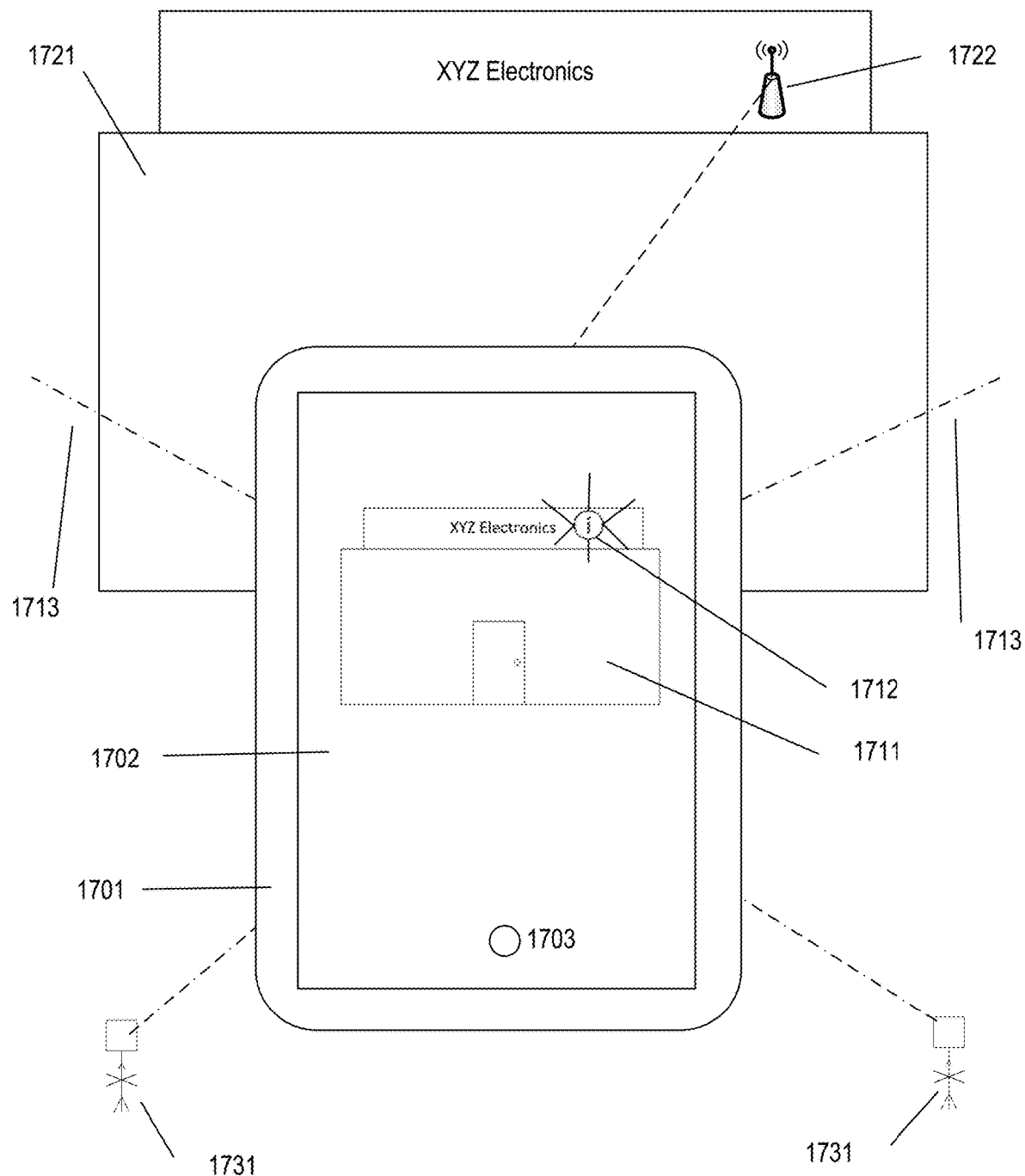
FIGS. 17A-17C illustrate additional aspects of information display.

Referring to illustration FIG. 17A, an exemplary apparatus for effectuating the methods described herein is shown, wherein Smart Device 1701 has within its Radio Target Area a Structure 1721. Smart Device 1701 may display a user interface 1702 based upon data generated by an energy-receiving Sensor 1703 incorporated into the Smart Device or operative in conjunction with the Smart Device 1701. The energy-receiving Sensor 1703 may produce data representative of an area from which the energy-receiving Sensor 1703 received energy. A user interface 1702 may be generated that is based upon relative values of some or all of the data produced by the energy-receiving Sensor 1703.

Smart Device 1701 may have its position and direction determined using the orienteering methods described herein, with reference to Reference Point Transceiver 1731. The position may be determined relative to a Base Node, which may operate as an origin in a coordinate system associated with Structure 1721 and its surroundings. The position-determination step may be aided with reference to transmitter 1722, which in some embodiments, may be a Reference Point Transceiver. In this example, transmitter 1722 is positioned proximate to the Structure 1721.

A receiver on Smart Device 1701 may be operative to receive a wireless logical communication from transmitter 1722. This communication may be in one of a variety of modalities, such as Bluetooth, ultra-wideband, radiofrequency, etc. Based upon the signal, Smart Device 1701 may transmit to a server, a database query based upon a determined set of coordinates of transmitter 1722.

If the database contains an entry comprising, as a data structure, a set of coordinates proximate to the set of coordinates of transmitter 1722, then Smart Device display 1702 may display icon 1712 proximate to the location of transmitter 1722, as displayed on Smart Device display 1702, or otherwise on the virtual representation of the shop 1711. In this way, a user of Smart Device 1701 may be alerted to the presence of information associated with structure 1721 in which the user may be interested.

In some embodiments, icon 1712 may be displayed on Smart Device display 1702 only if Smart Device 1701 can transmit appropriate permissions to the database. For example, icon 1712 may only display if Smart Device 1701 is on a certain Wi-Fi network or if the user of Smart Device 1701 has input the appropriate credentials. In other embodiments, icon 1712 may display on any Smart Device display 1702 (if the Radio Target Area Cone 1713 includes transmitter 1722), but further functionality may be based upon inputting a password (or, in some embodiments, correctly input the answer to a question).

In some embodiments, the appearance of icon 1712 may change based upon an identity of the user or based upon some other dynamic. For example, if the user has a certain UUID, and the database includes a message specifically intended for a user with that UUID, then the icon may flash to indicate the presence of a message. This message may be displayed textually, visually, audibly, or by a hologram. Similarly, the database may record each instance in which it is accessed by a query from a Smart Device. Such a record may include a time stamp. If data related to structure 1721 has changed since the last time stamp, then icon 1712 may turn red (for example) to indicate such a change. In addition, digital content may be appended to any content already in the database, such as additional alphanumeric annotation, an audio file, an image file, a video file or a story file.

Activation of an interactive user device encompassing icon 1712, additional functionality may be provided to the user of the Smart Device 1701. For example, selecting icon 1712 may display information about Structure 1721, such as shop hours or discounts. Alternatively, activating the interactive user device associated with icon 1712 may generate a control panel, which may allow the user to control aspects relating to sensors or other electronics within structure 1721. For example, upon confirmation that Smart Device 1701 has the appropriate permissions, selecting icon 1712 may allow the user to turn off the lights within structure 1721.

The Smart Device 1701 may also display other functional buttons on its display 1702. In some examples, one such function may be to show displays of the sensor RTA 1713 in the context of the universal Radio Target Area surrounding the user. By activating the functional button, the user may be presented with a set of options to display the universal Radio Target Area.

Figure 17B:
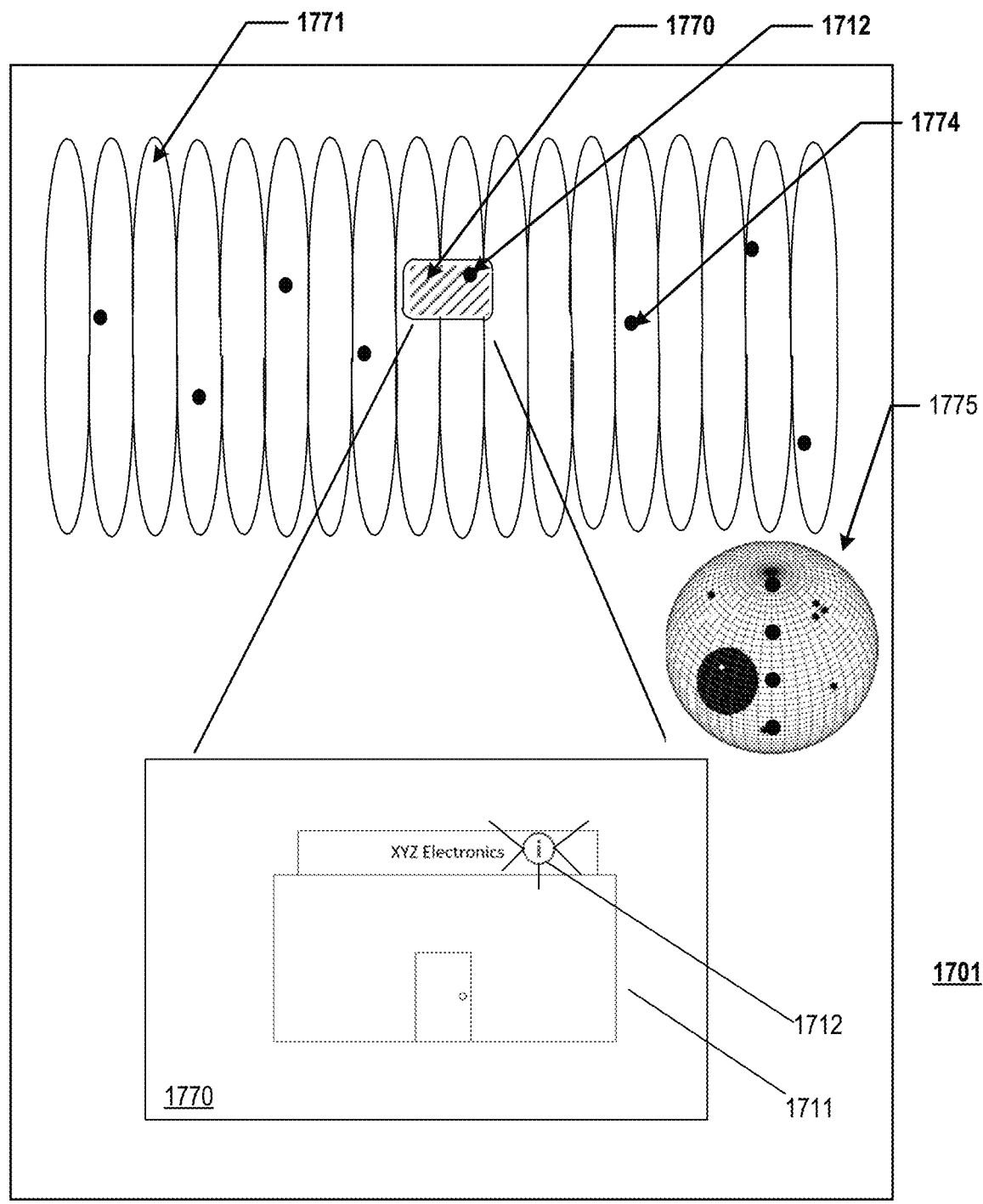

Referring to illustration FIG. 17B, an example of a means of illustrating a RTA 1770 is provided. The display screen of the Smart Device 1701 may display a number of information components. A similar illustration as FIG. 16G may be included as inset 1775. However, a different illustration of the RTA 1770 may be formed by flattening the surface of the illustrated sphere into a flat depiction where each of the surface regions may be flattened into a segment 1771. The RTA 1770 may be illustrated on the flat segments. A Tag or icon 1712 may be located within the device RTA 1770 showing structure 1711. The icon 1712 may also be included in the real time display of a representation of data generated by an energy-receiving Sensor. Tags may also be located outside of the RTA 1770. An Agent may move around the Smart Device to locate an RTA that encompasses Tag 1774.

Figure 17C:
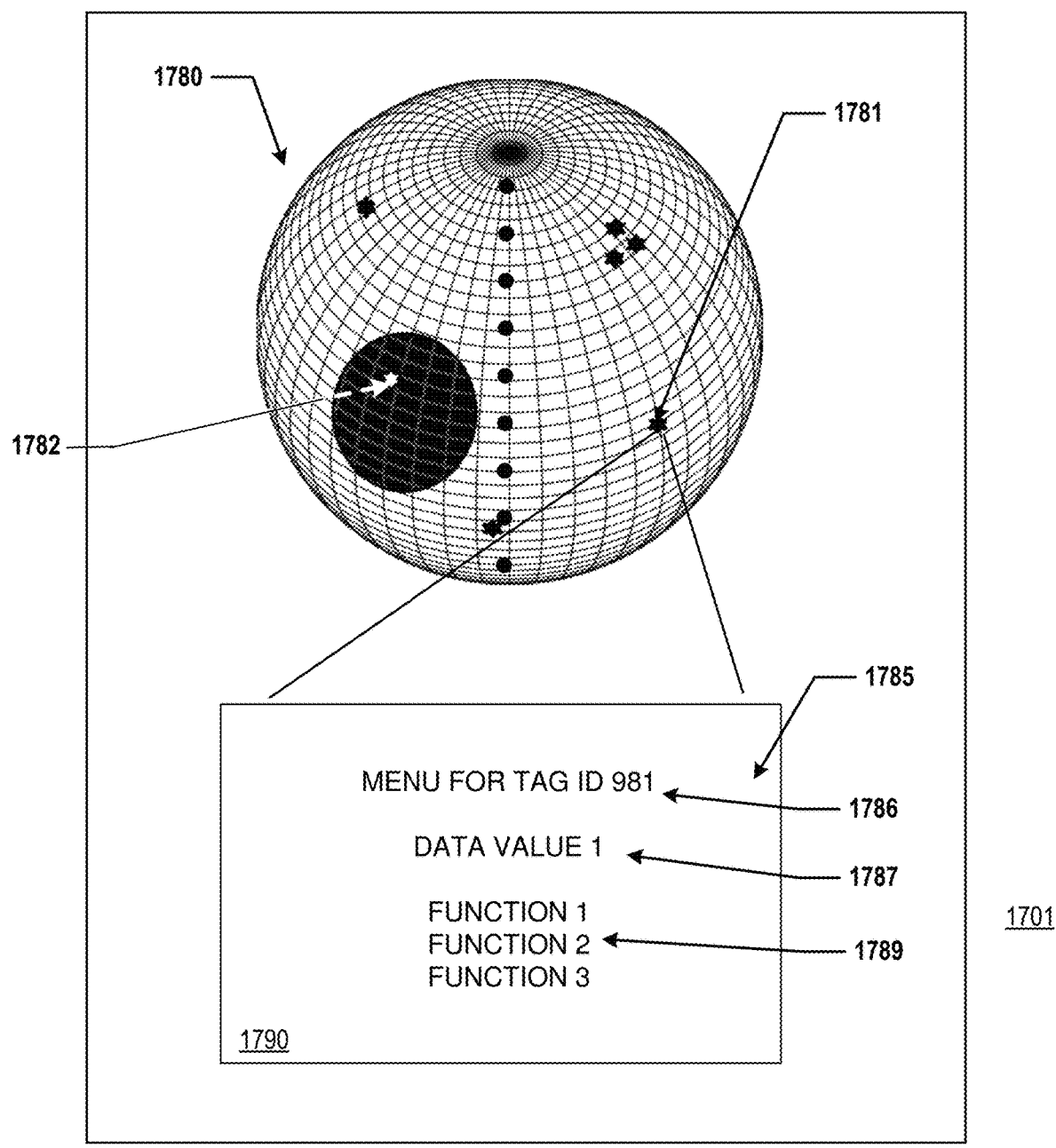

Referring to FIG. 17C, item 1780, an exemplary display screen 1790 for Smart Device 1701 that may be displayed when a user activates a Tag at a location outside the RTA 1782 is illustrated. When the user activates the exemplary Tag 1781, a menu 1785 may display. Amongst the various information such as text, imagery, video content and the like that may be displayed an identification of the Tag 1786, associated textual information and data 1787 as well as functional buttons 1789 may be displayed on the user interface and may be used by the user to activate additional function including new display layers, content integration and control function such as in a non-limiting sense a control to revert to a previous menu display.

Environmental Control Systems and Methods

The foregoing has been illustrative of the location, position, and direction of interest being determined by the methods and apparatus above. Additionally, the objects or persons may be identified and located by a physical tag or a Virtual Tag. However, it may also be desirable to know the environmental conditions throughout the facility, and as such be able to correlate object location with the environmental conditions at that location.

A first aspect of the Environmental Control System is the creation of a three dimensional (3D) environmental profile, whereby an environmental parameter of interest is detected throughout a 3D space in the Facility. Any suitable environmental parameter can be monitored in this fashion, but as an example, the creation and monitoring of a 3D temperature profile will be discussed. Creating a 3D temperature profile in the cold storage space may be accomplished by any suitable means.

Figure 18:
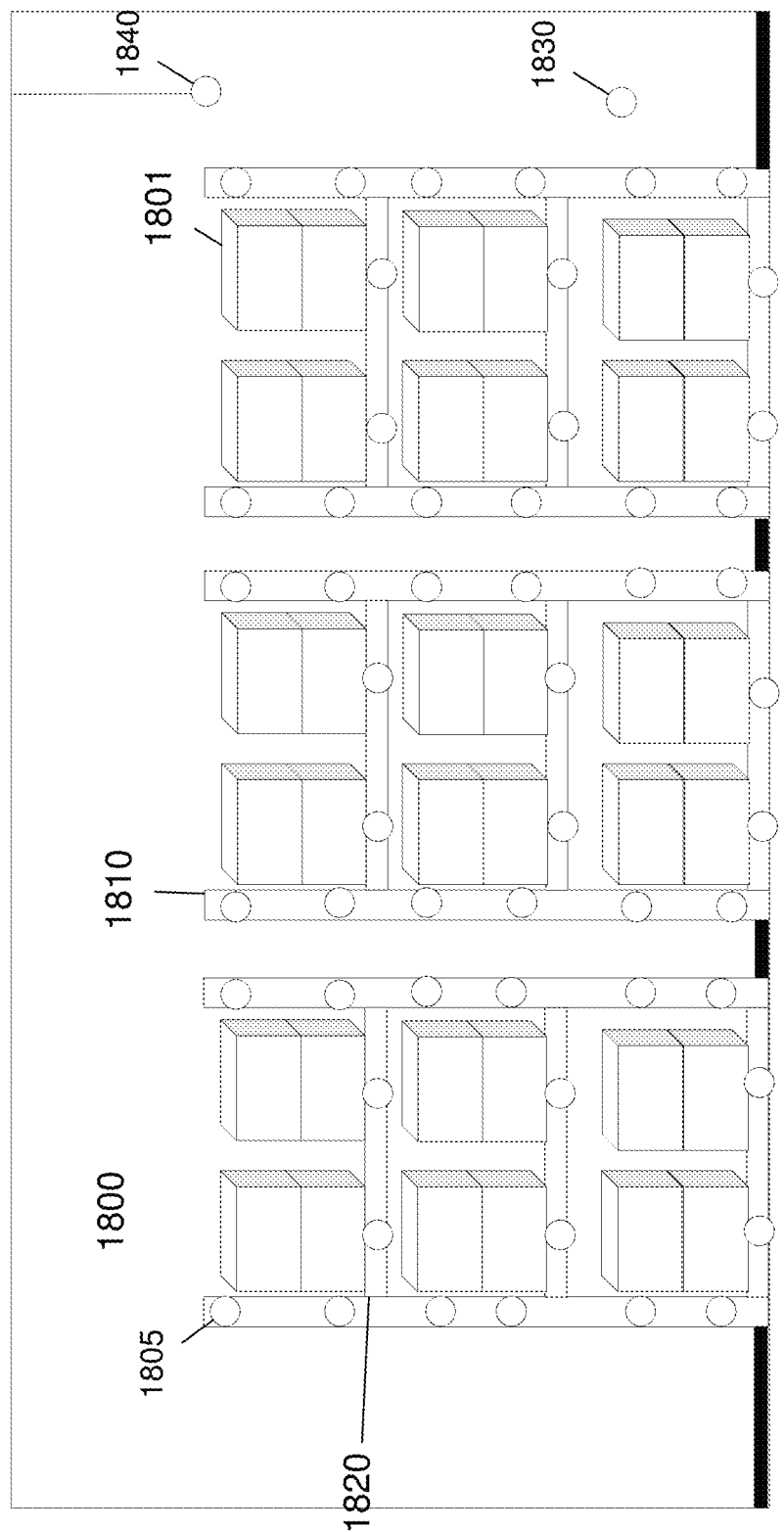
FIG. 18 illustrates a temperature sensor mesh which may be used to create a 3D temperature profile in some embodiments of the invention.

One approach for creating a 3D temperature profile is to install temperature sensors throughout the space, thus creating a "temperature mesh" which can be extrapolated to create a 3D temperature profile. Referring to FIG. 18, a Cold Storage Facility 1800 that includes products 1801 may include temperature sensors 1805 on the scaffolding 1810, on pallets 1820, on other surfaces 1830 such as walls and floors, and/or suspended 1840 in the air. Additional sensors may be worn by employees, for example, on the front of a hard hat. The data regarding temperature over time for each sensor may be transmitted to the system's controller, which may allow for the system to create a 3D profile of the area by extrapolating the data between sensors. Known methods for extrapolating data including those which take into account air flow, humidity, and the like, may be used to create the 3D temperature profile. The same approach could be used, for example, with moisture sensors so that data from a plurality of moisture sensors may be extrapolated to create a 3D moisture/humidity profile. Other environmental sensors (e.g., light, air flow, vibration, etc.) may be also be used to create 3D profiles in a similar manner. In some embodiments, a mesh of barometric or air flow sensors may be situated throughout a portion or all of the Facility, whereby the barometric pressure or air flow measurements may be extrapolated to create a 3D pressure profile in the Facility, which may provide additional information regarding air flow in the Facility.

Figure 19:
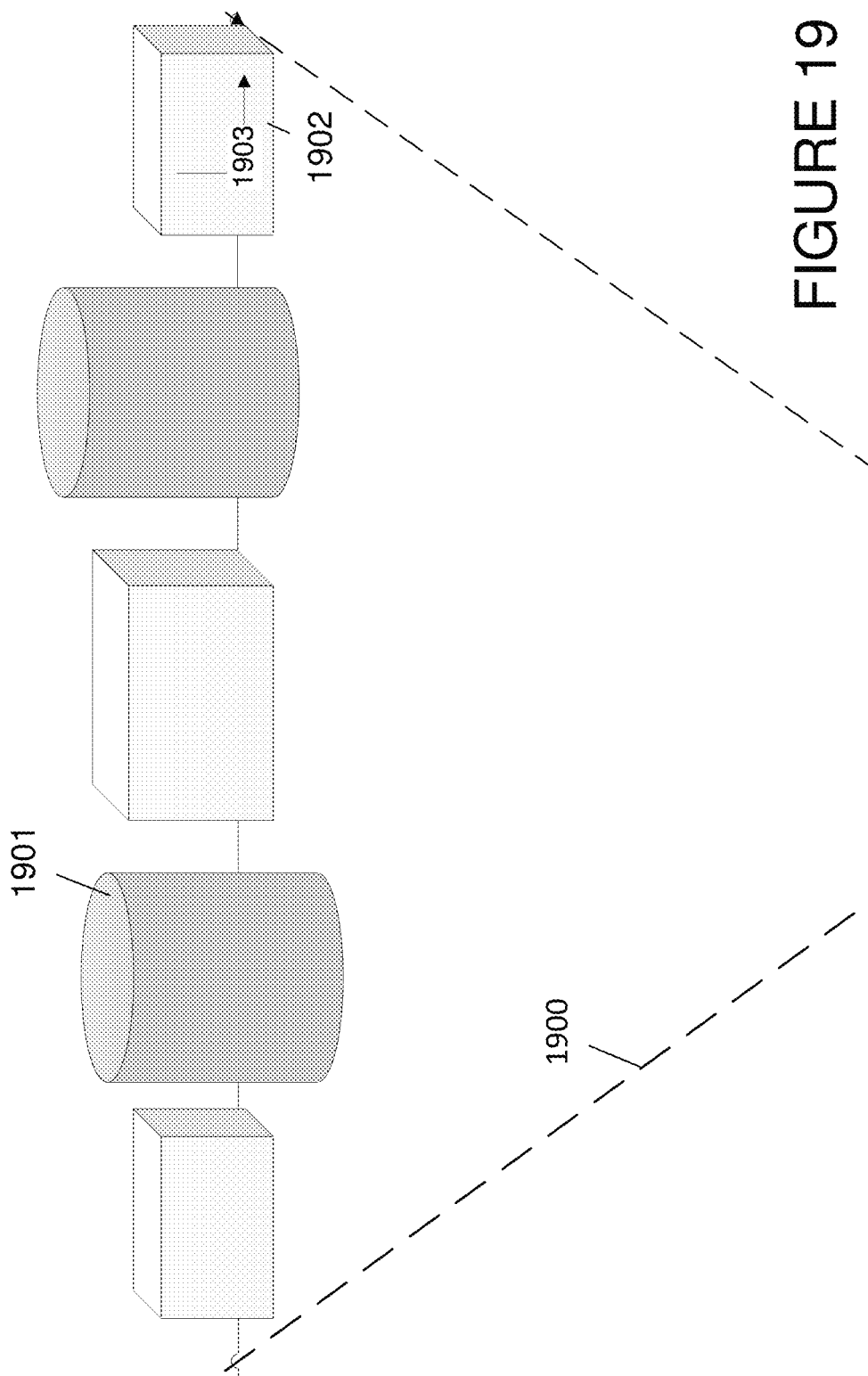
FIG. 19 illustrates how a thermal imaging scan may overlay on a LIDAR image.

Another approach to creating a 3D temperature profile is to overlay a positioning or visualization rendering (e.g., from LIDAR) with a temperature profile obtained with a scanning technology such as thermal infrared imaging. Any suitable way of creating the positioning or visualization rendering, including video methods, may be used. However, as an example, LIDAR will be discussed. In some embodiments, referring to FIG. 19, in some embodiments, a LIDAR detector and thermal imaging device (not shown) may have a same or overlapping Field of View 1800. As such, both the LIDAR detector and the thermal imaging device may capture different information about the same geospatial location. For example, as shown in FIG. 19, the Field of View may include one or more objects 1910. The LIDAR sensor may determine the shape and distance of each object in the Field of View and transmit that data to the control system. The thermal imaging device may detect difference in temperature throughout the Field of View and transmit that data to the control system. The control system may then overlay the thermal imaging data on the LIDAR scan image to create a 3D temperature profile. As such, temperature gradients 1920 may be visible on the objects. This process may be iterative whereby the measurements of the same area may be obtained using different Field of Views so as to better capture the dimensionality of the resulting images.

Figure 20:
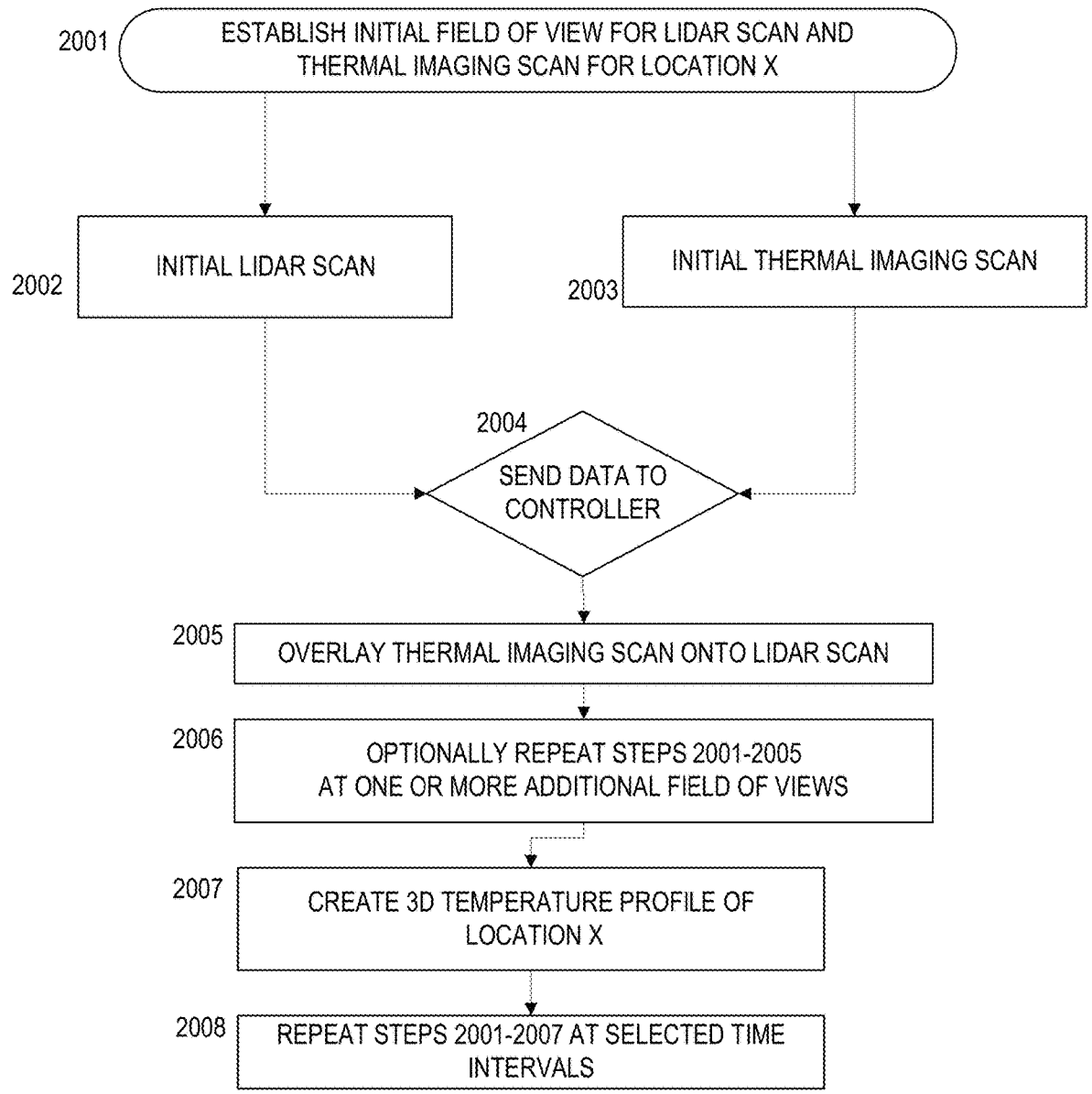
FIG. 20 is a flowchart providing method steps for overlaying thermal imaging with LIDAR to generate a 3D temperature profile.

An exemplary method is shown in FIG. 20. In step 2001, an initial field of view for a LIDAR and thermal imaging scans is established for a particular location (here, Location X). In step 2002, a LIDAR scan is generated, and in step 2003, a thermal imaging scan is generated. In step 2004, both scans are transmitted to a controller in a control system. In step 2005, the thermal scan is overlaid onto the LIDAR scan to provide a 3D view of the thermal imaging data. In order to improve the quality of the 3D temperature profile, scans may be repeated at the same or at different field of views (step 2006). This data may be evaluated and combined to create the 3D temperature profile of Location X (step 2007). These steps may be repeated at select/predetermined time intervals in order to evaluate the temperature profile of Location X over time (step 2008). Thus, the temperature of the 3D space of Location X may be monitored over time. The 3D temperature profile may be created at any suitable interval, such as, for example, each millisecond, second, or every 1, 2, 3, 5 or 10 minutes. The length of the time interval may depend on the sensitivity of the items in the cold storage space and the particular temperature profiling system used, among other factors.

Figure 21:
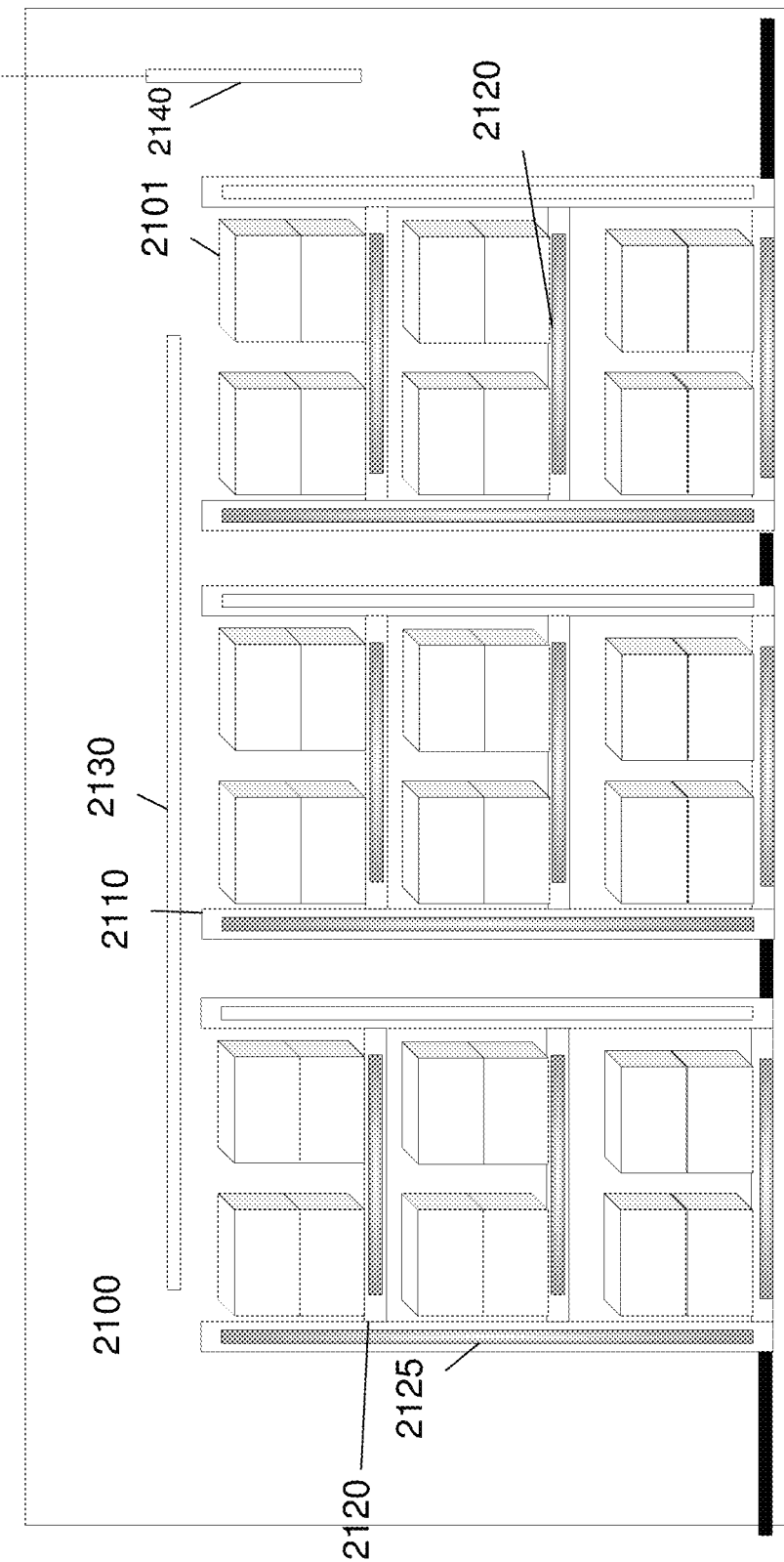
FIG. 21 illustrates how temperature sensitive materials may be used to enhance thermal imaging data.

In some cases, in order to better visualize the change in temperature at certain locations, "temperature sensitive materials," or TSM, which are materials having a low specific heat capacity, may be added to portions of the warehouse structures, including on walls, scaffolding, pallets, and the like. The low specific heat materials change temperature relatively easily and so smaller changes in heat may more greatly affect the temperature of such materials. Thermal imaging devices measures the amount of infrared radiation emitted from an object, and an increase in temperature will increase the amount of emitted radiation that the thermal imaging sensors may detect. Thus, materials that change temperature more easily make it easier for the scans to determine smaller fluctuations in heat at a particular location. This addition of TSM into portions of the warehouse, pallets, and the like, may be particularly useful when the product packaging has a high specific heat and so does not significantly register changes in heat fluctuations in the warehouse. FIG. 21 illustrates a portion of a cold storage warehouse 2100 that includes scaffolding 2110 and pallets 2120 and stored items 2101. The TSM 2125 may be present on the scaffolding 2110, the pallets 2120, on other surfaces 2130, and/or suspended 2140 in the air.

A number of configurations would allow for the LIDAR and thermal imaging scans to be obtained throughout the Facility. LIDAR and thermal imaging devices may be placed throughout the Facility in addition to or as part of a Node or Smart Device. The information from each scan may be transmitted via Nodes, Smart Devices, or other transceivers to the environmental control system so that the 3D temperature profiles may be generated and combined to provide a 3D profile of the space as a whole. Since some of the transmission and reception frequencies may overlap, may be close to overlapping or may have harmonics or subharmonics that overlap with other base transmission frequencies, it may be desirable that a transmission controller may multiplex the signals to the various components to ensure that the transmissions do not interfere with each other.

The 3D temperature (or other environmental parameter) profile allows every part of the Facility (that is monitored using the system) to have a temperature history. Using the methods described above using physical and virtual tags, the location of each object, including products, can be determined over time. Combining the two sets of information, the Environmental Control System can determine the environmental condition of each object over time.

While the temperature control system may be used to track the temperature of each product as it proceeds through its storage lifecycle, the temperature control system may also have additional features that allow for the control system to optimize cooling within the cold storage space. For example, the 3D temperature profile of the Facility, or a portion of the same, may be monitored before, after, or during certain Action Events, which are actions in or concerning the Facility that may have an effect on the environmental conditions in the Facility.

In some embodiments, the environmental control system identifies an Action Event related to the Facility and correlates the Action Event with an increase or decrease in temperature in one or more areas (also referred to as zones) in the space. For example, the environmental control system may be in electronic communication with a sensor at a bay door and determine via the sensor that the bay door has been opened. The environmental control system may monitor changes in that area, or throughout the Facility, to assess the effect of the bay door opening on environmental conditions in the Facility. As another example, the environmental control system may compare changes in humidity in the Facility based on the type or amount of goods being stored at a specific time. Correlating Action Events with changes in the environment in the Facility may allow for optimization of heating, cooling, or other cycles in the Facility. In addition, the HVAC system may intermittently run cycles in the cold storage space for heating/cooling the room. The temperature control system may be in electronic communication with the HVAC system to determine that effect of any particular cycle or time of cycling. Such correlation may allow for optimization of timing and cycling of the HVAC system. Another Action Event is a change in the position of pallets. A concentration of colder items in a particular space may decrease the temperature near those items, or the configuration may change the air flow in the space.

In some embodiments of the invention, if a temperature in a particular area of the Facility exceeds a certain temperature, the temperature control system will initiate an influx of cooler (lower temperature) air in or near that area. The amount and position of the influx of cooler air may depend on both magnitude of temperature increase and the location of the temperature increase. For example, an influx of cooler air may be provided directly to a position within or adjacent to the detected warmer temperature. Alternatively, because heat rises, the influx of cooler air may be provided to an area above where the increase in temperature is located. The temperature control system may alternatively or additionally extract (via vacuum or other methods) a portion of air (e.g., a portion of warmer air) in the room. Again, the system may extract air in the area of the warehouse that has the temperature above a certain threshold or may extract air in another portion of the cold storage space. This may likewise be performed if a temperature is too low, whereby an influx of warmer air may be provided to the area or cooler air may be extracted. The environmental monitoring may allow for experimentation as to where the influx of air is most efficient, and where a return duct is best located. Additionally, determining where to locate of fans in the Facility may be determined.

In addition to analysis and optimization, the environmental control system may identify problematic areas so that timely action may be taken to protect product quality. For example, if a temperature exceeds a certain temperature (or, for example, moisture levels exceed a certain amount), an alarm may be generated to at least one Smart Device or Node. Alarms include both visual alarms (such as on user interface) and audible alarms. In some cases, an alarm may be generated if a certain area exceeds a specific temperature for more than a predetermined number of minutes. Other environmental parameters falling outside predetermined ranges, such as light or vibration, may also act to initiate alarms.

Using Location and Environmental Control Systems in Cold Storage Applications

As described above, the location and position of any Agent or item in the Cold Storage Facility can be known provided that a physical tag (e.g., Node or Smart Device) and/or Virtual Tag is correlated with each. Additionally, the environmental history of the Agent or item can be determined according to methods described herein. Such use of location and environmental tracking will now be described to explain how the location and environmental conditions of products may be monitored throughout their storage life cycle in the Facility.

Figure 22:
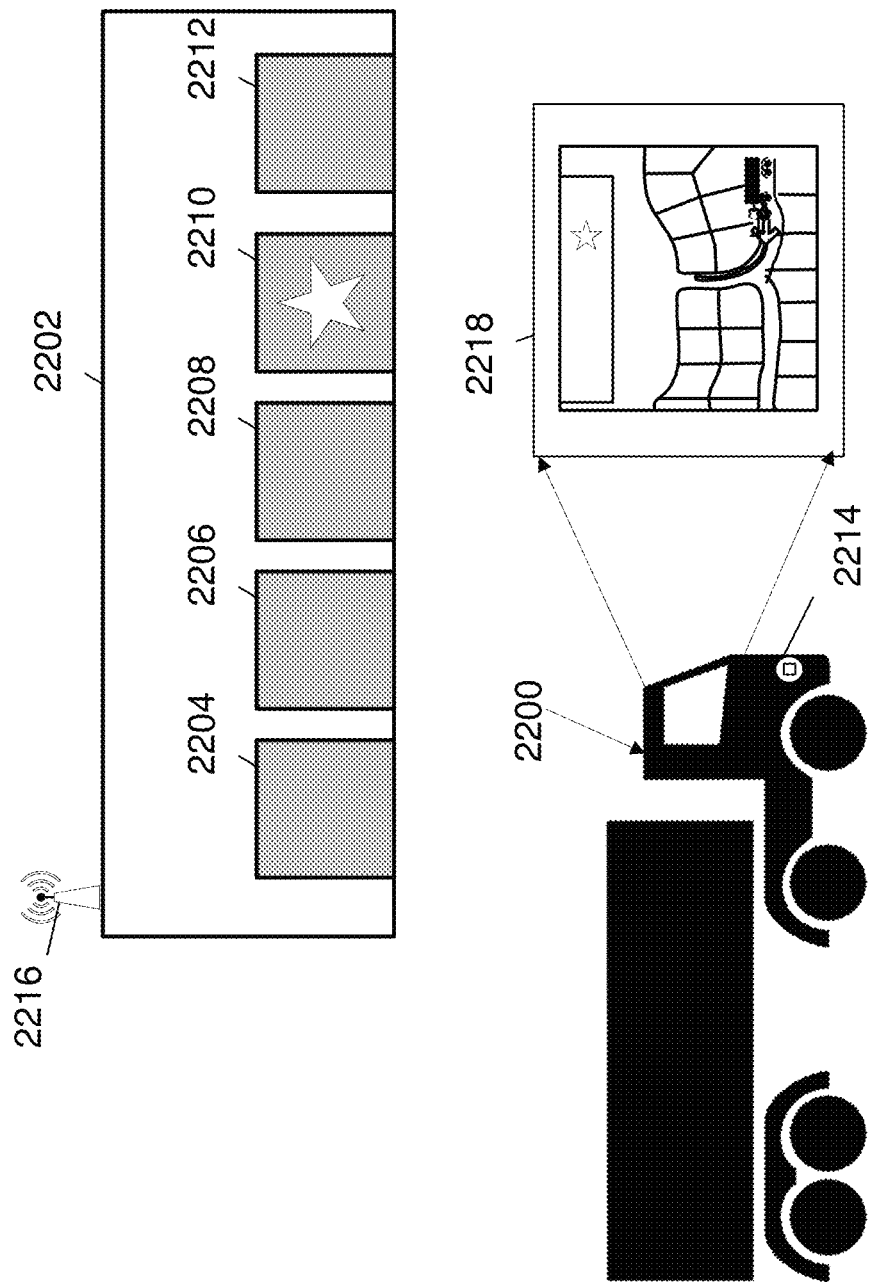
FIG. 22 illustrates methods of locating the correct delivery location using method embodiments of the invention.

First, the arrival of a product to a cold storage facility will be described. A delivery driver may locate the Property on which the Cold Storage Facility sits and be routed to the Property using conventional methods such as GPS. Once approaching the facility, more specific positioning methods may be used to identify the appropriate location for drop off of the contents (e.g., one or more pallets of products). Referring to FIG. 22, a delivery truck 2200 may approach a Cold Storage Facility 2202, which has a series of possible delivery locations therein such as delivery bays 2204-2212. The driver or truck may have a physical locating tag including a Node 2214 to identify a particular truck, which may thus, identify a particular delivery of goods. In some embodiments, the Node may be associated with a unique ID that can further identify the truck, driver, and/or products. The Node 2214 may be used to track the driver's route to the Cold Storage Facility 2202. Additionally, as the delivery truck 2200 approaches the Facility 2202, the Node 2214 may communicate with one or more Nodes 2216 at (or in communication with) the facility, which may thus guide the driver in the delivery truck 2200 via a Smart Device or a heads-up display 2218 to the correct location for unloading the particular products. In some cases, when the truck with the Node 2214 thereon approaches the Facility 2202, the unique ID from the driver/truck provides a permission for the truck to enter the premises and/or provides coordinates or directions to the Smart Device or heads up display 2218 of the driver to provide authorization and directions to the appropriate drop off location, such as delivery bay 2210. Once arriving or approaching the correct drop off location, the driver may also transmit to the one or more Nodes 2216 at the warehouse a notice that the products are being delivered so that appropriate personnel may automatically be dispatched to the correct location (here, delivery bay 2210) to unload or otherwise process the delivery.

Figure 23:
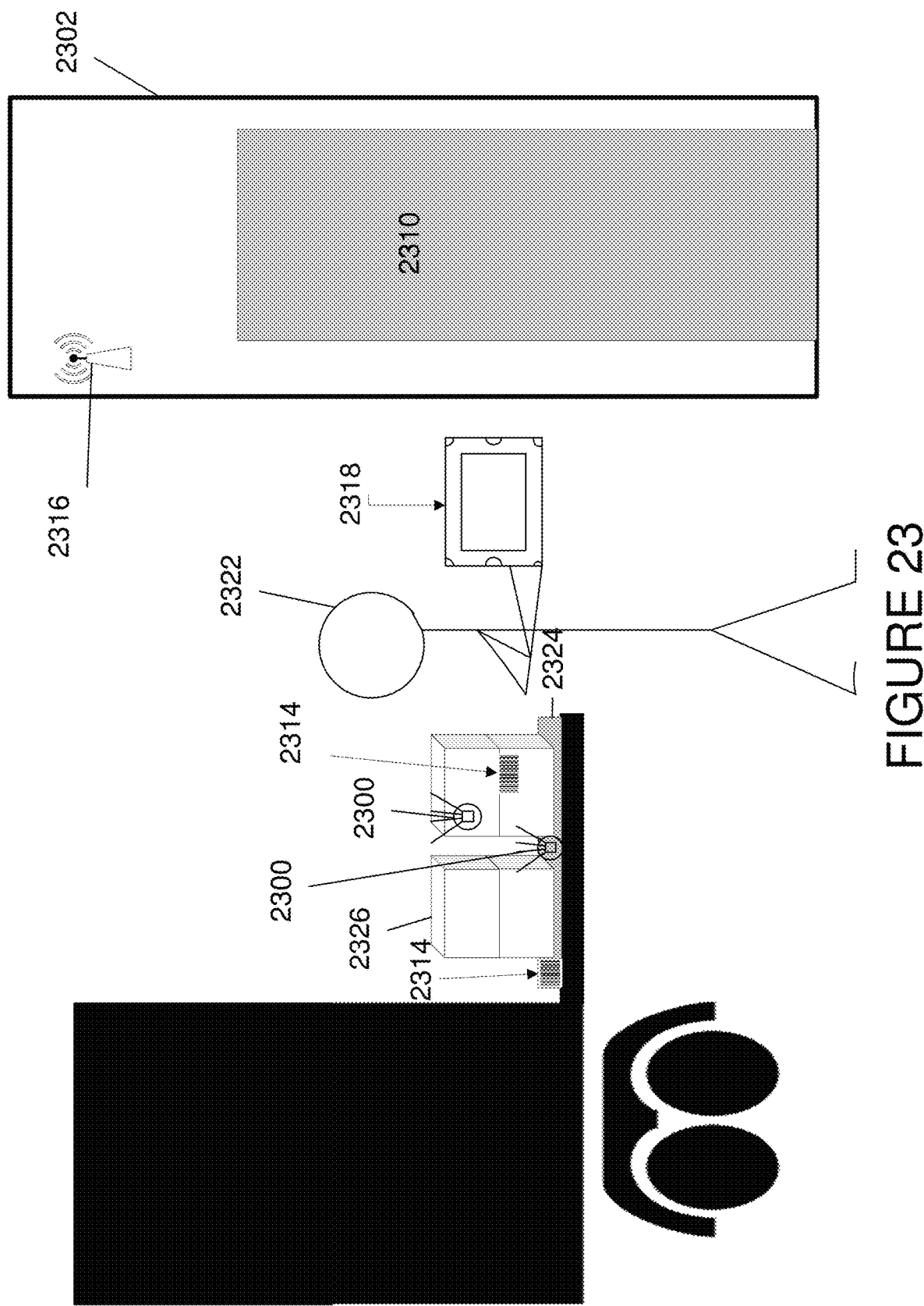
FIG. 23 illustrates the use of physical tags, Nodes, Smart Devices, and virtual tags in tracking products upon delivery.

Referring to FIG. 23, once the delivery truck arrives to the correct delivery bay 2310 at the Facility 2302, personnel may be prepared to unload. In some embodiments, the signal sent from the truck's Node to the warehouse Node identified the products to be unloaded at the delivery bay 2310. Thus, an Employee/Agent 2322 at the delivery bay 2310 may have a Smart Device or heads up display 2318 that identified the products to be unloaded. Each pallet 2324, and in some cases, each product 2326, on the delivery truck 2300 may have a Node 2314 or physical tag thereon identifying the product and providing any manufacturing, history, or other data about the product 2326. Examples of physical tags 2314 include RFID, hash or barcode labels. The physical tag 2314 may be assigned to the pallets 2324 and/or products 2326 thereon. Such physical tags 2314 may be scanned by the Employee 2322 to confirm the identity of the products 2326 and such information may be transmitted to one or more Nodes 2316. The Employee may further create a virtual tag 2320 identifying the pallet 2324 and/or product 2326, wherein the virtual tag 2320 identifies the location of the pallets 2324 and products 2326 at that time and transmits the information to the one or more Nodes 2316. Additionally, the Smart Device 2318 may interact with one or more Nodes in the delivery truck to ascertain the temperature of the storage container in the truck throughout delivery, or at delivery. This temperature information may then be attached to the products during their storage in the Cold Storage Facility as an initial temperature.

The pallets 2324 and/or products 2326 may then be transported to a secondary location within the Cold Storage Facility 2302, for example via a transport (not shown) such as the forklift. The orienteering methods described herein may direct the driver of the transport to the appropriate location within the Cold Storage Facility 2302 using, for example, a Smart Device 2318 and/or a heads-up display (not shown). When a pallet 2324 or product 2326 is loaded onto a transport, a Smart Device 2318 on the transport may identify the pallet 2324 or product 2326 based on identifying the Virtual Tag 2300 in its Field of View, interacting with a Node on a pallet or on the delivery truck, or by scanning a physical tag 2314. The Smart Device 2318 on the transport may then correlate the movements of that product/pallet 2324/2326 with that of the transport as it moves throughout the Facility 2302 until the product/pallet 2324/2326 is relocated to a second location. The Smart Device 2318 may transmit the information about the pallet/product 2324/2326 as it is transported through the Facility 2302 to the Warehouse Management System or a separate database, thereby providing information about where the pallet/product 2324/2326 moved through the Facility 2302 and the environmental conditions throughout, as will be discussed in further detail below. The Smart Device 2318 on the transport may also include an accelerometer or vibration sensors thereon so that any jarring movements/dropping of products during transport is also detected and transmitted to the appropriate database or WMS.

When a transport moves through the warehouse space with a Node, it may pass through different temperature zones within the Facility 2302. However, the transport's Node may "pick up" the temperature or other environmental conditions of each zone in a warehouse as it passes through the building. For example, a transport may move a pallet/product 2324/2326 from its original location and update temperature conditions as it moves throughout the building, such as by correlating the location with the temperature periodically (at defined intervals) such as after a certain time period or after the transport has moved a certain distance. The Node in the transport may transmit a pallet/product 2324/2326 location and transmit it to the control system, whereby its location can be correlated with the temperature at that location and time. This can be repeated sequentially and preferably automatically as the transport moves through the Facility 2302. Alternatively, the Facility 2302 may be divided into certain temperature zones and once the transport leaves a particular zone (based on the orienteering methods or GPS methods), the temperature of the pallet/product 2324/2326 updates to that temperature identified within the new zone. This could be updated at any interval and the temperature zones could be very small (less than 5 feet) or larger (such as every 5-10, 10-20, 30-40, and 50 or more feet) depending on the particular system and warehouse.

When the pallet/product arrives at a second (or third, etc.) location, a new virtual tag may be created at that location by a Smart Device, e.g., a smart device on the transport. The new coordinates of the products with the identifying information are transmitted to the appropriate database. Thus, the environmental conditions at those coordinates will be associated with the products at that location for the time that the pallet/product is at that location.

Figure 24:
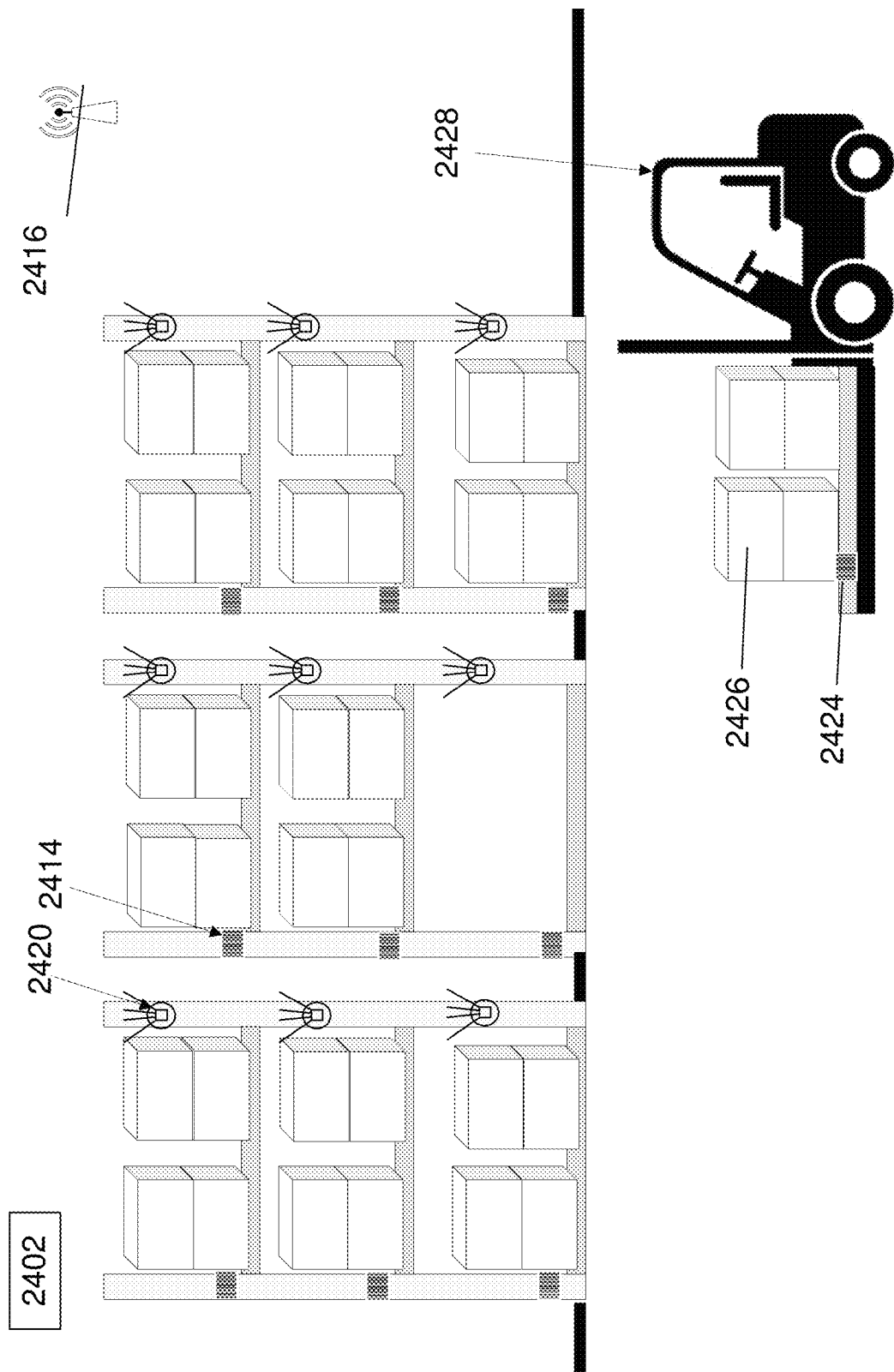
FIG. 24 provides an illustration of a cold storage facility according to an embodiment of the invention.

Referring to FIG. 24, once the operator of the transport 2428 locates the desired location of the pallet/product 2424/2426, a virtual tag 2420 may be created by the Employee or Agent at that location. In some cases, a virtual tag 2420 may be automatically generated upon some predetermined condition. For example, the pallet 2424 or transport 2428 may have an accelerometer, barometric pressure sensor, or other sensor which determines when the pallet 2424 or product 2426 has been set in the desired location, or even just picked up or set down. When the condition is met, a virtual tag 2420 may be created. In some embodiments, a position or pattern recognition sensor (e.g., LIDAR) recognizes a position of the pallet either via the configuration of items at that location or via a physical tag scanned at the location. Thus, when the LIDAR scanner detects a certain pattern or physical tag, a new virtual tag 2420 is automatically created and transmitted to the at least one Node 2416. The information from the pallet 2426 is communicated associated with the virtual tag 2420 so that the virtual tag 2420 contains information about the product, including for example, the history of where the product 2426 has been and, in some cases, its prior environmental history, within the Facility 2402 and/or during transport and/or manufacture. This newly generated virtual tag 2420 can overwrite the virtual tag 2402 associated with the particular pallet position or a separate virtual tag 2402 may be present. Thus, each pallet 2424 and/or product 2426 may be located within the Facility 2402 at any given time and the location and environmental history of where the product 2426 has been can be ascertained. Traditional methods of inventory management such as RFID or scanning technology may also be used in combination with the virtual tags in some cases, for example, to confirm accuracy of the virtual tags. Additionally, Nodes may be present at each pallet position, and the Smart Device may transmit information about the products to the Node, which may then be transmitted to the control system, WMS, or other database.

Figure 25:
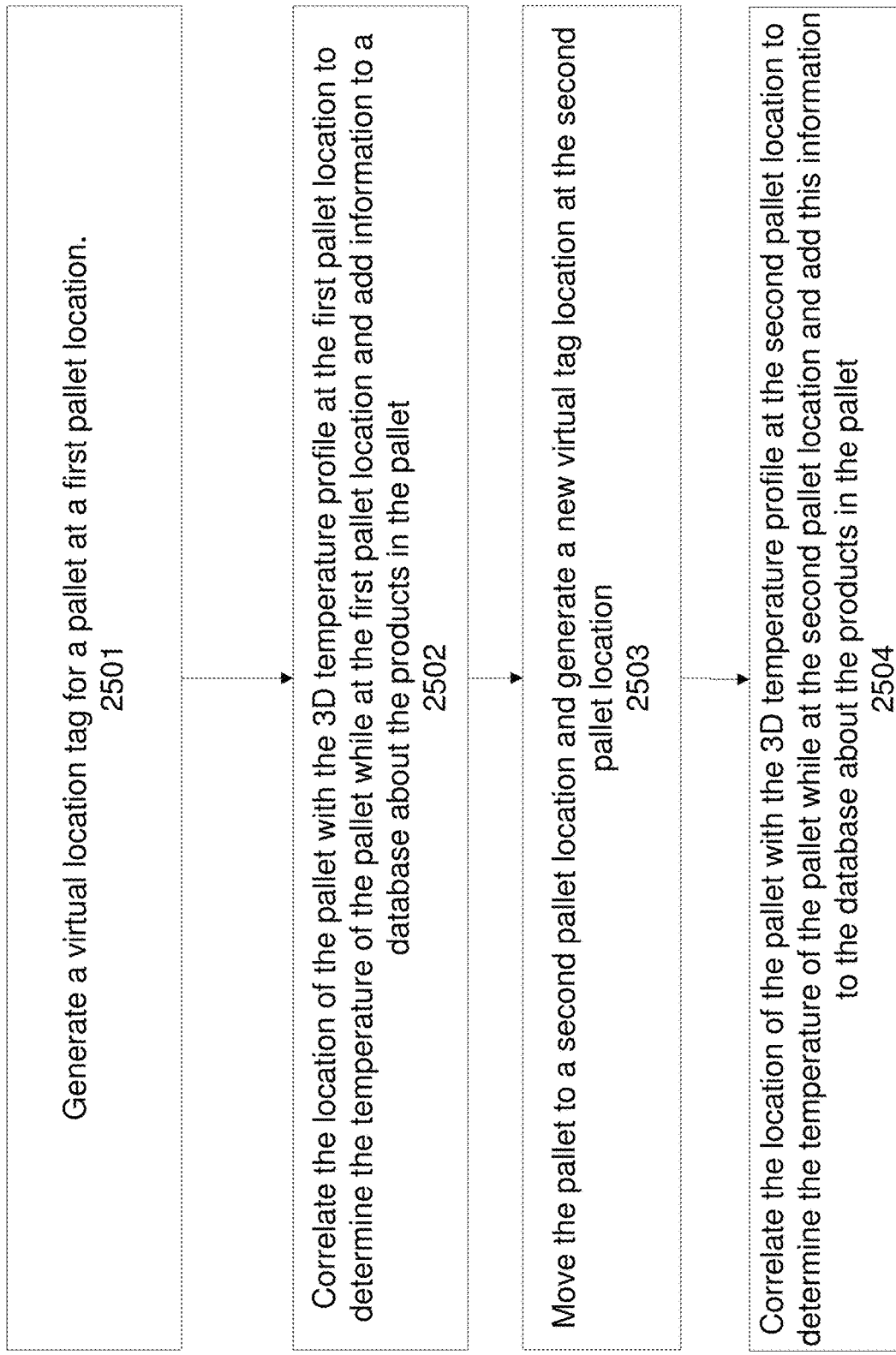
FIG. 25 provides a method for tracking product location and environmental history according to an embodiment of the invention.

One method according to an embodiment of the invention is shown in FIG. 25, wherein step 2501 describes generating a virtual tag with a pallet information at a first pallet location. Next, in step 2502, the location of the pallet may be correlated with the 3D temperature profile at the first pallet location to determine the temperature history of the pallet while at the first pallet location, and this information may be added to a database about the products in the pallet. Next, in step 2503, the pallet may be moved to a second pallet location, and a new virtual tag with the pallet information may be generated at the second pallet location. Finally, in step 2504, the location of the pallet at the second pallet location may be correlated with the 3D temperature profile at the second pallet location to determine the temperature history of the pallet while at the second pallet location, and this data may be added to the database about the products in the pallet. Thus, the temperature history of the products in that pallet may be known. For additional information on the products' environmental history, the location and environmental conditions of the pallet/product during transport may also be determined as described above.

Figure 26:
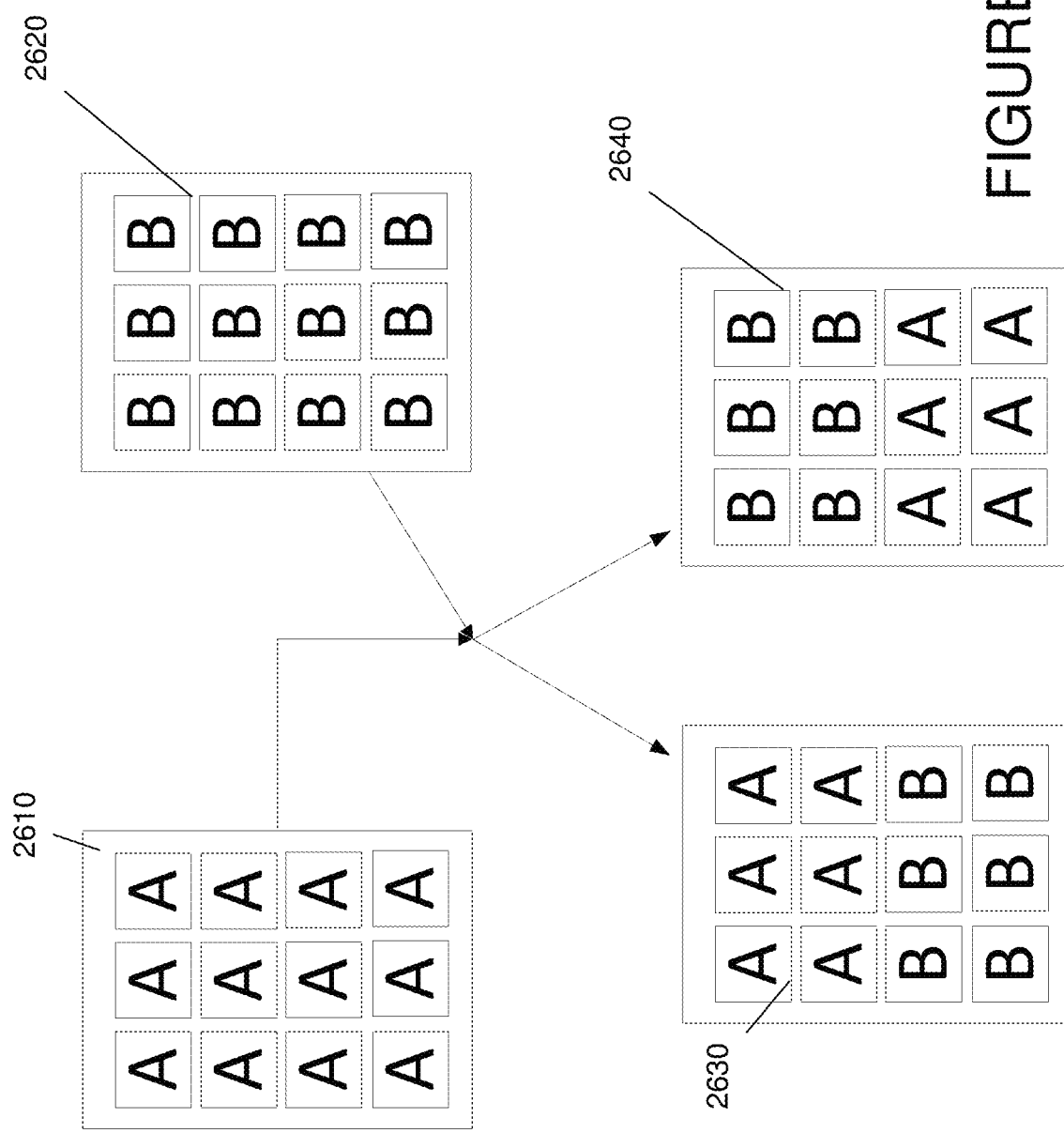
FIG. 26 illustrates mixing of pallets according to an embodiment of the invention.

When the products are to be moved to another location, the same process of tracking the products during transport and storage described above may be used. Mixing of products and pallets may also be possible where the specific products are identified as they are mixed. For example, referring to FIG. 26, a first pallet 2610 may have 12 products ("A") thereon and a second pallet 2620 may also have 12 products ("B") thereon. The products A and B may be the same or different type of products. The pallets may then be mixed so that each new pallet 2630, 2640 has 6 products of A and 6 products of B thereon.

Originally, each pallet may be tracked through the warehouse via the combination of virtual tags and association with a transmitter/receiver on a transport (or other means of tracking the movements of the products) as discussed above. As such, the pallet 2610 products have a location and environmental history associated therewith, and the pallet 2620 products have a location and environmental history associated therewith. While mixing the pallets, each product may be scanned and assigned to a new pallet. The controller or other database processor may then assign a location and environmental history to each product in the new pallet. Thus, in this example, the database would include a location/environmental history for the A products and a location/environmental history the B products while in the separate pallets 2610, 2620. Thereafter, the A and B products will have the same location and environmental data (while in the same pallet such as pallet 2630) but each product A in pallet 2630 will have a database listing that includes the location and environmental conditions for pallet 2610 prior to mixing and then the location and environmental conditions for pallet 2630 after mixing. Thus, environmental tracking may be possible even with pallet mixing.

In some embodiments, a product may be tracked from manufacture to final sale through the systems and methods. Once a product is manufactured, the product may be assigned position tags (virtual or physical) that identify the location of the products while in the manufacturing facility. Then, the products may be tracked during transport through the facility by being associated with a transport Node or Smart Device. Once the products are placed onto a delivery truck or other means of transportation, the location and environmental conditions of the truck/transport may be known by GPS or other location tracking technologies (location), and via sensors in the transport (environmental conditions) and the information may be transmitted to a database by a Node or Smart Device on the transport. Then, processing and storage at the Cold Storage Facility may be tracked as discussed above. Once ready to distribute the products at a sales location, the product may be tracked through the Cold Storage Facility to a truck/transport, as described above, and then tracked during transportation, as further described above. If desired, the product can continue to be tracked at the sales location. Physical and/or virtual tags may be created in the store (at one or multiple locations) to identify the location of the product in the store. Thus, from manufacture to final sale, the location and environmental conditions of a product may be known. This may be beneficial for product tracking and quality assurance efforts.

As with the products and pallets, Employees be tracked with Nodes or Smart Devices carried on the Employee. The movements of the Employee may be tracked throughout the Cold Storage Facility. Additionally, the Employee's access to particular areas of the Facility may be based on transmissions from a Node, Smart Device, or transmitter on the Employee, and if the Employee is not in the appropriate area of the warehouse, an alarm or notification may be generated. Additionally, one or more Employees may have a temperature or other environmental sensor on his/her person, including on a hat or electronic device carried with the person, and the temperature of the air at the employee's location over time may also be tracked to provide further information about the temperature in the Facility. Tracking the location of each employee with the transmitter, Node, or Smart Device may also allow for counting and/or locating employees in the event of an emergency. Positional sensors on the Employee's hat (e.g., a sensor on the front or back) may also be useful to provide information about the employee's orientation for the purpose of orienteering or direction of interest as described herein.

User Interfaces

Provided according to embodiments of the invention are user interfaces that may be used with the methods, devices, and apparatus described herein. A user interface may displayed on a tablet, Smart Device, or other flat screen, or in some embodiments be presented in a virtual reality environment, such as via a virtual reality headset. It should be noted that although a Smart Device is generally operated by a human user, some embodiments of the present invention include a controller, accelerometer, data storage medium, Image Capture Device, or an infrared capture device being available in a handheld or unmanned vehicle or other Agent.

Figure 27:
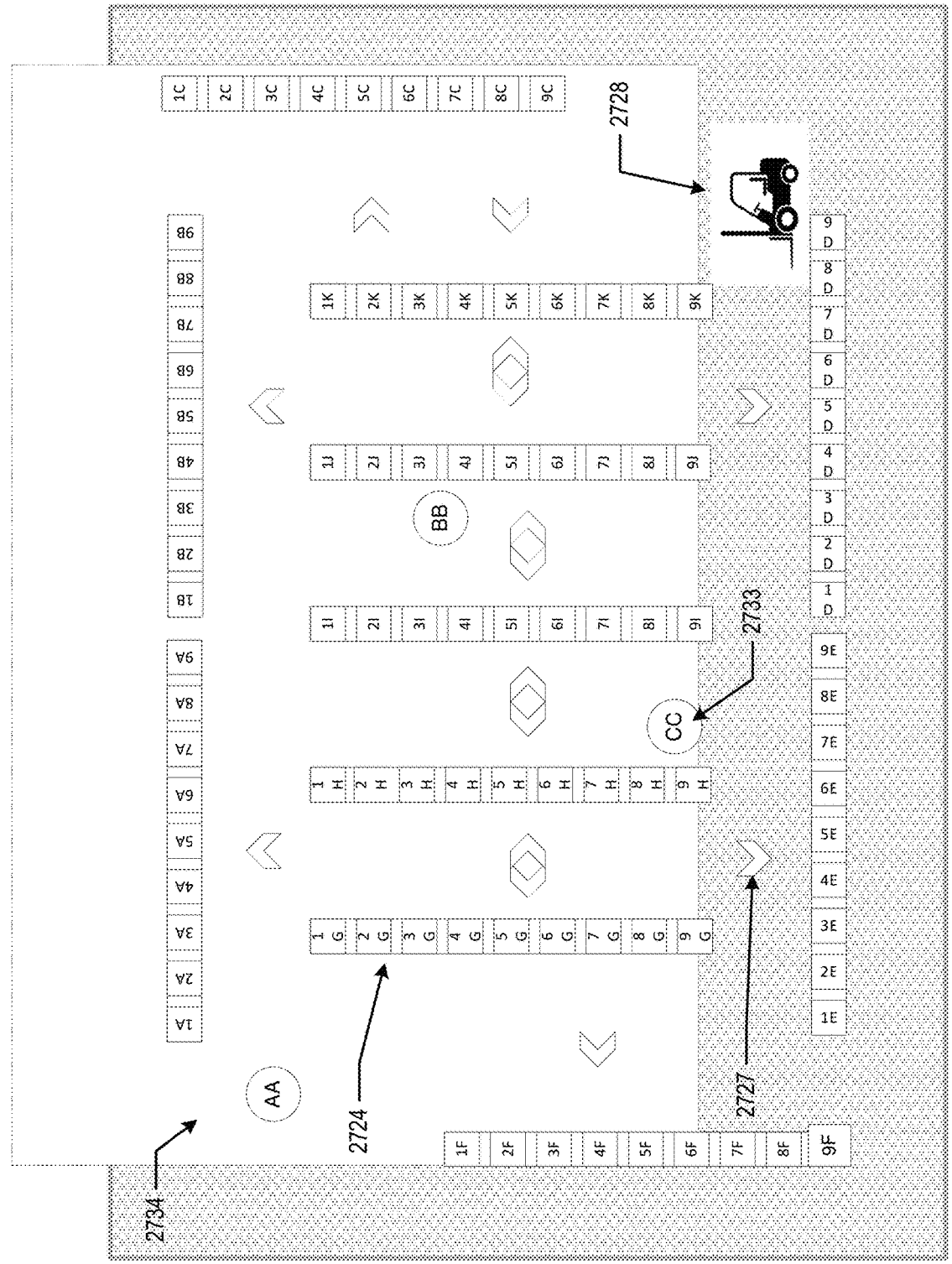
FIG. 27 illustrates a user interface according to an embodiment of the invention.

In some embodiments of the invention, a user interface may provide an overview of operations in the Cold Storage Facility. In some cases, a user interface tracks sensors, pallets, employees, and equipment, such as via a touch screen. Referring to FIG. 27, the user interface 2734 provides an overview of a room in a Cold Storage Facility, and the pallets 2724, sensors 2727, transports 2728, and employees 2733 located in the room, each of which may be identified by the system and user interface by virtue of a Node, transceiver, or Smart Device associated with the item or person. The user interface may have additional screens for additional rooms, or the entire Facility may be viewed at once. In some embodiments, different types of personnel may be identified in the user interface by a different type or different color icon. Different types of sensors may also be identified by a particular color or shape. The remaining icons may also be distinguished for any reason by varying the style or color of each icon. In some embodiments, icons in the user interface may be "clicked" or interacted with in order to provide more information about the item, or to find controls with respect to an item.

For example, in FIG. 27, each pallet 2724 may be assigned a number. When a user clicks on the icon for a particular pallet, the user interface may identify the type of product, the time at that location, and an environmental or location history. Furthermore, if a particular pallet is at a location that is deemed to exceed a temperature limit, details regarding the excess temperature may be provided. In such event, the icon may provide an alert to notify such as a sound, blinking icon, or push notification to let the user know of the problem at that position. As another example, a sensor 2727 icon may be clicked to obtain a history of data obtained by the sensor. Additionally, if the sensor is detecting a parameter that is outside of the allowed range for the parameter, the user interface may provide an alert as described above. The alerts may also be useful for use with employees, as an alert may be generated on the user interface if an employee accesses a non-authorized area in the Facility. Additionally, in the event of an emergency, the user interface may be used to locate Employees for evacuation or other emergency measures.

Apparatus

The following section describes various apparatus that may be suitable to perform the methods described herein.

Figure 28:
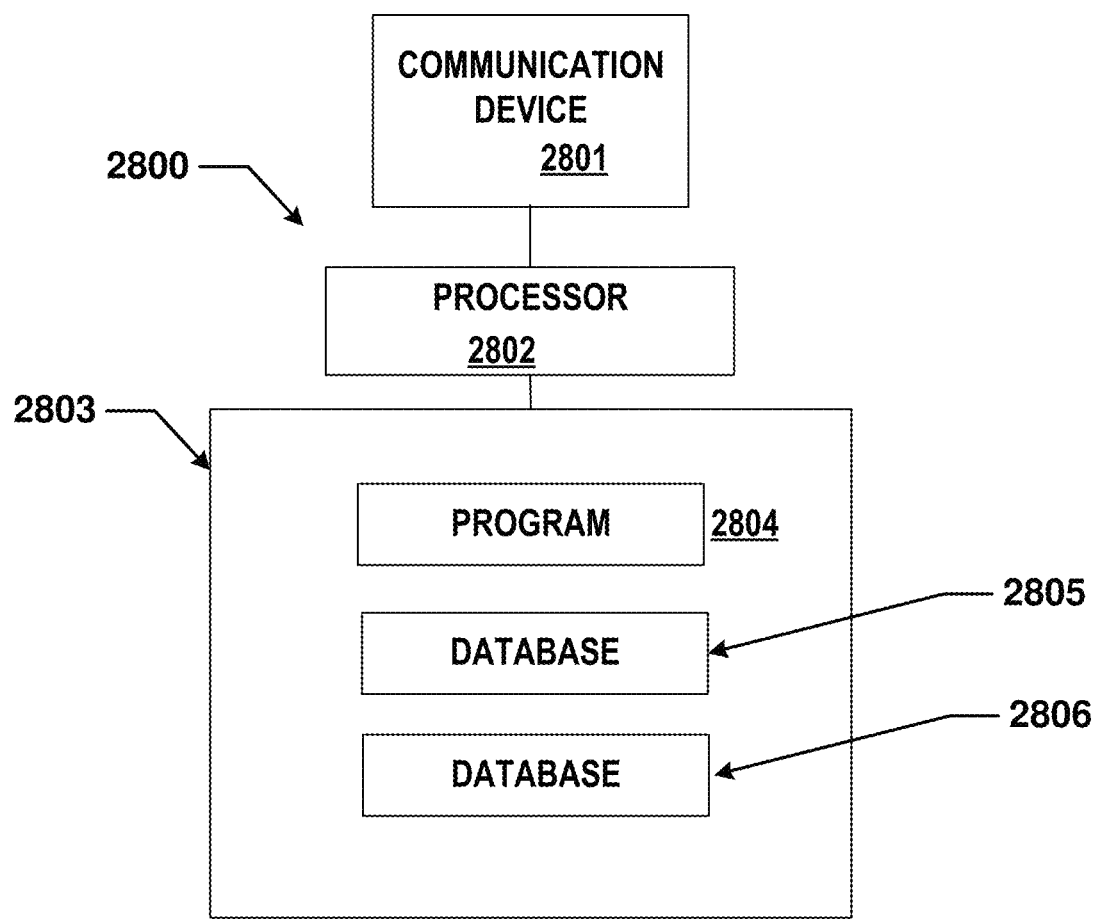
FIG. 28 is a schematic of an automated controller according to an embodiment of the invention.

Referring now to FIG. 28, an automated controller is illustrated that may be used to implement various aspects of the present invention in various embodiments, and for various aspects of the present invention. Controller 2800 may be included in one or more of: a wireless tablet or handheld smart device, a server, an integrated circuit incorporated into a Node, appliance, equipment item, machinery or other automation. The controller 2800 includes a processor unit 2802, such as one or more semiconductor-based processors, coupled to a communication device 2801 configured to communicate via a communication network (not shown in FIG. 28). The communication device 2801 may be used to communicate, for example, with one or more online devices, such as a smart device, a Node, personal computer, laptop, or a handheld device.

The processor 2802 is also in communication with a storage device 2803. The storage device 2803 may comprise any appropriate information storage device, including combinations of digital storage devices (e.g. an SSD), optical storage devices, and/or semiconductor memory devices such as Random Access Memory (RAM) devices and Read Only Memory (ROM) devices.

The storage device 2803 can store a software program 2804 with executable logic for controlling the processor 2802. The processor 2802 performs instructions of the software program 2804, and thereby operates in accordance with the present invention. The processor 2802 may also cause the communication device 2801 to transmit information, including, in some instances, timing transmissions, digital data and control commands to operate apparatus to implement the processes described above. The storage device 2803 can additionally store related data in a database 2805 and database 2806, as needed.

Figure 29A:
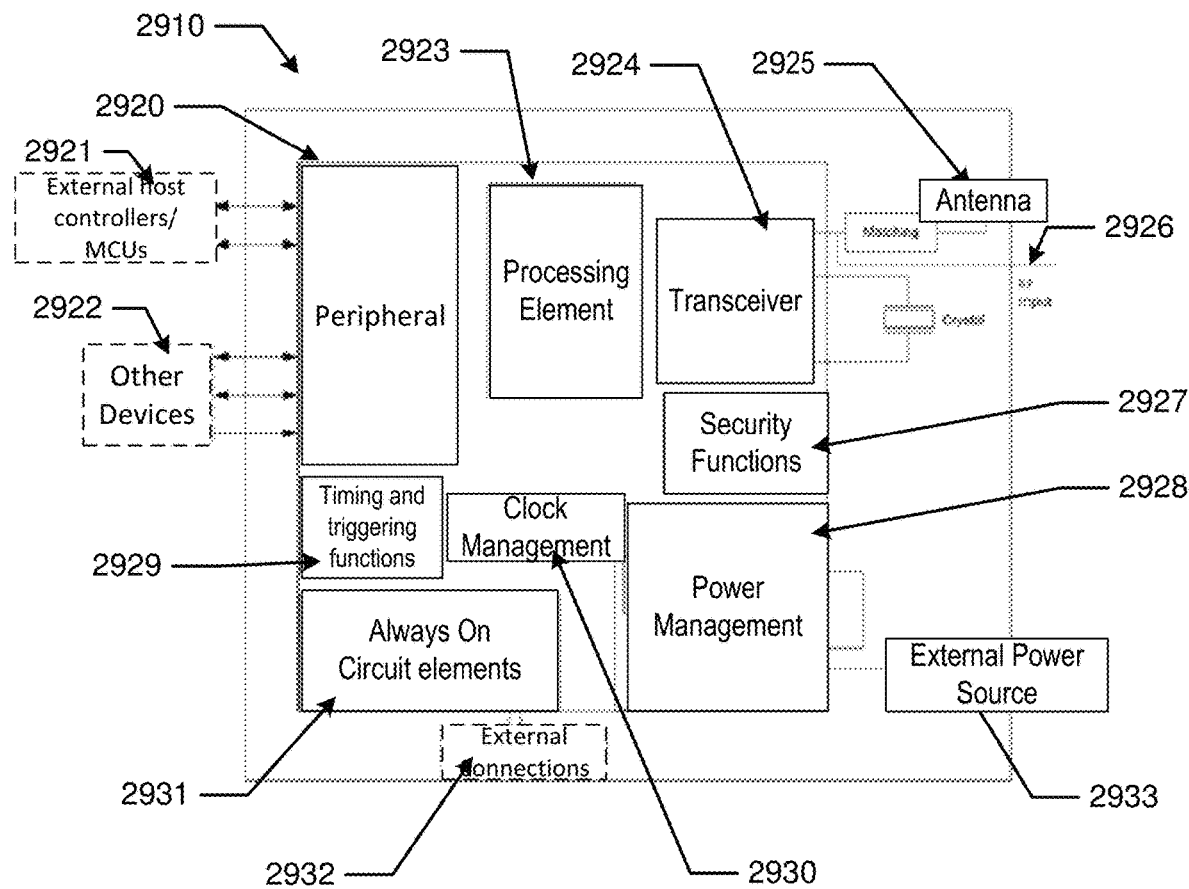
FIGS. 29A and 29B are schematics of a wireless Node according to an embodiment of the invention.

Referring now to FIG. 29A, an illustration of an exemplary wireless Node 2910 configured with a transceiver 2924 to wirelessly communicate via one or more wireless communication Modalities, including a bandwidth and protocol, such as the Bluetooth 5.1; BLE5.1; UWB, Wi-Fi RT; and/or GPS standard is illustrated. As discussed, many different Modalities of wireless technology may be utilized with the content presented herein, but a BLE5.1 "radio" module is an interesting example since its standards provide for angle of arrival (AoA) capability as well as angle of departure (AoD) and a distance determination based upon a timing signal. With AoA/AoD, a designed antenna array 2925 can be used by a radiofrequency transceiver 2924 to measure a phase shift amongst multiple antenna elements to estimate distance differences between the antennas and to extract an angle from the antenna array to the source of radiation. A BLE5.1-consistent multichip transceiver 2924 may include circuitry and software code to perform the acquisition of data and determine the angle of arrival in some examples. In other examples, a BLE5.1-consistent multichip transceiver 2924 may control the acquisition of data from an antenna array while streaming the data to off module processing capabilities. The BLE5.1-consistent Node 2910 may contain functional blocks of circuitry for peripheral 2920 control. The peripherals may include a connection to external host controllers/MCUs 2921. The peripheral 2920 control may also interact with peripheral and IoT sensors and other devices 2922.

The BLE5.1-consistent Node 2910 may include a processing element 2923 which may have its own memory of different types as well as capabilities for encryption of data. The BLE5.1 consistent Node 2910 may also have transceiver 2924. This circuitry may include baseband and RF functions as well as control the AoA functions and the self-verifying array functions. The Bluetooth communications 2924 may receive signals through an on-module antenna 2925 or an external antenna or array of antennas may provide external RF input 2926. The BLE5.1-consistent Node 2910 may include functional circuitry blocks for control of security functions 2927, crypto-generations, random number generation and the like. The BLE5.1-consistent Node 2910 may include functional blocks for power management 2928.

The BLE5.1-consistent Node 2910 may be operative for quantification of temperature aspects of the Node 2910, battery-control functions and power-conversion functions. An external power source 2933 may be included to provide electrical energy to a power management unit 2928 which, in some examples. may be from a battery unit, or a grid connected power supply source in other examples. The BLE5.1-consistent Node 2910 may include functions for control of timing and triggering 2929. In a related sense, the BLE5.1-consistent Node 2910 may include functions for clock management 2930 within the module. The BLE5.1-consistent Node 2910 may also include circuit elements that are always-on 2931 to allow external connections 2932 to interact with the device and perhaps awake it from a dormant state. There may also be other customized and/or generic functions that are included in a BLE5.1-consistent Node 2910 and/or multichip module.

Figure 29B:
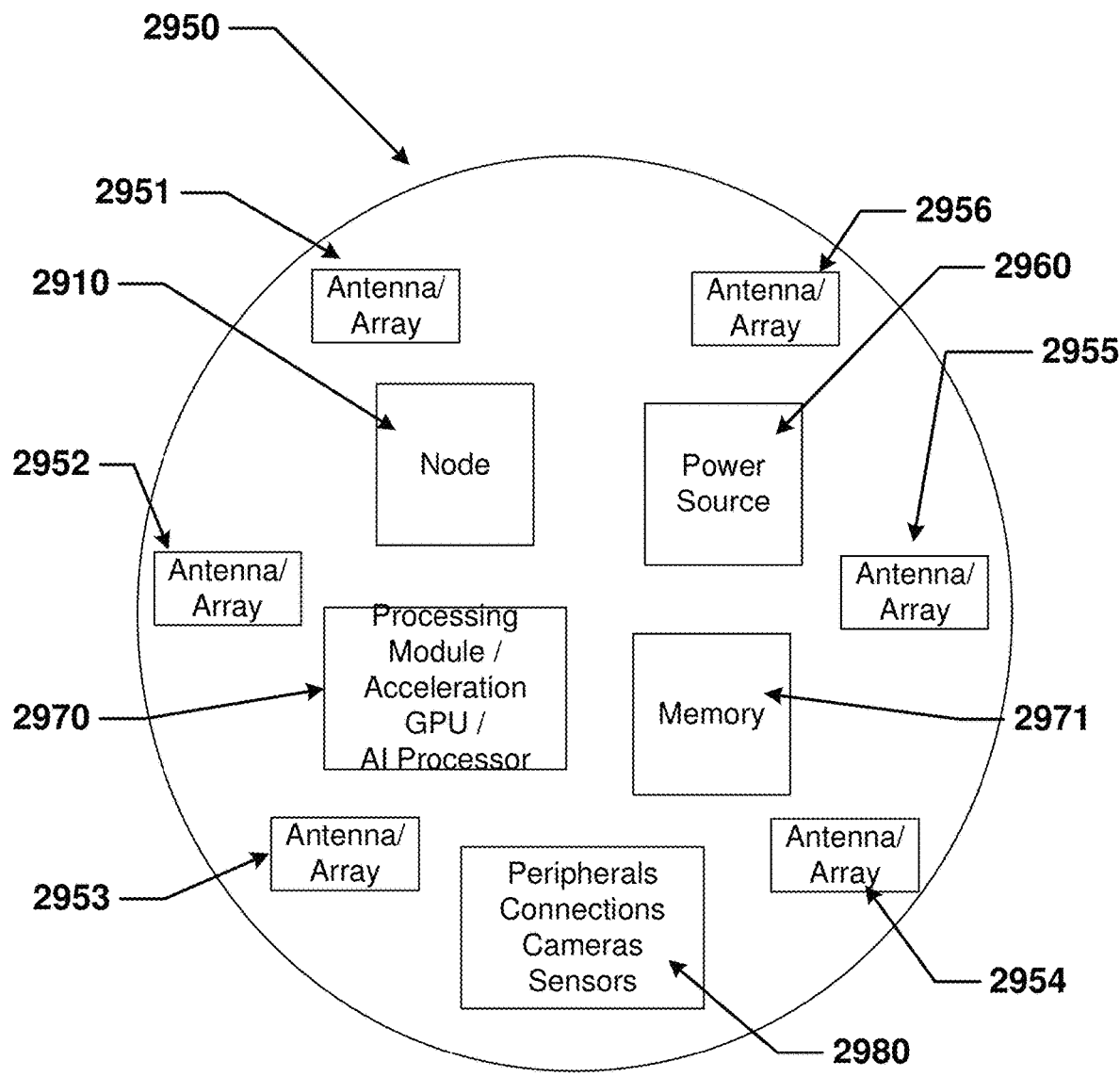

Referring now to FIG. 29B, a Node 2910 included in a higher order deployment assembly is illustrated. A deployment Node 2950 may be in logical communication with one or more of: sensors, customized control commands, antenna array designs and the like.

A Node 2950 may include multiple antennas or antenna arrays 2951-2956. As described previously, the Node 2950 may include a transceiver module 2910, and in some examples, the transceiver module may include Bluetooth-adherent aspects. Communications received via an antenna 2951-2956 may be directly ported into the transceiver module 2910. Embodiments may also include routing particular antenna/antenna array outputs to the transceiver module 2910 in a controlled and timed sequence. A processing module 2970 may coordinate a connection of the Node 2950 to external peripherals.

In some examples, circuitry 2980 to logically communicate with one or more of: a Peripheral, a data connection, cameras and sensors controllers, and components to perform data and image acquisition of various kinds, or it may interface external components with the Node 2950.

The Node 2950 may also include its own power management unit 2960 which may take connected power or battery power or both and use it to prove the various power needs of the components of the assembly. The Node 2950 may have its own processing modules 2970 or collections of different types of processing functions which may have dedicated memory components 2971. In some examples, specialized processing chips of various kinds such as Graphical Processing Units and fast mathematics function calculators as well as dedicated artificial intelligence processing chips may be included to allow the Node 2950 to perform various computational functions including location determination of wirelessly connected devices amongst other functions. There may be numerous other functions to include in a Node 2950 and alternatives types of devices to perform the functions presented herein.

Figure 30:
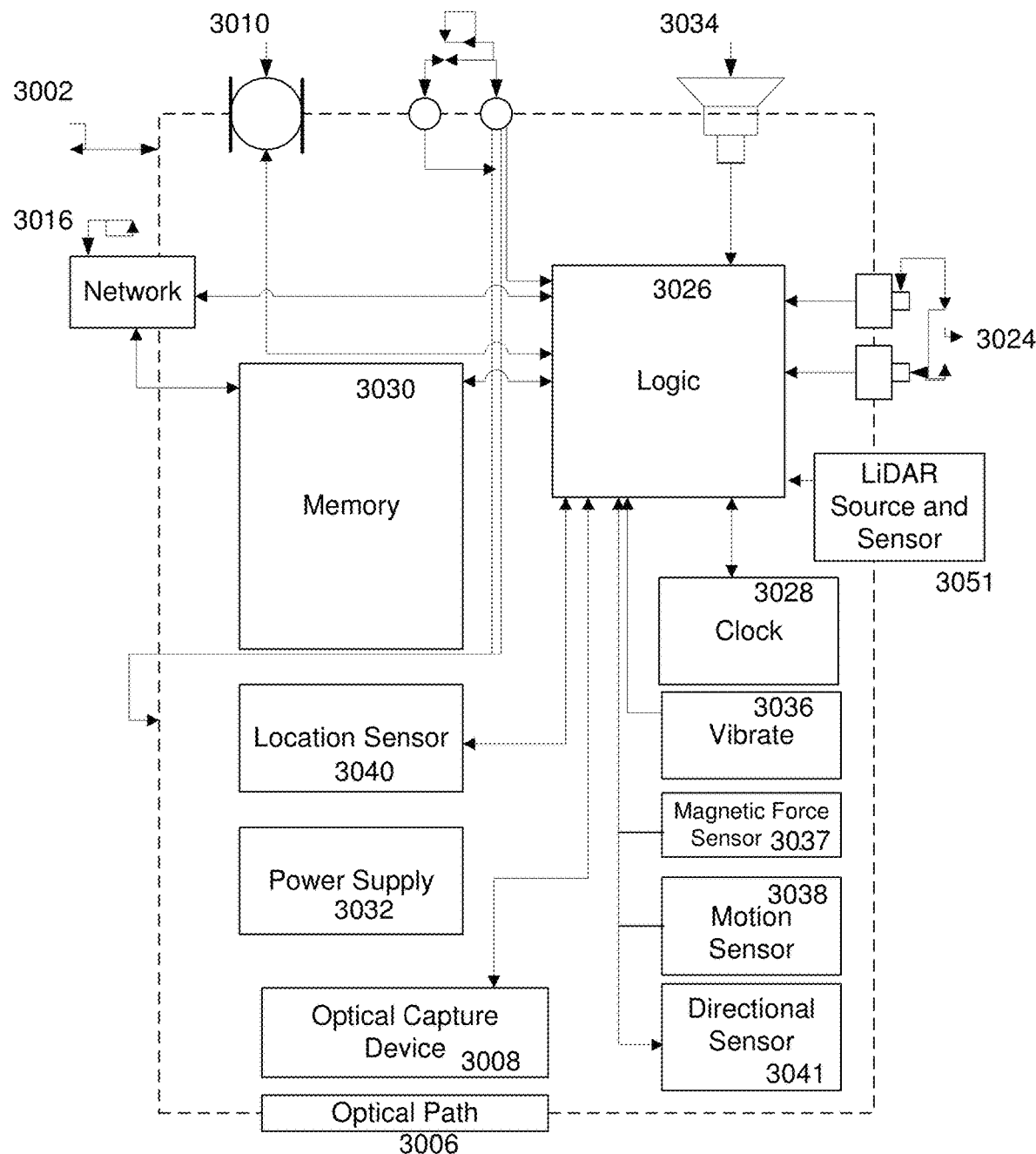
FIG. 30 is a block diagram of a Smart Device according to an embodiment of the invention.

Referring now to FIG. 30, a block diagram of an exemplary mobile device 3002 is illustrated. The mobile device 3002 comprises an optical capture device 3008 to capture an image and convert it to machine-compatible data, and an optical path 3006, typically a lens, an aperture or an image conduit to convey the image from the rendered document to the optical capture device 3008. The optical capture device 3008 may incorporate a CCD, a Complementary Metal Oxide Semiconductor (CMOS) imaging device, or an optical sensor 3024 of another type.

A microphone 3010 and associated circuitry may convert the sound of the environment, including spoken words, into machine-compatible signals. Input facilities may exist in the form of buttons, scroll wheels, or other tactile sensors such as touch-pads. In some embodiments, input facilities may include a touchscreen display.

Visual feedback to the user is possible through a visual display, touchscreen display, or indicator lights. Audible feedback 3034 may come from a loudspeaker or other audio transducer. Tactile feedback may come from a vibrate module 3036.

A magnetic force sensor 3037 may sense the magnetic field environment of the smart device and support direction determinations.

A motion sensor 3038 and associated circuitry convert the motion of the mobile device 3002 into machine-compatible signals. The motion sensor 3038 may comprise an accelerometer that may be used to sense measurable physical acceleration, orientation, vibration, and other movements. In some embodiments, motion sensor 3038 may include a gyroscope or other device to sense different motions.

A location sensor 3040 and associated circuitry may be used to determine the location of the device. The location sensor 3040 may detect GPS radio signals from satellites or may also use assisted GPS where the mobile device may use a cellular network to decrease the time necessary to determine location. In some embodiments, the location sensor 3040 may use radio waves to determine the distance from known radio sources such as cellular towers to determine the location of the mobile device 3002. In some embodiments these radio signals may be used in addition to GPS.

The mobile device 3002 comprises logic 3026 to interact with the various other components, possibly processing the received signals into different formats and/or interpretations. Logic 3026 may be operable to read and write data and program instructions stored in associated storage or memory 3030 such as RAM, ROM, flash, or other suitable memory. It may read a time signal from the clock unit 3028. In some embodiments, the mobile device 3002 may have an onboard power supply 3032. In other embodiments, the mobile device 3002 may be powered from a tethered connection to another device, such as a Universal Serial Bus (USB) connection.

The mobile device 3002 also includes a network interface 3016 to communicate data to a network and/or an associated computing device. Network interface 3016 may provide two-way data communication. For example, network interface 3016 may operate according to the internet protocol. As another example, network interface 3016 may be a local area network (LAN) card allowing a data communication connection to a compatible LAN. As another example, network interface 3016 may be a cellular antenna and associated circuitry which may allow the mobile device to communicate over standard wireless data communication networks. In some implementations, network interface 3016 may include a Universal Serial Bus (USB) to supply power or transmit data. In some embodiments, other wireless links may also be implemented.

As an example of one use of mobile device 3002, a reader may scan some coded information from a location marker in a Structure with the mobile device 3002. The coded information may be included on apparatus such as a hash code, bar code, RFID or other data storage device. In some embodiments, the scan may include a bit-mapped image via the optical capture device 3008. Logic 3026 causes the bit-mapped image to be stored in memory 3030 with an associated time-stamp read from the clock unit 3028. Logic 3026 may also perform optical character recognition (OCR) or other post-scan processing on the bit-mapped image to convert it to text. The reader may then upload the bit-mapped image (or text or other signature, if post-scan processing has been performed by logic 3026) to an associated computer via network interface 3016.

As an example of another use of mobile device 3002, a reader may capture some text from an article as an audio file by using microphone 3010 as an acoustic capture port. Logic 3026 causes audio file to be stored in memory 3030. Logic 3026 may also perform voice recognition or other post-scan processing on the audio file to convert it to text. As above, the reader may then upload the audio file (or text produced by post-scan processing performed by logic 3026) to an associated computer via network interface 3016.

A directional sensor 3041 may also be incorporated into the mobile device 3002. The directional sensor may be a compass and produce data based upon a magnetic reading or based upon network settings.

A LiDAR sensing system 3051 may also be incorporated into Smart Device 3002. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of Smart Device 3002. Aspects relating to capturing data with LiDAR and comparing it to a library of stored data (which may be obtained at multiple angles to improve accuracy) are discussed above.

CONCLUSION

Various embodiments of the present invention may include one or more systems including a controller and electronic and/or solid state sensors and electromechanical and optical devices can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a method of monitoring a cold storage structure including: generating a representation of a surface topography within a specified area within a structure. The method of monitoring also includes wirelessly communicating between a transceiver collocated with an item in the specified area and one or more reference point transceivers.

In some embodiments, the method of monitoring also includes based upon the wirelessly communicating between a transceiver collocated with an item in the specified area and one or more reference point transceivers, generating positional coordinates for the items with the specified area with the structure. The method of monitoring may also include with a thermal energy detection apparatus, quantifying amounts of thermal energy at disparate positions included in the specified area within the structure. The method of monitoring also includes generating a user interface including a 3d temperature profile of the items within a specified area within the structure, the user interface including at least portions of the representation of the surface topography and the quantified amounts of thermal energy at disparate positions included in the specified area within the structure. The method of monitoring also includes at selected time intervals repeat the step of quantifying amounts of thermal energy at disparate positions included in the specified area within the structure. The method of monitoring also includes with a controller monitoring the thermal energy at disparate positions included in the specified area within the structure for an increase or a decrease in thermal energy outside a predetermined temperature range; and if an amount of thermal energy at the disparate positions included in the specified area within the structure fall outside the predetermined temperature range, with a controller initiate one or both of: an influx of air to a predetermined position in the structure or initiate an extraction of air from a predetermined position in the structure. Other embodiments of this aspect include corresponding computer systems, apparatus, and computer programs recorded on one or more computer storage devices, each configured to perform the actions of the methods.

Implementations may include one or more of the following features. The method where the step of quantifying an amount of thermal energy includes quantifying infrared energy as a digital value using a microbolometer. The method where the sensor quantifying a thermal state includes operation of an electronic temperature sensing device including at least one of: a thermocouple, a thermistor, and a resistance based sensor. The method where if amounts of thermal energy quantified include a temperature greater than the predetermined temperature range, initiating with the controller one or both of: an influx of air with a lower amount of thermal energy than the amount quantified; and extracting air with an amount of thermal energy higher than the predetermined temperature range. The method where the influx of air is provided to a location of the increase in temperature. The method where an influx of air is provided to an airflow vent above a location including thermal energy higher than the predetermined temperature range, as determined by the step of quantifying amounts of thermal energy. The method where if the thermal energy at a location is less than the predetermined temperature range, initiating with the controller one or both of: an influx of air with a higher amount of thermal energy than the amount quantified; and extracting air with an amount of thermal energy lower than the predetermined temperature range. The method where the influx of air is provided to the location of the increase in temperature.

In some embodiments, implementations may include one or more of the following aspects, identifying action events related to the cold storage structure and the controller correlates the action events with an increase or decrease in temperature outside of the predetermined temperature range. The method where the action event is one or both of: an opening of a door and a closing of the door in the cold storage structure. The method where the action event is one of a heating cycle and a cooling cycle by a HVAC unit. The method additionally including the steps of: with a lidar unit in electronic communication with the controller, generating positional data points of items in the area of the structure; and with the controller creating a 3d position map of the cold storage structure at selected intervals to identify objects in the cold storage structure. The method where the step of quantifying amounts of thermal energy includes measuring a temperature of an item in the specified area within the structure.

The method additionally may include the step of: with the controller correlating a change in temperature of the item in the specified area within the structure. The method additionally including the step of with the controller determining at least one of: a change in a position of the item in the specified area within the structure, and removal of the item from the specified area within the structure. The method where the item is a worker in the cold storage structure.

Still other aspects of some embodiments may include measuring an amount of moisture in the specified area with a humidity detection apparatus in electronic communication with the controller. The method additionally including the step of initiating an alarm if the amount of moisture in the specified area is outside a predetermined humidity range. The method where the wirelessly communicating between a transceiver collocated with an item in the specified area and one or more reference point transceivers includes a ultra-wideband transceiving. The method where the wirelessly communicating between a transceiver collocated with an item in the specified area and one or more reference point transceivers includes a bluetooth transceiving. Implementations of the described techniques may include hardware, a method or process, or computer software on a computer-accessible medium.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. A method for interacting with a tag in a storage area, the method comprising the steps of:
   a) generating positional coordinates for a Smart Device based upon wireless communication between the Smart Device and a reference point transceiver;
   b) establishing a radio target area for an energy receiving sensor, said radio target area comprising a portion of the storage area;
   c) receiving energy into the energy receiving sensor from the radio target area;
   d) generating a digital representation of the energy received into the energy receiving sensor at an instance in time;
   e) generating positional coordinates for a tag collocated with an item in the radio target area at the instance in time;
   f) associating digital content with the tag;
   g) determining that the Smart Device has access rights to the digital content;
   h) generating a user interactive interface comprising a digital representation of the energy received into the energy receiving sensor at the instance in time and a dynamic portion representative of the tag;
   i) receiving a user input into the dynamic portion of the user interactive interface; and
   j) based upon the user input received into the dynamic portion of the user interactive interface, displaying the digital content in the user interactive interface.

2. The method of claim 1 additionally comprising the step of receiving into the smart device a digital quantification of a temperature within the radio target area at the instance in time, said digital quantification generated with a sensor; and displaying the digital quantification of the temperature in the user interactive interface.

3. The method of claim 2 additionally comprising the steps of: receiving multiple disparate energy wavelengths into the energy receiving sensor at the instance in time, the disparate energy wavelengths received from different geospatial locations; and indicating the disparate energy wavelengths in the user interactive interface.

4. The method of claim 2 wherein the tag comprises a virtual tag associated with a location identified via positional coordinates.

5. The method of claim 2 wherein the tag comprises a physical tag comprising a transceiver capable of wireless communication and the method additionally comprises the steps of: transceiving a wireless communication between the tag and multiple reference point transceivers; and generating positional coordinates for the tag based upon the wireless communication between the tag and the multiple reference transceivers.

6. The method of claim 5 additionally comprising the steps of: transceiving a wireless communication between the tag and the multiple reference point transceivers using an Ultra Wideband modality; and generating positional coordinates for the tag based upon the wireless communication between the tag and the multiple reference transceivers.

7. The method of claim 6 additionally comprising the step of identifying a wireless communication area comprising the radio target area of the energy receiving sensor, the wireless communication area based upon a communication distance of the Ultra Wideband modality in an area encompassing the energy receiving sensor.

8. The method of claim 2 wherein the tag comprises a transceiver capable of wireless communication between the tag and at least one reference point transceiver using a Bluetooth modality; and the method additionally comprises the step of generating positional coordinates for the tag based upon the wireless communication between the tag and the at least one reference transceiver.

9. The method of claim 8 additionally comprising the step of identifying a wireless communication area comprising the radio target area of the energy receiving sensor, the wireless communication area based upon a communication distance of a Bluetooth modality in an area encompassing the energy receiving sensor.

10. The method of claim 9 wherein the positional coordinates comprise Cartesian Coordinates.

11. The method of claim 9 wherein the positional coordinates comprise at least one of: an angle of arrival and an angle of departure.

12. The method of claim 1 additionally comprising the steps of:
a) repeating the step of receiving into the smart device a digital quantification of a temperature within the radio target area at multiple disparate instances in time;
b) with a controller, monitoring the temperature within the radio target area for an increase or a decrease in thermal energy outside a predetermined temperature range; and
c) if a temperature within the radio target area is monitored outside the predetermined temperature range, with a controller initiate one or both of: an influx of air to a predetermined position in the storage area or initiate an extraction of air from a predetermined position in the storage area.

13. The method of claim 12 wherein the influx of air to a predetermined position comprises air at a lower temperature than the predetermined temperature range.

14. The method of claim 2 wherein the storage area comprises a cold storage area.

15. The method of claim 2 wherein the radio target area comprises the position of the tag, the position of the sensor and an area providing electromagnetic energy to the energy receiving sensor.

16. The method of claim 15 wherein the radio target area further comprises a frustum of a generally conical shape with the energy receiving sensor located at a relatively narrow end of the frustum.

17. The method of claim 16 additionally comprising the steps of changing a direction of the Smart Device; and redefining the radio target area based upon the change in direction of the Smart Device.

18. The method of claim 1 additionally comprising the step of quantifying an amount of infrared energy as a digital value using a microbolometer.

19. The method of claim 1 additionally comprising the step of quantifying a thermal state via operation of an electronic temperature sensing device comprising at least one of: a thermocouple, a thermistor, and a resistance based sensor.

20. The method of claim 19 wherein the energy received into the energy receiving sensor comprises one or more of: an infrared wavelength; and a wavelength between 400 nanometers and 700 nanometers.

* * * * *